(12) United States Patent
Sato et al.

(10) Patent No.: US 6,915,249 B1
(45) Date of Patent: Jul. 5, 2005

(54) NOISE CHECKING METHOD AND APPARATUS

(75) Inventors: Toshiro Sato, Kawasaki (JP); Yuji Suwa, Kawasaki (JP); Yoshiyuki Iwakura, Yokohama (JP); Kazunari Gotou, Yokohama (JP); Toshiaki Sato, Yokohama (JP); Kazuyoshi Kanei, Yokohama (JP); Masaki Tosaka, Kawasaki (JP); Yasuhiro Yamashita, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 456 days.

(21) Appl. No.: 09/708,470

(22) Filed: Nov. 9, 2000

Related U.S. Application Data

(63) Continuation of application No. PCT/JP99/02093, filed on Apr. 20, 1999.

(30) Foreign Application Priority Data

May 14, 1998 (JP) ............................. 10-132196
Sep. 30, 1998 (JP) ............................. 10-277367

(51) Int. Cl.[7] ........................... G06G 7/62; G06G 7/00; G06F 17/50; G06F 15/18; H04M 11/04
(52) U.S. Cl. ........................... 703/14; 703/13; 716/4; 716/5; 716/6; 379/22; 455/501; 370/201
(58) Field of Search .................. 703/14; 716/4, 716/5, 6; 379/22; 455/501; 370/201

(56) References Cited

U.S. PATENT DOCUMENTS 5,243,547 A * 9/1993 Tsai et al. ................... 703/14
5,481,695 A    1/1996 Purks (Continued)

FOREIGN PATENT DOCUMENTS

| JP | 62-53372 | 4/1987 |
|----|----------|--------|
| JP | 4-256072 | 9/1992 |
| JP | 6-243193 | 9/1994 |
| JP | 7-152824 | 6/1995 |
| JP | 8-297689 | 11/1996 |
| JP | 10-74216 | 3/1998 |
| JP | 10-97511 | 4/1998 |
| JP | 11-45294 | 2/1999 |

OTHER PUBLICATIONS

"Dictionary.com: 11 entries found for filter" http://www.d-ictionary.com/search?q=filter. Download from web Sep. 23, 2003.*

(Continued)

*Primary Examiner*—Kevin J. Teska
*Assistant Examiner*—Ayal Sharon
(74) *Attorney, Agent, or Firm*—Westerman, Hattori, Daniels & Adrian, LLP

(57) ABSTRACT

In order to achieve augmentation of the accuracy in calculation of noise and augmentation of the accuracy in a noise check which is performed, for example, when an electronic circuit is designed and further realize significant reduction of the time required for a noise check and augmentation of the operation efficiency by reduction of the man-hours of a designer in a noise analysis, a noise checking apparatus includes a model production section (3) for producing a simulation model of a circuit portion relating to a noticed wiring line, a simulation section (4) for performing a simulation using the simulation model to calculate a signal waveform which propagates in the noticed wiring line and calculate a noise waveform superposed on the signal waveform for each kind of noise, a noise waveform synthesis section (5) for synthesizing the signal waveform and the noise waveforms with generation timings of the noise waveforms taken into consideration to obtain a noise composite waveform, and a noise checking section (6) for performing noise checking based on the noise composite waveform.

34 Claims, 40 Drawing Sheets

U.S. PATENT DOCUMENTS

| | | | |
|---|---|---|---|
| 5,502,644 A | | 3/1996 | Hamilton et al. ............ 364/488 |
| 5,568,395 A | * | 10/1996 | Huang ............................ 716/4 |
| 5,706,477 A | * | 1/1998 | Goto ............................ 703/14 |
| 5,751,163 A | | 5/1998 | Tang et al. |
| 5,751,597 A | * | 5/1998 | Okano et al. ................... 716/5 |
| 5,867,810 A | * | 2/1999 | Miura et al. ................. 702/191 |
| 5,983,006 A | * | 11/1999 | Carlson et al. ................. 716/4 |
| 5,999,714 A | * | 12/1999 | Conn et al. .................... 703/14 |
| 6,028,989 A | * | 2/2000 | Dansky et al. ................. 716/8 |
| 6,106,567 A | * | 8/2000 | Grobman et al. ............. 703/14 |
| 6,128,769 A | * | 10/2000 | Carlson et al. ................. 716/6 |
| 6,212,490 B1 | * | 4/2001 | Li et al. ........................ 703/14 |
| 6,278,951 B1 | * | 8/2001 | Sato ............................ 702/57 |

OTHER PUBLICATIONS

"Dictionary.com: 6 entries found for synthesis" http://www.dictionary.com/search?q=synthesis. Download from web Sep. 23, 2003.*

"Dictionary.com: 4 entries found for synthesize" http://www.dictionary.com/search?q=synthesize. Download from web Sep. 23, 2003.*

"Dictionary.com: 3 entries found for crosstalk" http://www.dictionary.com/search?q=crosstalk. Download from web Sep. 23, 2003.*

Rhodes, D.L. "Parallel Computation for Microwave Circuit Simulation". IEEE Transactions on Microwave Theory and Techniques. vol. 45, Issue 5. May '97. pp. 587–592.*

Lipman, Jim. "Board–Level Signal–Integrity Analysis: Sooner is Better" EDN Access. Jul. 16, 1998. http://www.e–insite.net/ednmag/archives/1998/071698/15df2.htm.*

Steinberg, C. and Wilson, I. "Simulation Programs Iron Out Transmission–Line Effects". EDN Access. Mar. 3, 1994. http://www.e–insite.net/ednmag/archives/1994/030394/05df2.htm.*

Matsui et al. "Electrical Design Techniques for High–Speed Circuit Boards". 8th IEEE/CHMT Int'l Electronic Manufacturing Technology Symposium, 1990. May 9, 1990. pp. 234–243.*

Becker et al. "FDTD Modeling of Noise in Computer Packages". Proceedings, 1993 IEEE Multi–Chip Module Conference. Mar. 18, 1993. pp. 123–127.*

Gao, et al. "Minimum Crosstalk Channel Routing". 1993 IEEE/ACM Int'l Conf. On CAD. Nov. 11, 1993. pp. 692–696.*

John, et al. "Methods for Simulation of Reflection and Crosstalk Effects on Printed Circuit Boards". 9th Int'l Conference on Electromagnetic Compatibility, 1994. Sep. 7, 1994. pp. 217–224.*

Kyoung–Son, et al. "A Segment Rearrangement Approach to Channel Routing Under the Crosstalk Constraints". 1994 IEEE Asia–Pacific Conference on Circuits and Systems. Dec. 8, 1994. pp. 536–541.*

Huq, Syad. "Understanding and Using IBIS models for Signal Integrity Analysis". Presented at High–Level Electronic System Design Conference (HESDC '97). Oct. 7–9, 1997. http://www.eigroup.org/ibis/hesdccvr.htm.*

"IBIS", Printed Circuit Design Magazine, Apr. 1997. http://signalintegrity.com/Pubs/straight/ibis.htm.*

I/O Buffer Information Specification (IBIS) Version 3.0, (Jun. 12, 1997), http://www.eigroup.org/ibis/specs.htm.*

ACCEL Technologies, Inc. "ACCEL Signal Integrity™ User Guide". 1998.*

IEE, Conference Publication No. 396; pp. 217–224, 1994. Cited in the Search Rpt.

Electronic Parts and Materials, Industry Information Center, Oct. 1, 1998, vol. 37, No. 19, pp. 72–76. Cited in the Search Report.

* cited by examiner

Ded, Ding NET CONFIGURATION EXAMPLE

● ─── ● Ded NET (Net A)
■ ─── ■ Ding NET (Net B)
▷ ─── ▷ Ding NET (Net C)

ARRANGEMENT OF SIMULATION MODELS (4 SIMULATIONS)

① NOTICED NET (NET INFLUENCED BY NOISE)
② NOISE NET (NET HAVING INFLUENCE OF NOISE)

↓ MODELING

FIG. 10A
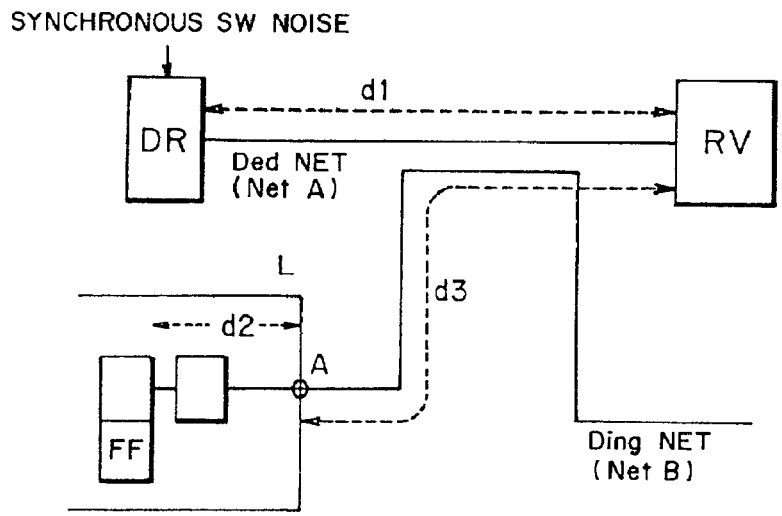
FIG. 10B
① WAVEFORM ROUNDING + REFLECTION NOISE WAVEFORM
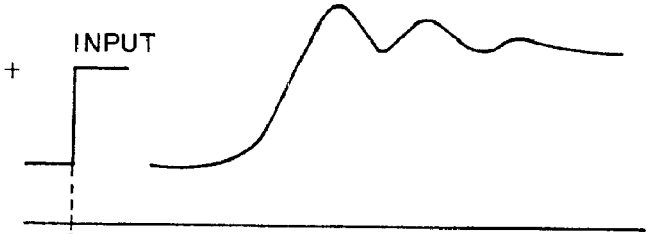
② CROSSTALK NOISE WAVEFORM
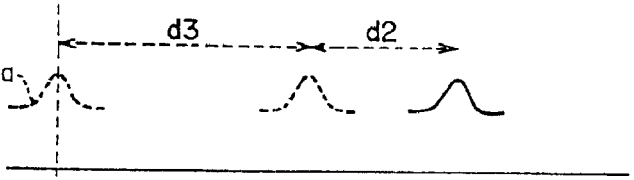
③ SIMULTANEOUS SW NOISE WAVEFORM
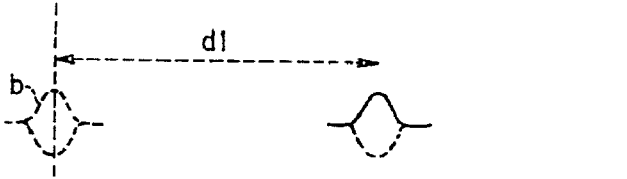
④ NOISE COMPOSITE WAVEFORM
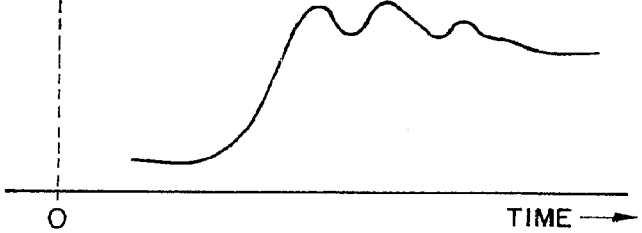
TIME →

FIG. 17A
FIG. 17B
FILE NAME : spc 000.sp
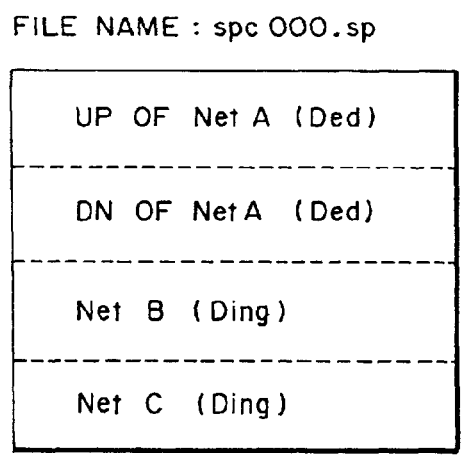
FILE NAME : spc 000.sp.001
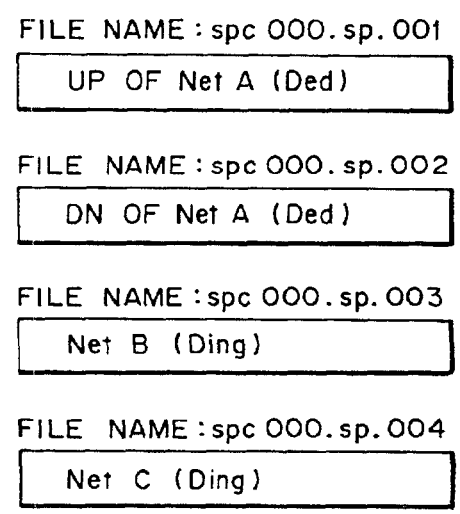

FIG. 21A
FILE NAME : spc 000.sp
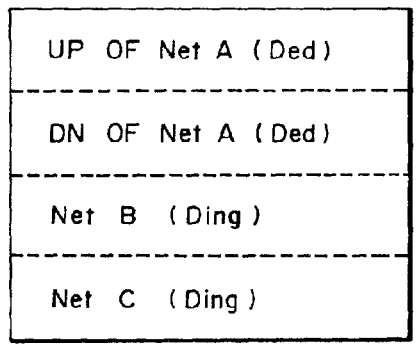
FIG. 21B
FILE NAME : spc 000.sp.001
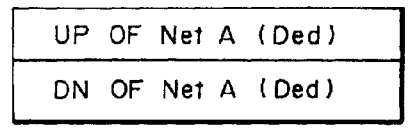
FILE NAME : spc 000.sp.002
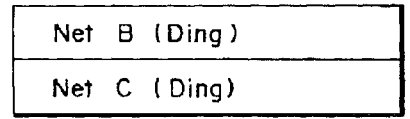

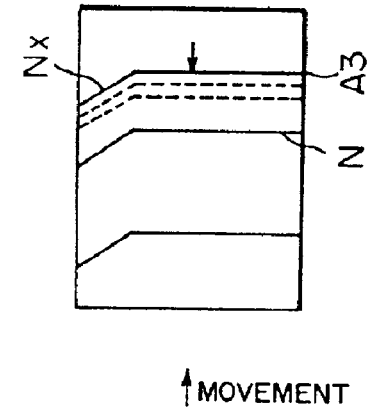
FIG.25C
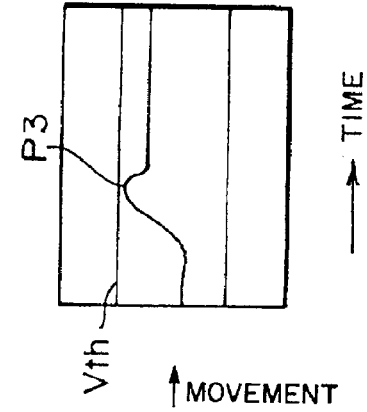
FIG.25F
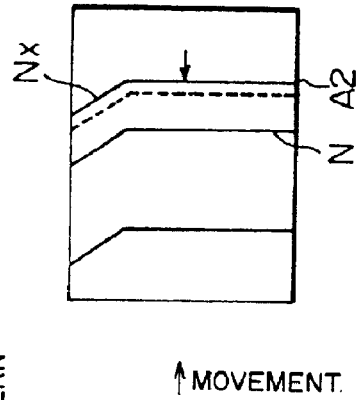
FIG.25B
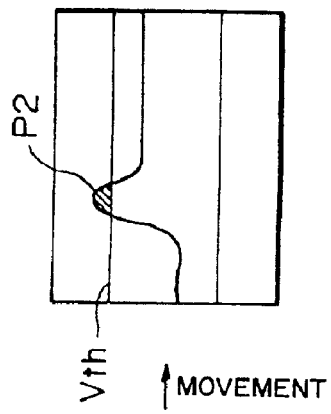
FIG.25E
FIG.25A
VIEW OF MOUNTING DESIGN SYSTEM OR WIRING PATTERN
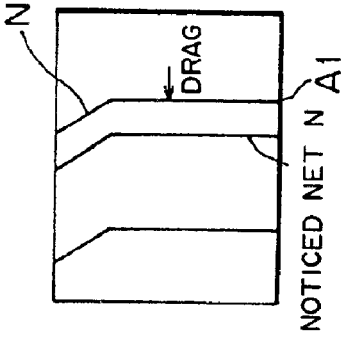
FIG.25D
NOISE WAVEFORM DIAGRAM

SIGNAL WAVEFORM

NOISE WAVEFORM

NOISE COMPOSITE WAVEFORM

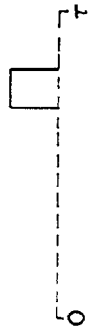
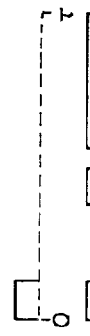
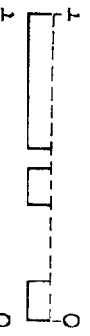
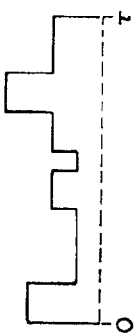
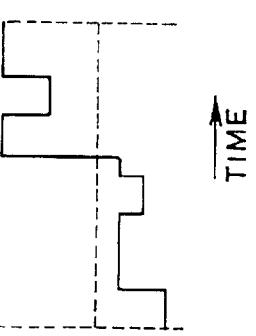

FIG.37A  LSI DR SIMULTANEOUS SW NOISE

FIG.37B  LSI RV SIMULTANEOUS SW NOISE

FIG.37C  PARALLEL WIRING PATTERN CROSSTALK NOISE
+CROSSING WIRING CROSSTALK NOISE

FIG.37D  VIA CROSSTALK NOISE
TERMINATING RESISTOR SIMULTANEOUS SW NOISE
CONNECTOR CROSSTALK NOISE
CABLE CROSSTALK NOISE
DC NOISE

FIG.37E  COMPOSITE NOISE WAVEFORM

FIG.37F  TRANSMISSION WAVEFORM OF NOTICED NET
(UPON RISING)

FIG.37G  COMPOSITE TRANSMISSION WAVEFORM OF NOISES
OF NOTICED NET (NOISE COMPOSITE WAVEFORM)

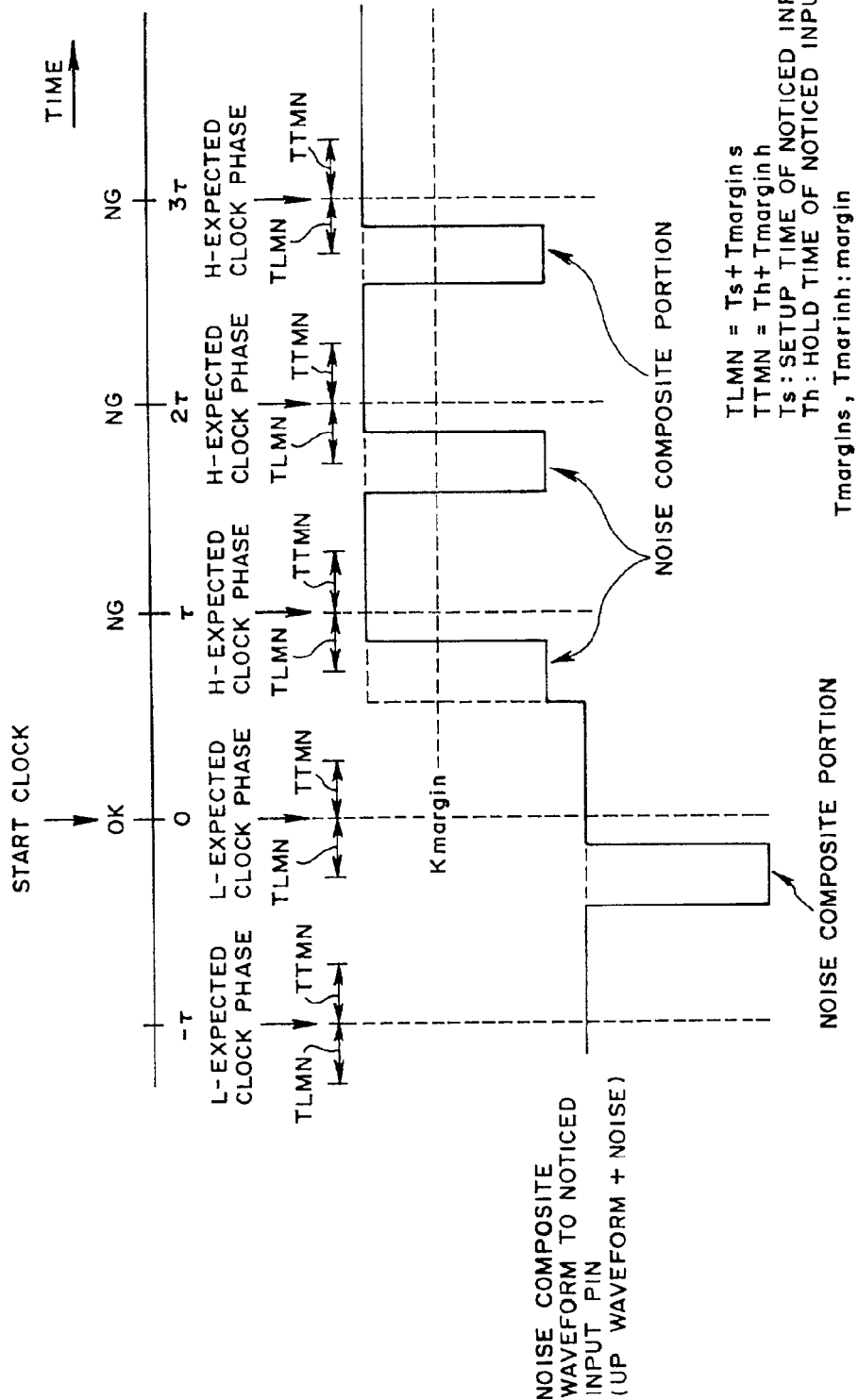

NOISE CHECKING METHOD AND APPARATUS

This application is a continuation of international application PCT/JP99/02093 filed on Apr. 20, 1999.

TECHNICAL FIELD

This invention relates to a technique applied when design an electronic circuit of, for example, an LSI (Large Scale Integration), an MCM (Multi Chip Module), a printed circuit board (PCH: Printed-Circuit Board) and so forth is designed, and more particularly to a method of and an apparatus for checking an influence of noise which can possibly be generated by an electronic circuit of a design object (for example, reflection noise, crosstalk noise, simultaneous switching noise, power supply noise, radio wave radiation noise and so forth) on a signal waveform propagated in the electronic circuit of the design object.

BACKGROUND ART

It is demanded that various electronic apparatus (for example, an LSI, an MCM, a PCB and so forth) developed at present have augmented performances, higher operation speeds, reduced sizes and increased densities, and now, also functions of such apparatus have been much complicated.

For example, for higher speed operations, it is demanded that the system clock (transmission clock cycle) be approximately 300 MHz, and also it is demanded that also the signal edge speed (rising/falling speed of a signal) be set to several hundreds ps (picoseconds) as a result of the rise of the speed of the clock. Meanwhile, in order to raise the density of the mounting state, an SOP (Small Outline Package) of the surface mounting type is adopted as a package technique for an LSI from a DIP (Dual In-line Package) of the through-hole mounting type. Further, a BGA (Ball Grid Array) is adopted in recent years.

In such a situation as just described, the problem of a wiring line delay is actualized as a result of the increase in speed. Therefore, attention must be paid to a wiring line delay when an electronic circuit of an LSI, MCM, PCB or the like is designed.

An LSI of the CMOS type which is adopted frequently in common electronic apparatus has a characteristic that the power consumption is low. However, the LSI of the CMOS type has a problem in that, because operating current which flows through an element is fluctuated by a great amount by switching of gates, power supply noise is generated and another problem in that the noise margin is decreased by a drop of the amplitude voltage.

Further, as such increase in speed and reduction in size/increase in density of an apparatus as described above proceed, crosstalk noise and reflection noise caused by impedance mismatching or by a large capacitive load are generated compositely, not only a delay problem by noise occurs, but also a malfunction may possibly occur in the circuit.

A certain wiring line is subject to electric interference by a switching operation of a signal which propagates in an adjacent wiring line, and noise, which is caused by the electric interference and is superposed on a signal propagating on the wiring line, is called crosstalk noise. Such crosstalk noise exhibits an increase to a level which cannot be ignored as a reduction of the distance between wirings and increase of the signal edge speed.

In a bus line, a plurality of signal lines are wired densely, and also when signals which propagate in the signal lines are switched simultaneously, high noise is generated. This noise is called simultaneous switching noise.

Since generation of such various kinds of noise (reflection noise, crosstalk noise, simultaneous switching noise and power supply/ground bounce) as described above deteriorate the quality (signal integrity) of the waveform of a signal propagating in a circuit very much, the problem of a delay or a malfunction in signal propagation has been actualized. Further, since superposition of various kinds of noises described above on a propagation signal makes a factor of an increase of electromagnetic induction noise (radio wave radiation noise) to the outside in addition to an increase of the operating speed, also it is demanded to pay attention to EMI (electromagnetic interference) to design a circuit so that the degree to which various kinds of noise generated in the circuit have an influence on a propagation signal may be suppressed as far as possible.

To this end, it is a conventional practice to set wiring rules on the document base and urge a designer to observe the wiring rules or to provide a wiring rule check tool on the mathematical expression base as a CAD tool to automatically check whether or not the wiring rules are observed when a circuit is designed.

In wiring rules on the document base, rules on wiring line designing which can suppress generation of the various kinds of noise described above are described in advance in the form of a document, and a circuit designer refers to the document to design a circuit observing the rules. For example, parallel wiring line spaces/parallel wiring line lengths with which generation of crosstalk noise can be suppressed, wiring line lengths/branch lengths with which an influence of reflection noise can be suppressed, and so forth are set as rules.

In a wiring rule check tool on the mathematical expression base, wiring rules on the document base described above are described not in the form of a document but in the form of mathematical expressions in advance, and various dimensions regarding wiring lines obtained upon logic designing or mounting designing are substituted into the mathematical expressions to automatically check whether or not a total wiring line length, a branch length, a parallel wiring line length and a maximum load number are set so that generation of various kinds of noise may be suppressed.

Also measures for individually solving problems caused by various kinds of noise when designing is performed actually and such problems caused by various kinds of noise occur have been presented conventionally, and it is known that such measures are used to analyze crosstalk noise and reflection noise individually and perform a margin check, a delay/racing analysis and so forth of each kind of noise.

However, where such wiring rules on the document base or a wiring rule check tool on the mathematical expression base as described above is used, if the operating speed of a design object circuit is low, then it is possible to observe the wiring rules. However, as the operating speed is raised, it becomes difficult to design wiring lines so that the wiring rules (mathematical expressions) may be satisfied indiscriminately. Since the wiring rules are set taking various situations in which various kinds of noise are generated compositely into consideration so that generation of the various kinds of noise may be suppressed with certainty if the rules are observed, they are set very severely. Therefore, conventionally used wiring rules are excessive rules if the operating speed is raised, and cannot be used practically because a wiring line cannot be designed so as to satisfy the rules. When a wiring line cannot be designed so as to satisfy the rules in this manner, the designer designs ignoring the rules and takes a countermeasure against noise when a problem of noise occurs actually.

On the other hand, also measures for individually solving problems caused by noise have conventionally been presented as described above, such a technique as to perform a check of noise with generation timings of noise or delays in a net taken into consideration to systematically analyze various kinds of noise to actually produce an electronic circuit is not available. Accordingly, it cannot conventionally be avoided to check problems and so forth arising from noise by means of manual operations of a designer and a test of a circuit of a design object after the circuit is produced actually. Consequently, much time is required for the noise check and very high burden is imposed on the designer who analyzes the noise.

Further, there conventionally is a tendency that the influence of noise is evaluated unreasonably since noise is not analyzed with generation timings of noise and delays in a net taken into consideration. However, apparatus are complicated in function and augmented in speed in recent years as described above, and this results in severer design conditions for a circuit. Thus, it is demanded to systematically analyze different kinds of noise taking generation timings of noise and delays in a net into consideration and perform a margin check, a delay/racing analysis and so forth of noise based on a waveform proximate to an actual waveform.

Furthermore, an apparatus development cycle has been shortened in recent years. For example, in a personal computer, the development cycle is becoming shorter from a unit of a year to a unit of a month, and also it is demanded to shorten the time required for a noise check incidentally.

The present invention has been made in view of such a situation as described above, and it is an object of the present invention to provide a noise checking method and apparatus which makes it possible to systematically check/analyze various kinds of noise based on a signal waveform proximate to an actual signal waveform formed with the various kinds of noise taken into consideration to achieve augmentation of the accuracy in calculation of noise and augmentation of the accuracy in a noise check and besides realizes significant reduction of the time required for a noise check and augmentation of the operation efficiency by reduction of the man-hours of a designer in a noise analysis.

DISCLOSURE OF INVENTION

In order to attain the object described above, according to the present invention, a noise checking method used upon circuit designing for checking noise which has an influence on a signal waveform which propagates in a noticed wiring line on a design object circuit is characterized in that it comprises the steps of producing a simulation model of a circuit portion relating to the noticed wiring line, performing a simulation using the simulation model to calculate a signal waveform which propagates in the noticed wiring line and calculate a noise waveform superposed on the signal waveform in the noticed wiring line for each kind of noise, synthesizing the signal waveform and the noise waveforms calculated for the individual kinds of noise with generation timings of the noise waveforms taken into consideration to obtain a noise composite waveform which is the signal waveform on which the noise is superposed, and performing noise checking based on the noise composite waveform.

At this time, where an adjacent wiring line to the noticed wiring line is turned back in such a manner as to have a plurality of proximate portions which can electrically interfere with the noticed wiring line, simulation models are produced with regard to the individual proximate portions of the adjacent wiring line and the noticed wiring line and the noise waveforms are calculated using the simulation models, and then the noise waveforms calculated with regard to all of the proximate portions and the signal waveform are synthesized with generation timings of the noise waveforms taken into consideration.

When the noise checking is performed, a maximum delay time and a minimum delay time of the noticed wiring line may be extracted from the noise composite waveform, and overdelay/racing checking for the noticed wiring line may be performed using the maximum delay time and the minimum delay time.

Where the signal waveform which propagates in the noticed wiring line is a clock waveform, when the noise checking is performed, a pulse period of the noise composite waveform may be calculated from crossing points of the noise composite waveform and a high level discrimination threshold value/low level discrimination threshold value for the signal waveform, and pulse period checking of the clock waveform in the noticed wiring line may be performed based on the pulse period. As an alternative, a rising width and a falling width of the noise composite waveform may be calculated from crossing points of the noise composite waveform and a high level discrimination threshold value/low level discrimination threshold value for the signal waveform, and pulse width checking of the clock waveform in the noticed wiring line may be performed based on the rising width and the falling width. As another alternative, a time required for the noise composite waveform to rise and another time required for the noise composite waveform to fall may be calculated from crossing points of the noise composite waveform and a high level discrimination threshold value/low level discrimination threshold value for the signal waveform, and checking of the rising time/falling time of the clock waveform in the noticed wiring line may be performed based on the times.

When the simulation is performed, the simulation model may be divided into a plurality of files, and simulations with regard to the plurality of files may be executed individually by a plurality of processing sections of a parallel processor which operate parallelly, whereafter simulation result files by the plurality of processing sections are combined.

Similarly, when the simulation is performed, the simulation model may be divided into a plurality of files, and simulations with regard to the plurality of files may be executed individually by a plurality of processing sections interconnected over a network, whereafter simulation result files by the plurality of processing sections are combined.

The noise checking method may further comprise the steps of performing a noise analysis with regard to the noise composite waveform, displaying, if a questionable wiring line which has a bad influence on the noticed wiring line is found by the noise analysis, a wiring line pattern including the noticed wiring line and the questionable wiring line on a display section, calculating, if the questionable wiring line displayed on the display section is moved on the display section by means of a pointing device, an actual movement amount of the questionable wiring line corresponding to an amount of the movement by the pointing device, performing, in the state wherein the questionable wiring line is moved by the actual movement amount, the production of the simulation model, the simulation, the synthesis of the noise composite waveform and the noise checking again, and displaying the noise composite waveform after the movement of the questionable wiring line on the display section.

Similarly, the noise checking method may further comprise the steps of performing a noise analysis with regard to the noise composite waveform, displaying, if a noise waveform which has a bad influence on the noticed wiring line is found by the noise analysis, the noise waveform on a display section, and calculating, if the noise waveform displayed on the display section is moved on the display section by means of a pointing device, a timing changing amount of the noise waveform corresponding to an amount of the movement by the pointing device and dynamically changing a generation timing of the noise waveform by the timing changing amount. At this time, the synthesis of the noise composite waveform and the noise checking may be performed again using the noise waveform whose generation timing has been dynamically changed, and the noise composite waveform after the timing changing of the noise waveform may be displayed on the display section.

The noise checking method may further comprise the steps of calculating, where ringing is superposed on the noise composite waveform, a damping resistance value with which the ringing can be eliminated if the damping resistor is added to the noticed wiring line, displaying candidate part data corresponding to the damping resistance value on the display section, performing, in a state wherein a part selected from among the candidate part data is added to the noticed wiring line, the production of the simulation model, the simulation, the synthesis of the noise composite waveform and the noise checking again, and displaying the noise composite waveform after the addition of the part on the display section.

In order to obtain the noise composite waveform, time axis direction distributions of a maximum value and a minimum value of the signal waveform with a delay variation taken into consideration may be calculated and time axis direction distributions of a maximum value and a minimum value of a noise waveform with a noise generation timing variation taken into consideration may be calculated for each kind of noise, and time axis direction distributions of the maximum value and the minimum value obtained by synthesizing the time axis direction distributions of the maximum value and the minimum value of the signal waveform and the time axis direction distributions of the maximum value and the minimum value of the noise waveforms may be used as the noise composite waveform.

In this instance, when the noise checking is performed, it is discriminated whether or not both of the time axis direction distributions of the maximum value and the minimum value of the noise composite waveform satisfy logical expected values for a check object pin.

When the simulation is performed, a single signal waveform may be calculated under a predetermined condition and a single noise waveform for each kind of noise may be calculated under the predetermined condition, and, when the noise composite waveform is obtained, the single signal waveform calculated may be shifted within a range of the delay variation to calculate time axis direction distributions of the maximum value and the minimum value of the signal waveform and the single noise waveform calculated may be shifted within a range of the noise generation timing variation to calculate, for each kind of noise, time axis direction distributions of the maximum value and the minimum value of the noise waveform.

Where the noise waveform exists across a plurality of clock cycles, a maximum value compressed noise waveform and a minimum value compressed noise waveform, in which maximum values and minimum values of the noise waveform are compressed into one clock cycle respectively, may be produced by extracting the maximum values and the minimum values of the noise waveform in the same phase of each clock cycle from the clock cycles respectively, and the compressed noise waveforms may be used as the time axis direction distributions of the maximum value and the minimum value of the noise waveform, respectively.

Further, when an overdelay check of the signal waveform is performed by the noise checking, upon rising of the signal waveform, a waveform obtained by synthesizing the time axis distribution of the minimum value of the noise waveform with the signal waveform may be used as the noise composite waveform, but upon falling of the signal waveform, another waveform obtained by synthesizing the time axis distribution of the maximum value of the noise waveform with the signal waveform may be used as the noise composite waveform.

Similarly, when a racing check of the signal waveform is performed by the noise checking, upon rising of the signal waveform, a waveform obtained by synthesizing the time axis distribution of the maximum value of the noise waveform with the signal waveform may be used as the noise composite waveform, but upon falling of the signal waveform, another waveform obtained by synthesizing the time axis distribution of the minimum value of the noise waveform with the signal waveform may be used as the noise composite waveform.

Meanwhile, according to the present invention, a noise checking apparatus used upon circuit designing for checking noise which has an influence on a signal waveform which propagates in a noticed wiring line on a design object circuit is characterized in that it comprises a model production section for producing a simulation model of a circuit portion relating to the noticed wiring line, a simulation section for performing a simulation using the simulation model produced by the model production section to calculate a signal waveform which propagates in the noticed wiring line and calculate a noise waveform superposed on the signal waveform in the noticed wiring line for each kind of noise, a noise waveform synthesis section for synthesizing the signal waveform and the noise waveforms calculated by the simulation section with generation timings of the noise waveforms taken into consideration to obtain a noise composite waveform which is the signal waveform on which the noise is superposed, and a noise checking section for performing noise checking based on the noise composite waveform obtained by the noise waveform synthesis section.

In this manner, with the noise checking method and the noise checking apparatus of the present invention, the following effects or advantages can be achieved.

(1) A simulation is performed to calculate various kinds of noise such as waveform rounding, reflection noise, crosstalk noise and synchronous switching noise, and the noises are synthesized with generation timings thereof taken into consideration to obtain a noise composite waveform, and then noise checking with regard to a path which includes a noticed wiring line is performed based on the noise composite waveform. Accordingly, it is possible to systematically check/analyze various kinds of noise based on a signal waveform proximate to an actual signal waveform with the various kinds of noise taken into consideration. Consequently, the accuracy in noise calculation is augmented significantly and also the accuracy in noise checking is augmented significantly and the time required for noise checking can be reduced significantly. Besides, the burden to a designer in noise analysis can be reduced to augment the working efficiency significantly.

(2) Where an adjacent wiring line to a noticed wiring line has a plurality of proximate portions, a simulation is performed with regard to the individual proximate portions and the noticed wiring line to calculate noise waveforms, and the noise waveforms calculated with regard to all of the proximate portions and the signal waveform are synthesized with generation timings of the noise waveforms taken into consideration. Consequently, noise from the proximate portions can be taken into consideration to obtain a noise composite waveform without estimating the noise excessively lower than actual noise and in a short time.

(3) The processing time can be reduced significantly by dividing a simulation model and executing simulations parallelly making use of a plurality of processing sections of a parallel processor or on a network.

(4) When a questionable wiring line which has an influence on a noticed wiring line is moved on a display section, a noise composite waveform after the movement is displayed on the real time basis, or candidates to a damping resistance value are determined and presented and a noise composite waveform when a part corresponding to a damping resistance value is selected and added to the noticed wiring line is displayed. Consequently, a noise analysis can be facilitated, and the man-hours of a designer can be reduced to reduce the burden to the designer and the working efficiency can be further augmented.

(5) When a noise waveform which has an influence on a noticed wiring line is moved on a display section, the generation timing (input delay timing) of the noise waveform can be dynamically changed on the real time basis only by a timing changing amount corresponding to the amount of movement of the noise waveform. Consequently, a delay time file need not be changed and the man-hours can be reduced significantly. Further, a noise composite waveform in a state wherein the generation timing of the noise waveform is changed can be obtained and displayed on the real time basis without performing a simulation again. Consequently, a noise analysis can be facilitated, and the man-hours of a designer can be reduced to reduce the burden to the designer and the working efficiency can be further augmented.

(6) Time axis direction distributions of a maximum value and a minimum value obtained by synthesizing time axis direction distributions of a maximum value and a minimum value of a signal waveform with a delay variation taken into consideration and time axis direction distributions of a maximum value and a minimum value of a noise waveform with a noise generation timing variation taken into consideration are used as a noise composite waveform. Consequently, a noise check with a delay variation and noise generation timing variations taken into consideration can be performed only with two noise composite waveforms (time axis direction distributions of the maximum value and the minimum value), and the accuracy in noise calculation is augmented significantly and also the accuracy in the noise check is augmented significantly.

(7) A single signal waveform obtained by a simulation is shifted within a range of a delay variation and each noise waveform obtained by the simulation is shifted within a range of a noise generation timing variation. Consequently, time axis direction distributions of a maximum value and a minimum value of a signal waveform and noise waveforms can be calculated while the number of times of execution of a circuit simulation or arithmetic operation for synthesis is minimized. This contributes to augmentation of the accuracy in noise calculation and the accuracy in noise checking while the man-hours of a designer are reduced significantly.

(8) Where a noise waveform exists across a plurality of clock cycles, a compressed noise waveform obtained by extracting and compressing maximum values and minimum values of the noise waveform in the same phase of each clock cycle is used. Consequently, the worst condition when various kinds of noise overlap can be detected readily, which contributes not only to augmentation of the accuracy in noise calculation or the accuracy in noise checking but also to augmentation of reduction of the processing time.

BRIEF DESCRIPTION OF THE DRAWINGS

FIGS. 10A and 10B are diagrammatic views both illustrating noise synthesis in the first embodiment, and wherein FIG. 10A is a view showing a net pattern of a noise synthesis object and FIG. 10B is a time chart illustrating a noise synthesis procedure in the first embodiment;

FIGS. 17A and 17B are views illustrating file division (number of nodes: 4) in the first modification to the first embodiment;

FIGS. 21A and 21B are views illustrating file division (number of nodes: 2) in the second modification to the first embodiment;

FIGS. 25A to 25C are diagrammatic views all showing an example of a display upon movement of a net in the third modification to the first embodiment;

FIGS. 25D to 25F are diagrammatic views showing an example of a display of noise composite waveforms corresponding to FIGS. 25A to 25C, respectively;

FIGS. 37A to 37G are time charts illustrating a noise synthesis scheme in the second embodiment;

FIG. 41 is a diagram illustrating a checking scheme of a phase relationship between noise and a clock signal in the second embodiment.

BEST MODE FOR CARRYING OUT THE INVENTION

[0] Description of the Principle of the Invention

Figure 1:
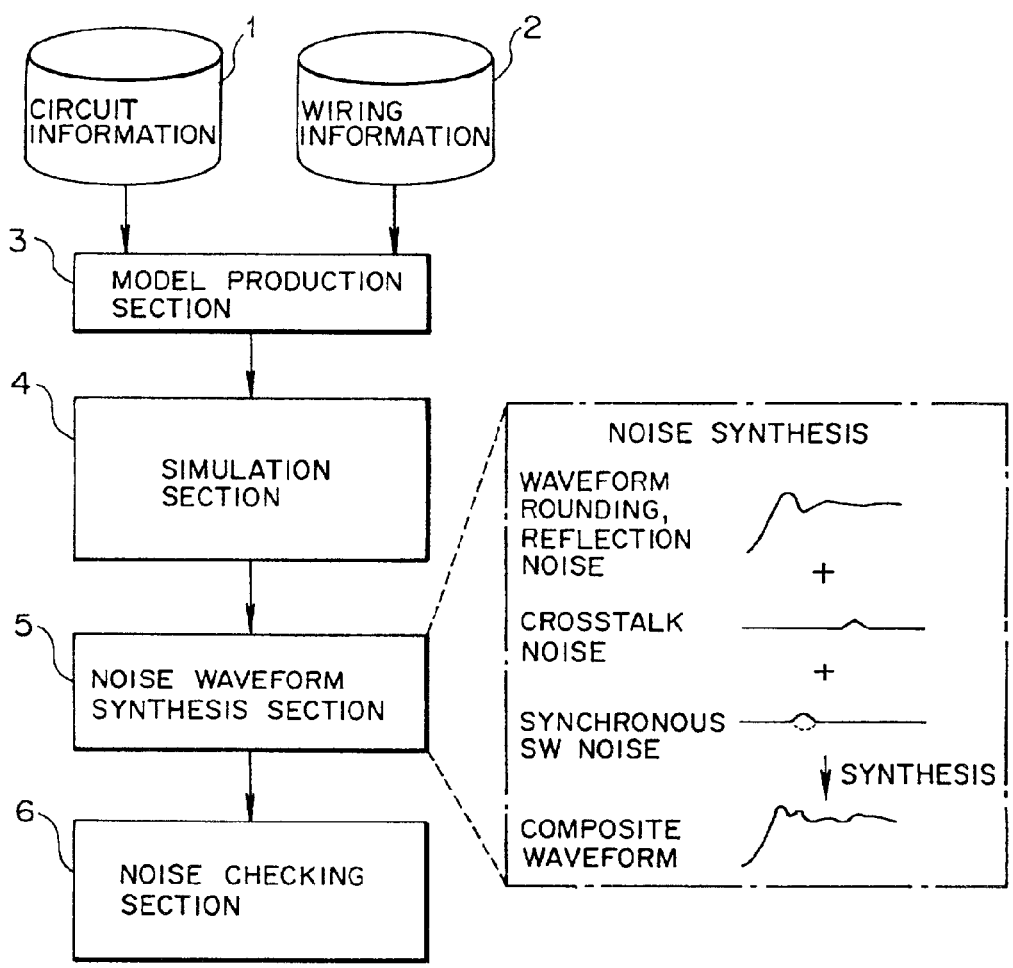
FIG. 1 is a block diagram of a principle of the present invention.

FIG. 1 is a block diagram of a principle of the present invention. Referring to FIG. 1, the noise checking apparatus of the present invention is an apparatus used upon circuit designing for checking noise which has an influence on a signal waveform which propagates in a noticed wiring line on a design object circuit, and includes a model production section 3, a simulation section 4, a noise waveform synthesis section 5 and a noise checking section 6.

The model production section 3 produces a simulation model of a circuit portion relating to the noticed wiring line based on circuit information 1 and wiring information 2.

The simulation section 4 performs a simulation using the simulation model produced by the model production section 3 to calculate a signal waveform which propagates in the noticed wiring line and calculate a noise waveform which is superposed on the signal waveform in the noticed wiring line for each kind of noise.

The noise waveform synthesis section 5 synthesizes the signal waveform and the noise waveforms calculated by the simulation section 4 with generation timings of the noise waveforms into consideration to obtain a noise composite waveform which is the signal waveform on which the noise is superposed.

The noise checking section 6 checks the noise based on the noise composite waveform obtained by the noise waveform synthesis section 5.

At this time, where an adjacent wiring line to the noticed wiring line is turned back in such a manner as to have a plurality of proximate portions which can electrically interfere with the noticed wiring line, the model production section 3 produces simulation models with regard to the individual proximate portions of the adjacent wiring line and the noticed wiring line and the simulation section 4 calculates the noise waveforms using the simulation models, and then the noise waveform synthesis section 5 synthesizes the noise waveforms calculated with regard to all of the proximate portions and the signal waveform with generation timings of the noise waveforms taken into consideration.

The noise checking section 6 may extract a maximum delay time and a minimum delay time of the noticed wiring line from the noise composite waveform and perform overdelay/racing checking for the noticed wiring line using the maximum delay time and the minimum delay time.

Where the signal waveform which propagates in the noticed wiring line is a clock waveform, the noise checking section 6 may calculate a pulse period of the noise composite waveform from crossing points of the noise composite waveform and a high level discrimination threshold value/ low level discrimination threshold value for the signal waveform and perform pulse period checking of the clock waveform in the noticed wiring line based on the pulse period. As an alternative, the noise checking section 6 may calculate a rising width and a falling width of the noise composite waveform from crossing points of the noise composite waveform and a high level discrimination threshold value/low level discrimination threshold value for the signal waveform and perform pulse width checking of the clock waveform in the noticed wiring line based on the rising width and the falling width. As another alternative, the noise checking section 6 may calculate a time required for the noise composite waveform to rise and another time required for the noise composite waveform to fall from crossing points of the noise composite waveform and a high level discrimination threshold value/low level discrimination threshold value for the signal waveform and perform checking of the rising time/falling time of the clock waveform in the noticed wiring line based on the times.

The simulation section 4 described above may include a file dividing section for dividing the simulation model into a plurality of files, a parallel processor having a plurality of processing sections for executing simulations with regard to the plurality of files obtained by the division of the file dividing section parallelly, and a file combining section for combining simulation result files by the plurality of processing sections.

Similarly, the simulation section 4 described above may include a file dividing section for dividing the simulation model into a plurality of files, a network interconnecting a plurality of processing sections for executing simulations with regard to the plurality of files parallelly, and a file combining section for combining simulation result files by the plurality of processing sections.

The noise checking apparatus may be constructed such that it further comprises a noise composite waveform analysis section for performing a noise analysis with regard to the noise composite waveform, a display section for displaying, if a questionable wiring line which has a bad influence on the noticed wiring line is found by the noise composite waveform analysis section, a wiring line pattern including the noticed wiring line and the questionable wiring line, a pointing device for moving the questionable wiring line displayed on the display section on the display section, and a movement amount calculation section for calculating an actual movement amount of the questionable wiring line corresponding to an amount of the movement by the pointing device, and that, in the state wherein the questionable wiring line is moved by the actual movement amount, the model production section 3, the simulation section 4, the noise waveform synthesis section 5 and the noise checking section 6 are operated again and the noise composite waveform after the movement of the questionable wiring line is displayed on the display section.

Similarly, the noise checking apparatus may further comprise a noise composite waveform analysis section for performing a noise analysis with regard to the noise composite waveform, a display section for displaying, if a noise waveform which has a bad influence on the noticed wiring line is found by the noise composite waveform analysis section, the noise waveform, and a timing changing amount calculation section for calculating a timing changing amount of the noise waveform corresponding to an amount of the movement by the pointing device and dynamically changing a generation timing of the noise waveform by the timing changing amount. At this time, the noise waveform synthesis section 5 and the noise checking section 6 may be operated again in a state wherein the generation timing of the noise waveform is changed, and the noise composite waveform after the timing changing of the noise waveform may be displayed on the display section.

The noise checking apparatus may be constructed such that it further comprises a damping resistance value calculation section for calculating, where ringing is superposed on the noise composite waveform, a damping resistance value with which the ringing can be eliminated if the damping resistor is added to the noticed wiring line, a part searching section for searching for candidate part data corresponding to the damping resistance value calculated by the damping resistance value calculation section, a displaying section for displaying the candidate part data searched out by the part searching section, and a selective inputting section for selecting a part from among the candidate part data displayed on the display section, and that, in a state wherein the part selected from among the candidate part data is added to the noticed wiring line, the model production section 3, the simulation section 4, the noise waveform synthesis section 5 and the noise checking section 6 are operated again, and the noise composite waveform after the addition of the part is displayed on the display section.

The noise waveform synthesis section 5 may calculate time axis direction distributions of a maximum value and a minimum value of the signal waveform with a delay variation taken into consideration and calculate time axis direction distributions of a maximum value and a minimum value of a noise waveform with a noise generation timing variation taken into consideration for each kind of noise, and synthesize the time axis direction distributions of the maximum value and the minimum value of the signal waveform and the time axis direction distributions of the maximum value and the minimum value of the noise waveforms to obtain time axis direction distributions of the maximum value and the minimum value as the noise composite waveform.

In this instance, the noise checking section 6 discriminates whether or not both of the time axis direction distributions of the maximum value and the minimum value of the noise composite waveform satisfy logical expected values for a check object pin to perform the noise checking.

The simulation section 4 may calculate a single signal waveform under a predetermined condition and calculate a single noise waveform for each kind of noise under the predetermined condition, and the noise waveform synthesis section 5 may shift the calculated single signal waveform within a range of the delay variation to calculate time axis direction distributions of the maximum value and the minimum value of the signal waveform and shift the calculated single noise waveform for each kind of noise within a range of the noise generation timing variation to calculate, for each kind of noise, time axis direction distributions of the maximum value and the minimum value of the noise waveform.

Where the noise waveform exists across a plurality of clock cycles, the noise waveform synthesis section 5 may extract maximum values and minimum values of the noise waveform in the same phase of each clock cycle from the clock cycles respectively to produce a maximum value compressed noise waveform and a minimum value compressed noise waveform wherein the maximum values and the minimum values of the noise waveform are compressed into one clock cycle respectively, and use the compressed noise waveforms as the time axis direction distributions of the maximum value and the minimum value of the noise waveform, respectively.

Further, when the noise checking section 6 performs an overdelay check of the signal waveform, the noise waveform synthesis section 5 may synthesize, upon rising of the signal waveform, the time axis distribution of the minimum value of the noise waveform with the signal waveform to obtain the noise composite waveform, but synthesize, upon falling of the signal waveform, the time axis distribution of the maximum value of the noise waveform with the signal waveform to obtain the noise composite waveform.

Similarly, when the noise checking section 6 performs a racing check of the signal waveform, the noise waveform synthesis section 5 may synthesize, upon rising of the signal waveform, the time axis distribution of the maximum value of the noise waveform with the signal waveform to obtain the noise composite waveform, but synthesize, upon falling of the signal waveform, the time axis distribution of the minimum value of the noise waveform with the signal waveform to obtain the noise composite waveform.

In the noise checking apparatus of the present invention described above, a circuit simulation model is produced and a circuit simulation is performed with regard to a noticed wiring line, and various kinds of noise such as waveform rounding, reflection noise, crosstalk noise and simultaneous SW (switching) noise of a transmission line are calculated. Then, the noises are synthesized with generation timings of the noises take into consideration to obtain a noise composite waveform.

Then, noise checking (a noise margin check, an overdelay/racing checks, a clock signal check and so forth) of a path including the noticed wiring line is performed based on the noise composite waveform. Accordingly, the various kinds of noise can be checked and analyzed systematically with a signal waveform proximate to an actual signal waveform with the various kinds of noise taken into consideration.

In this manner, with the noise checking apparatus of the present invention, the following effects or advantages can be achieved.

(1) A simulation is performed to calculate various kinds of noise such as waveform rounding, reflection noise, crosstalk noise and synchronous switching noise, and the noises are synthesized with generation timings thereof taken into consideration to obtain a noise composite waveform, and then noise checking with regard to a path which includes a noticed wiring line is performed based on the noise composite waveform. Accordingly, it is possible to systematically check/analyze various kinds of noise based on a signal waveform proximate to an actual signal waveform with the various kinds of noise taken into consideration. Consequently, the accuracy in noise calculation is augmented significantly and also the accuracy in noise checking is augmented significantly and the time required for noise checking can be reduced significantly. Besides, the burden to a designer in noise analysis can be reduced to augment the working efficiency significantly.

(2) Where an adjacent wiring line to a noticed wiring line has a plurality of proximate portions, a simulation is performed with regard to the individual proximate portions and the noticed wiring line to calculate noise waveforms, and the noise waveforms calculated with regard to all of the proximate portions and the signal waveform are synthesized with generation timings of the noise waveforms taken into consideration. Consequently, noise from the proximate portions can be taken into consideration to obtain a noise composite waveform without estimating the noise excessively lower than actual noise and in a short time.

(3) The processing time can be reduced significantly by dividing a simulation model and executing simulations parallelly making use of a plurality of processing sections of a parallel processor or on a network.

(4) When a questionable which has an influence on a noticed wiring line is moved on a display section, a noise composite waveform after the movement is displayed on the real time basis, or candidates to a damping resistance value are determined and presented and a noise composite waveform when a part corresponding to a damping resistance value is selected and added to the noticed wiring line is displayed. Consequently, a noise analysis can be facilitated, and the man-hours of a designer can be reduced to reduce the burden to the designer and the working efficiency can be further augmented.

(5) When a noise waveform which has an influence on a noticed wiring line is moved on a display section, the generation timing (input delay timing) of the noise waveform can be dynamically changed on the real time basis only by a timing changing amount corresponding to the amount of movement of the noise waveform. Consequently, a delay time file need not be changed and the man-hours can be reduced significantly. Further, a noise composite waveform in a state wherein the generation timing of the noise waveform is changed can be obtained and displayed on the real time basis without performing a simulation again. Consequently, a noise analysis can be facilitated, and the man-hours of a designer can be reduced to reduce the burden to the designer and the working efficiency can be further augmented.

(6) Time axis direction distributions of a maximum value and a minimum value obtained by synthesizing time axis direction distributions of a maximum value and a minimum value of a signal waveform with a delay variation taken into consideration and time axis direction distributions of a maximum value and a minimum value of a noise waveform with a noise generation timing variation taken into consideration are used as a noise composite waveform. Consequently, a noise check with a delay variation and noise generation timing variations taken into consideration can be performed only with two noise composite waveforms (time axis direction distributions of the maximum value and the minimum value), and the accuracy in noise calculation is augmented significantly and also the accuracy in the noise check is augmented significantly.

(7) A single signal waveform obtained by a simulation is shifted within a range of a delay variation and each noise waveform obtained by the simulation is shifted within a range of a noise generation timing variation. Consequently, time axis direction distributions of a maximum value and a minimum value of a signal waveform and noise waveforms can be calculated while the number of times of execution of a circuit simulation or arithmetic operation for synthesis is minimized. This contributes to augmentation of the accuracy in noise calculation and the accuracy in noise checking while the man-hours of a designer are reduced significantly.

(8) Where a noise waveform exists across a plurality of clock cycles, a compressed noise waveform obtained by extracting and compressing maximum values and minimum values of the noise waveform in the same phase of each clock cycle is used. Consequently, the worst condition when various kinds of noise overlap can be detected readily, which contributes not only to augmentation of the accuracy in noise calculation or the accuracy in noise checking but also to augmentation of reduction of the processing time.

[1] Description of the First Embodiment

Figure 2:
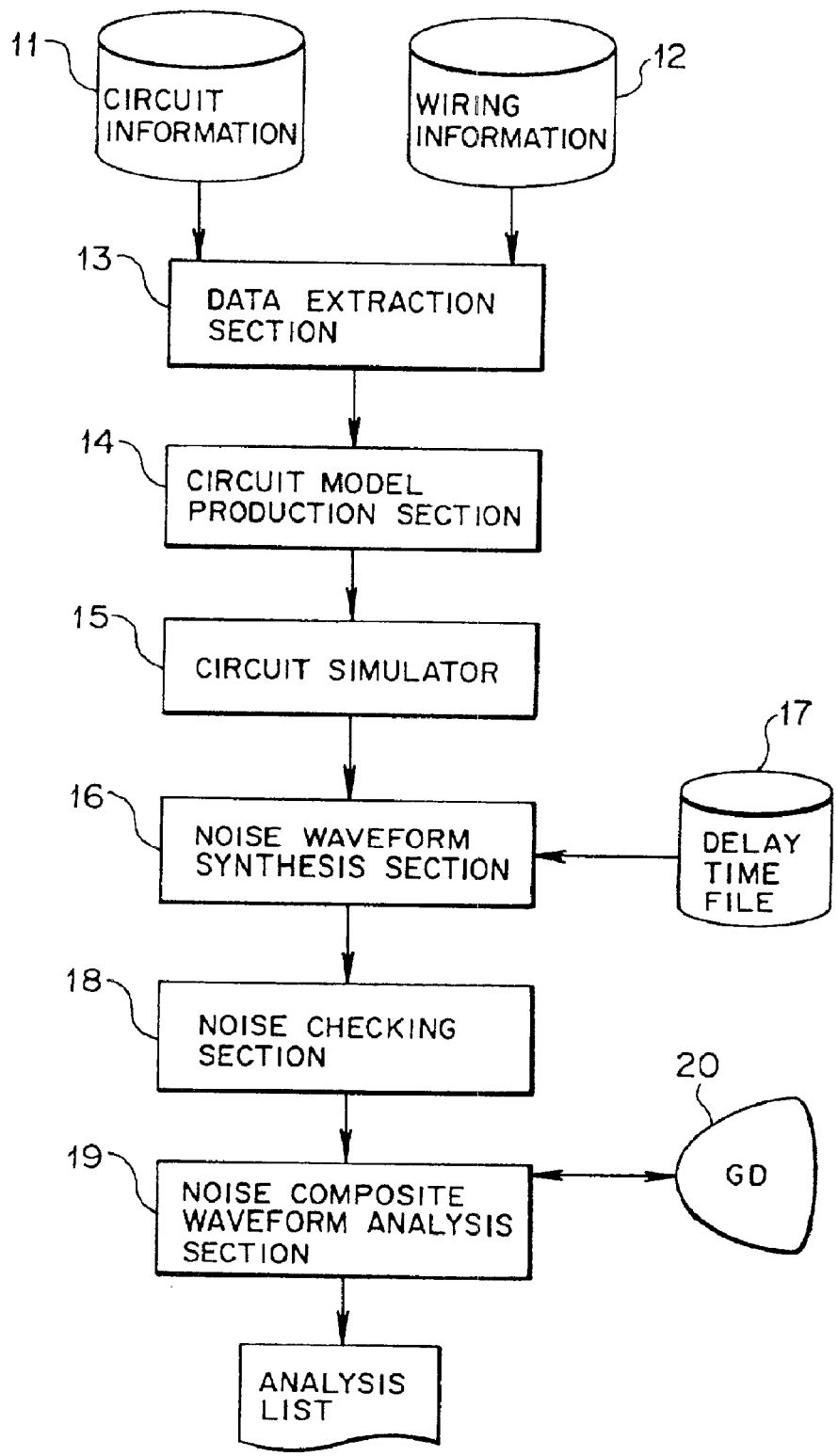
FIG. 2 is a block diagram showing a functional configuration of a noise checking apparatus as a first embodiment of the present invention.

FIG. 2 is a block diagram showing a functional configuration of a noise checking apparatus as a first embodiment of the present invention. As shown in FIG. 2, the noise checking apparatus of the first embodiment is an apparatus used upon circuit designing for checking noise which has an influence on a signal waveform which propagates in a noticed wiring line (hereinafter referred to as noticed net) on a design object circuit, and includes a circuit net list database 11, a mounting database 12, a data extraction section 13, a circuit model production section 14, a circuit simulator 15, a noise waveform synthesis section 16, a delay time file 17, a noise checking section 18, a noise composite waveform analysis section 19 and a display unit 20.

The circuit net list database 11 has circuit information (a net list) of the design object circuit stored in advance therein, and the mounting database 12 has wiring information of the design object circuit stored in advance therein.

The data extraction section 13 extracts necessary circuit information and wiring information (information regarding the noticed net and a net or nets proximate to the noticed net) from the circuit net list database 11 and the mounting database 12 and outputs the extracted information to the circuit model production section 14.

The circuit model production section (model generation section) 14 produces a simulation model of a circuit portion relating to the noticed net based on the circuit information and the wiring information extracted from the circuit net list database 11 and the mounting database 12 by the data extraction section 13.

The circuit simulator (simulation section) 15 performs a simulation using the simulation model generated by the circuit model production section 14 to calculate a signal waveform which propagates in the noticed net and calculate a noise waveform superposed on the signal waveform in the noticed net for each kind of noise. It is to be noted that, in the present embodiment, the circuit simulator 15 calculates a signal waveform (transmission line waveform), which propagates in the noticed net, in the form of a signal waveform which includes rounding of the waveform and reflection noise and further calculates noise waveforms of crosstalk noise, simultaneous switching noise and so forth.

The noise waveform synthesis section 16 refers to the delay times stored in the delay time file 17 and synthesizes the signal waveform and the noise waveforms calculated by the circuit simulator 15 taking times required for the noise waveforms to reach a noticed point (that is, timings at which the noise waveforms are generated at the noticed point) into consideration to obtain a noise composite waveform which is the waveform on which the noise is superposed.

The delay time file 17 has information regarding delay times of the design object circuit stored in advance therein. The delay time file 17 stores, for example, delay times from start points to end points of all nets which may become a noticed net, delay times from drivers to the start points of the nets, delay times from the end points of the nets to receivers, and so forth.

The noise checking section 18 performs noise checks such as an overdelay/racing check, a pulse period check of a clock waveform, a pulse width check of the clock waveform, and a check of a rising time/falling time of the clock waveform based on the noise composite waveform obtained by the noise waveform synthesis section 16 using, for example, a scheme which is hereinafter described with reference to FIGS. 11 to 15.

The noise composite waveform analysis section 19 performs noise analyses such as a noise margin analysis and an overdelay/racing analyses of the noise composite waveform obtained by the noise waveform synthesis section 16 and outputs a result of the analyses as an analysis list. The noise composite waveform analysis section 19 further has a function of causing the display unit [display section, GD (Graphic Display)] 20 to display the noise analysis result and a check result by the noise checking section 18.

The noise checking apparatus of the first embodiment having the configuration described above performs noise checking in the following manner.

(1-1) The data extraction section 13 extracts the circuit information and the wiring information from the circuit net list database 11 and the mounting database 12, and the circuit model production section 14 produces a circuit simulation model based on the extracted information.

The circuit simulation model in the present embodiment includes the following contents.

Figure 3A:
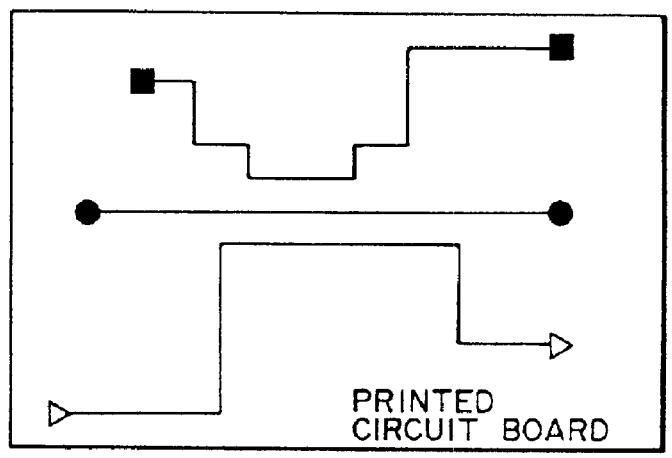
FIG. 3A is a diagrammatic view showing an example of a configuration of a Ded net and a Ding net.
Figure 3B:
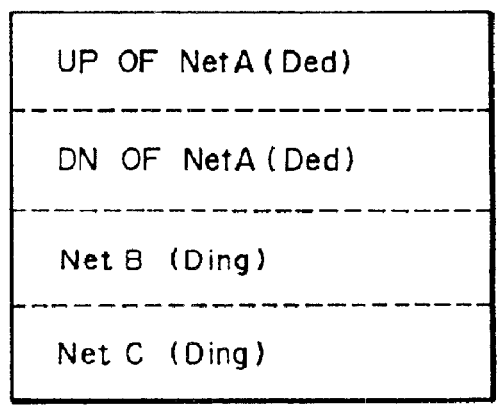
FIG. 3B is a view illustrating an example of an arrangement of a simulation model with regard to the example shown in FIG. 3A.

For example, where an object net includes a Ded net [net influenced by noise (noticed net): net A] and Ding nets (nets which provide noise to the Ded net: net B and net C) as shown in FIG. 3A, the circuit simulation model includes four simulation models as shown in FIG. 3B. In particular, the circuit simulation model includes two simulation models of an UP waveform (rising waveform) and a DOWN waveform (falling waveform) (UP of the net A and DN of the net A) for the Ded net, and two simulation models for the net B and the net C of the Ding nets.

It is to be noted that the number of Ding nets typically is 10 to approximately 100, but is sometimes greater than approximately 100.

The character "D" of the Ded net and the Ding nets is the initial letter of "disturb", and the "Ded net" is a net (disturbed net) which is disturbed and the "Ding nets" is a net (disturbing net) which disturbs. Further, "DOWN" which signifies "falling" may be hereinafter referred to simply as "DN".

(1-2) The circuit simulator 15 performs a simulation with regard to the circuit simulation model to determine a transmission line waveform (signal waveform) of the noticed net including waveform rounding, reflection noise and so forth and determine noise waveforms of crosstalk noise, simultaneous switching noise and so forth.

Figure 4:
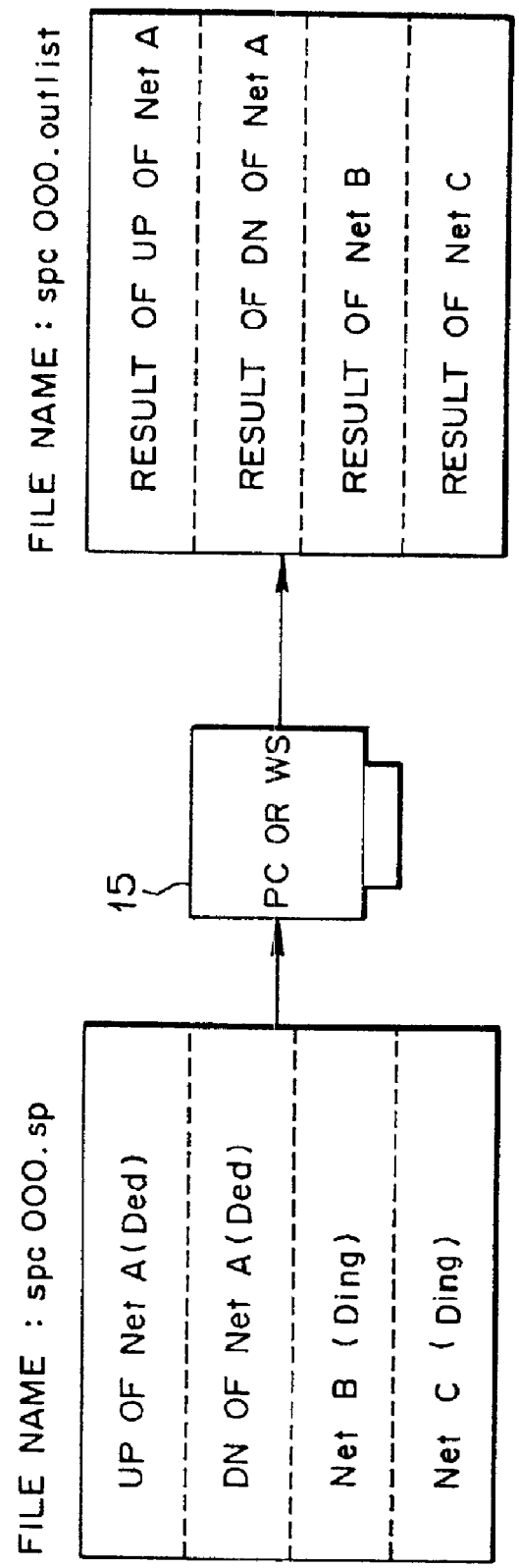
FIG. 4 is a diagrammatic view showing an image of a circuit simulation process in the first embodiment.

In particular, as shown in FIG. 4, a personal computer (PC) or a workstation (WS) which functions as the circuit simulator 15 performs a circuit simulation with regard to the four simulation models (file name: spc000.sp) described above to obtain a noise analysis result (file name: spc000.outlist) of the UP of the net A, the DN of the net A, the net B and the net C.

It is to be noted that the circuit simulator 15 actually is a program (software), and the program is started up and executed on the personal computer (hereinafter referred to simply as PC) or the work station (hereinafter referred to simply as WS) so that the PC or the WS functions as the circuit simulator 15.

Figure 5:
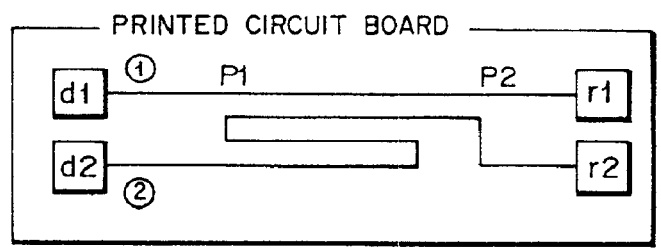
FIG. 5 is a diagrammatic view showing an example of a printed board on which a net which has an influence on a noticed net is disposed.

As shown in FIG. 5, where a net (noise net) ② whose noise has an influence on a net (noticed net) ① is disposed in parallel to the net ⓪ on a printed circuit board such that a section P1-P2 thereof forms the most proximate portion and has a plurality of (three here) proximate portions which can electrically interfere with the noticed net A since it is turned back by a plurality of times (twice here) in this section P1-P2, modeling and a noise simulation of the circuit can be performed in the following manner. It is to be noted that, in FIG. 5, reference characters d1 and d2 denote drivers for the noticed net and the noise net, respectively, and r1 and r2 denote receivers for the noticed net and the noise net, respectively.

Taking notice of the section P1-P2 within which the net ① and the net ② are most proximate to each other, a model with which noise simulation only for the section P1-P2 can be performed is produced and a simulation is performed with the model.

Figure 6A:
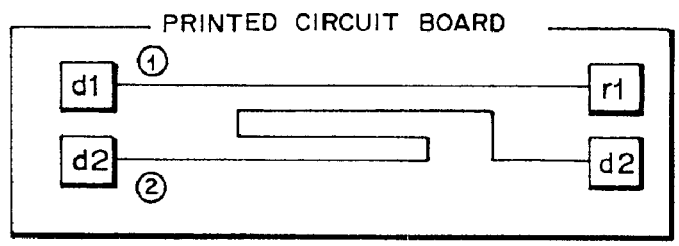
FIGS. 6A and 6B are diagrammatic views illustrating an example of modeling of the net shown in FIG. 5.
Figure 6B:
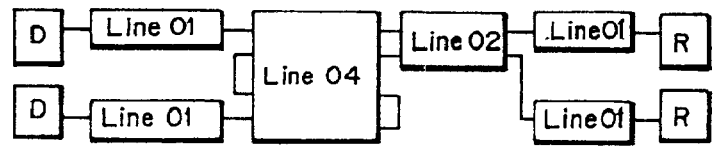

In particular, as shown in FIG. 6B, such a circuit as shown in FIG. 6A is divided into a portion where the net ⓪ and the net ② are spaced away from each other (a portion where they do not electrically interfere with each other) and another portion where the net ① and the net ② are proximate to each other (a portion where they can electrically interfere with each other). Then, a portion of the most proximate portion wherein two lines extend in parallel to each other is modeled collectively as a single "Line 02", and another portion of the most proximate portion wherein four lines extend in parallel to each other is modeled collectively as a single "Line 04". The other portions where the net ⓪ and the net ② are spaced away from each other are modeled as a single line "Line 01". The circuit model production section 14 produced a plurality of models with which an influence of noise can be investigated in this manner, and the circuit simulator 15 performs a circuit simulation with the models.

However, if modeling is performed as shown in FIG. 6B to perform a simulation of noise, then the simulation is performed on the assumption that, for the single portion "Line 04" composed collectively of the four lines, only the single line has an influence on the noticed net ⓪. Therefore, there is the possibility that noise obtained by a simulation performed with the model "Line 04" may be lower than noise which is actually generated in the noticed net ① and the influence of the noise may be evaluated excessively low. Further, with the method wherein a plurality of types of models (Line 01, Line 02 and Line 04) are prepared, it is difficult to estimate how many models should be prepared, and in most cases, much processing time is required as the time for one simulation.

Therefore, the present embodiment uses a method wherein the most proximate portion is modeled first to perform a simulation and then the second most proximate portion is modeled, whereafter a simulation is performed by a number of lines of proximate portions like the third and fourth most proximate portions (the number of parallel lines), and all noise amounts are synthesized for evaluation.

Figure 7:
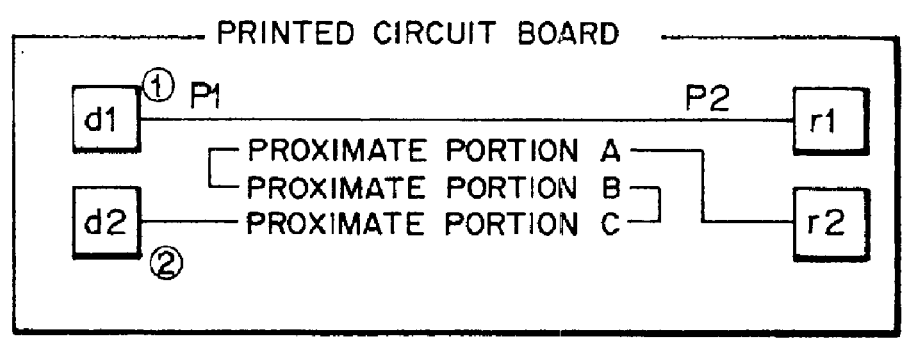
FIG. 7 is a diagrammatic view illustrating an example wherein a proximate portion of the printed board shown in FIG. 5 is divided into three portions A, B, and C.
Figure 8A:
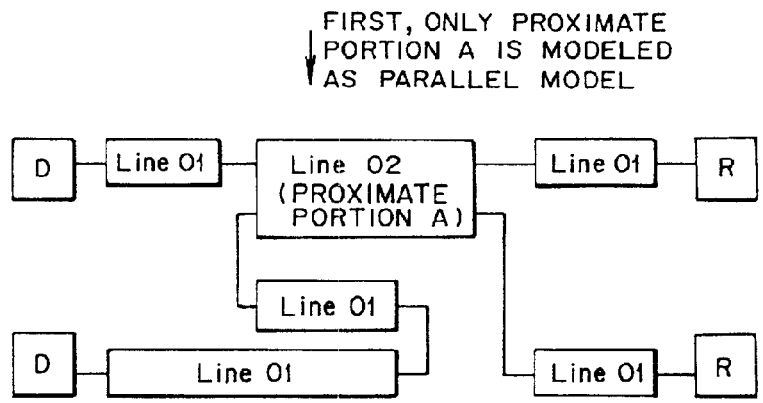
FIGS. 8A to 8C are diagrammatic views illustrating another example of modeling of the net shown in FIG. 5.
Figure 8B:
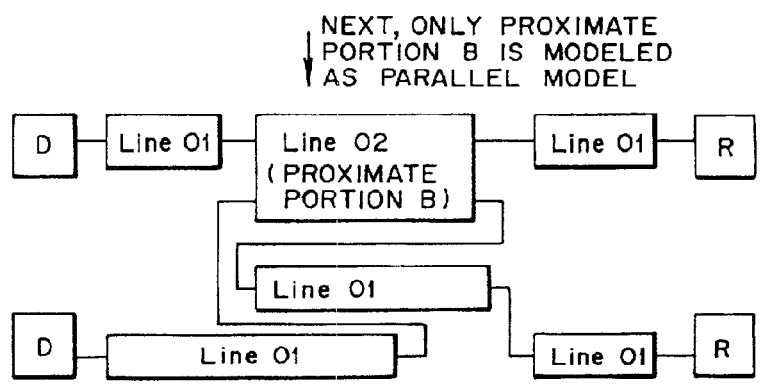
Figure 8C:
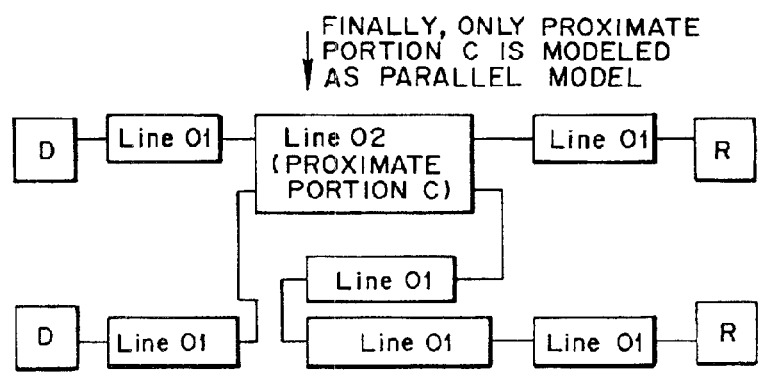

In particular, where the noise net ② has three proximate portions which can electrically interfere with the noticed net ① since the net ② is turned back by a plurality of times (twice here) as shown in FIG. 7, the section P1-P2 is divided into proximate portions A, B and C. Then, only the proximate portion A is first modeled into a parallel model (Line 02) as shown in FIG. 8A by the circuit model production section 14 and a simulation is performed by the circuit simulator 15. Then, only the proximate portion B is modeled into another parallel model (Line 02) by the circuit model production section 14 as shown in FIG. 8B and a simulation is performed by the circuit simulator 15. Further, only the proximate portion C is modeled into a further parallel model (Line 02) as shown in FIG. 8C by the circuit model production section 14 and a simulation is performed by the circuit simulator 15. All noise amounts determined for the individual proximate portions as just described are synthesized in such a manner as hereinafter described by the noise waveform synthesis section 16, and the noise checking section 18 and the noise composite waveform analysis section 19 use a result of the synthesis (noise composite waveform) to perform noise evaluation.

In the modeling scheme illustrated in FIG. 6B, only the most proximate portion (proximate portion A) is used as an object of modeling and noise amounts at the other portions (proximate portions B and C) are not taken into consideration. Consequently, there is the possibility that noise may be evaluated excessively low. However, employment of the modeling scheme illustrated in FIGS. 8A to 8C prevents noise from being evaluated lower than actual noise.

Further, where a plurality of parallel models (Line 02 and Line 04) are prepared as shown in FIG. 6B, much simulation time is required. However, where the modeling scheme illustrated in FIGS. 8A to 8C is used, since the time required for one simulation is reduced, the overall noise analysis time/noise checking time can be reduced.

Figure 9:
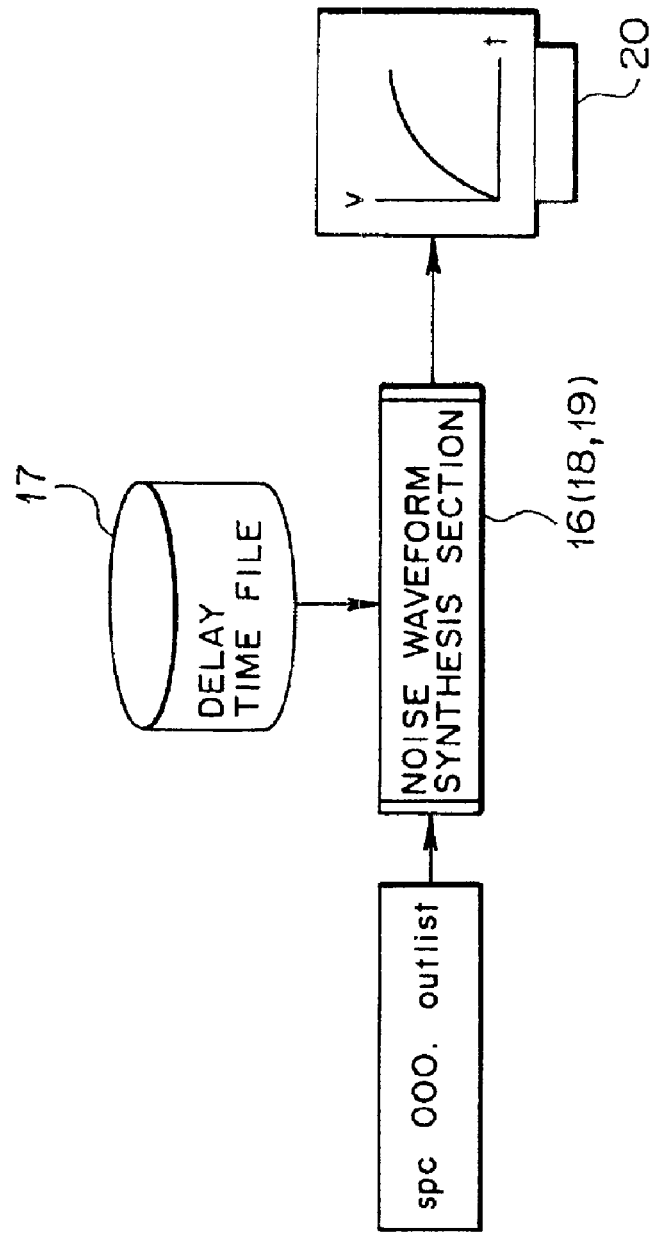
FIG. 9 is a diagrammatic view showing an image of a noise synthesis process in the first embodiment.

(1-3) The transmission line waveform (signal waveform) and the noise waveforms obtained by the circuit simulator 15 are synthesized by the noise waveform synthesis section 16. In this instance, the noise waveform synthesis section 16 refers to the delay time file 17 and synthesizes the noise waveforms taking arrival delay times of the individual noises into consideration. In particular, a noise composite waveform is obtained from a simulation result (file name: spc000.outlist) obtained from the circuit simulator 15 as seen from FIG. 9.

In the following, a noise synthesis process by the noise waveform synthesis section 16 is described with reference to ① to ④ of FIG. 10B using a net shown in FIG. 10A as an example.

Referring to FIG. 10A, a net A is a net (Ded net: noticed net) which is influenced by noise, and a net B is a net (Ding net) which provides noise to the net A. One end of the net A is connected to a driver DR, and the other end of the net A is connected to a receiver RV. One end of the net B which has a portion disposed in parallel to the net A is connected to a circuit element L which includes a flip-flop FF.

Here, the delay time from the driver DR to the receiver RV is represented by d1, the delay time from the flip-flop FF of the circuit element L to an A point (start point of the net B) by d2, and the delay time from the A point to an input terminal of the receiver RV (end point of the net A) through the net B and the net A. It is to be noted that the delay times d1 to d3 are stored in advance in the delay time file 17 as described hereinabove.

It is assumed that a transmission line waveform (signal waveform) indicated in ⓪ of FIG. 10B is obtained as an UP waveform (rising waveform) at the input terminal of the receiver RV when the output of the driver DR rises as a result of a circuit simulation regarding the net A described above in which waveform rounding, reflection noise and so forth are taken into consideration. It is to be noted that the time point 0 of FIG. 10B is a point of time when the output of the driver DR is turned on.

Also it is assumed that a noise waveform a shown in ② of FIG. 10B is obtained as crosstalk noise from the net B to the net A. Further, a noise waveform b shown in ③ of FIG. 10B is obtained as simultaneous switching noise (in the figure, represented as simultaneous SW noise) by the driver DR. Here, the simultaneous switching noise is noise which is generated by a fluctuation of the power supply side or the ground side when a plurality of switches are put into an on-state simultaneously. It is to be noted that, in the noise waveform b in ③ of FIG. 10B, a waveform which is convex to the upper side shows a noise waveform by a power supply side fluctuation, and another waveform which is convex to the lower side shows a noise waveform by a fluctuation of the ground side.

When a transmission line waveform (signal waveform) and noise waveforms of the noticed net A are supplied to the noise waveform synthesis section 16, the noise waveform synthesis section 16 first reads out the delay time d3 from the A point of the net B to the input terminal of the receiver RV of the net A from the delay time file 17, displaces the crosstalk noise waveform by the time d3 as shown in ② of FIG. 10B with reference to the time point 0, reads out the delay time d2 from the flip-flop FF of the circuit element L to the A point, and then displaces the crosstalk noise waveform further by the time d2 as shown in ② of FIG. 10B. Accordingly, the crosstalk noise waveform with the noise generation timing taken into consideration assumes the position indicated by a solid line in ② of FIG. 10B.

Then, the noise waveform synthesis section 16 reads out the delay time d1 from the driver DR to the receiver RV from the delay time file 17 and displaces the simultaneous switching noise waveform by the time d1 as shown in ③ of FIG. 10B.

After the crosstalk noise and the simultaneous switching noise with the delay times taken into consideration are determined in such a manner as described above, the noise waveform synthesis section 16 synthesizes the noise waveforms and the transmission line waveform (signal waveform) shown in ① of FIG. 10B to obtain a noise composite waveform shown in ④ of FIG. 10B.

(1-4) The noise checking section 18 performs noise checks such as an overdelay check and a racing check for the noise composite waveform obtained by the noise waveform synthesis section 16 in such a manner as described above.

Figure 11:
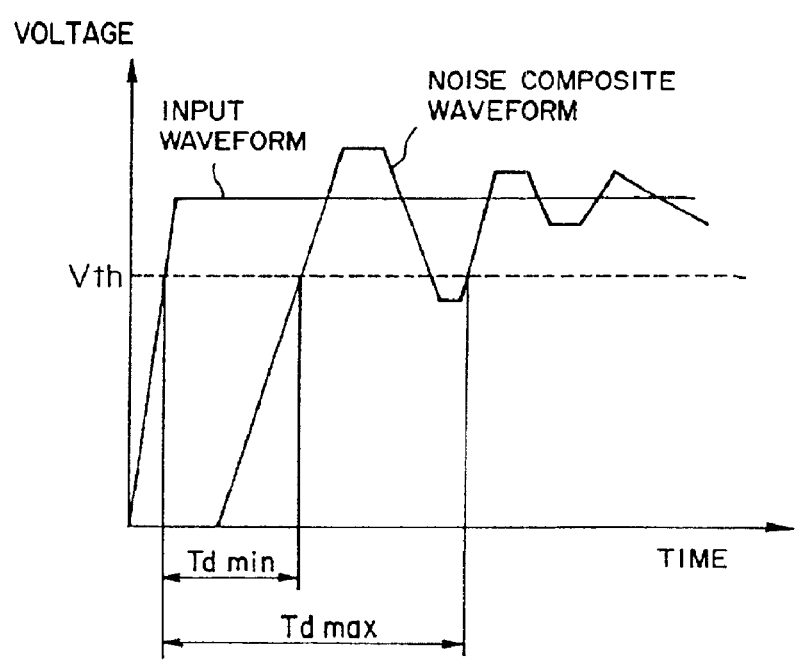
FIG. 11 is a diagram illustrating a calculation scheme for a maximum delay time and a minimum delay time from a noise composite waveform in the first embodiment.

(1-4-1) If, for example, such a noise composite waveform as shown in FIG. 11 is calculated, then the noise checking section 18 extracts a maximum delay time Tdmax and a minimum delay time Tdmin of the noticed net from the noise composite waveform. Here, Vth denotes a predetermined threshold voltage, and an interval of time from a point of time at which the input waveform reaches the threshold voltage Vth to another point of time at which the noise composite waveform exceeds the threshold voltage Vth for the first time is calculated as the minimum delay time Tdmin whereas another interval of time from the point of time at which the input waveform reaches the threshold voltage Vth to a further point of time at which the noise composite waveform exceeds the threshold voltage Vth for the second time is calculated as the maximum delay time Tdmax.

Then, the noise checking section 18 performs an overdelay/racing checks of the noticed net using the maximum delay time Tdmax and the minimum delay time Tdmin of the noticed net calculated in such a manner as just described. In a circuit, for example, shown in FIG. 12, a maximum integrated delay time TLSI1max and a minimum integrated delay time TLSI1min from all flip-flops connected to a start point x of a noticed net (wiring line between the start point x and an end point y) of an LSI 1 side which is a driver of the noticed net to the start point x are calculated. Then, the maximum delay time Tdmax extracted as above is added to the maximum integrated delay time TLSI1max and the minimum delay time Tdmin is added to the minimum integrated delay time TLSI1min.

On another LSI 2 side, a maximum integrated delay time TLSI2max and a minimum integrated delay time TLSI2 min from the end point y of the noticed net to all flip-flops to which a signal from the end point y comes are calculated, and TLSI2max is further added to TLSI1max+Tdmax whereas TLSI2 min is further added to TLSI1min+Tdmin.

Figure 12:
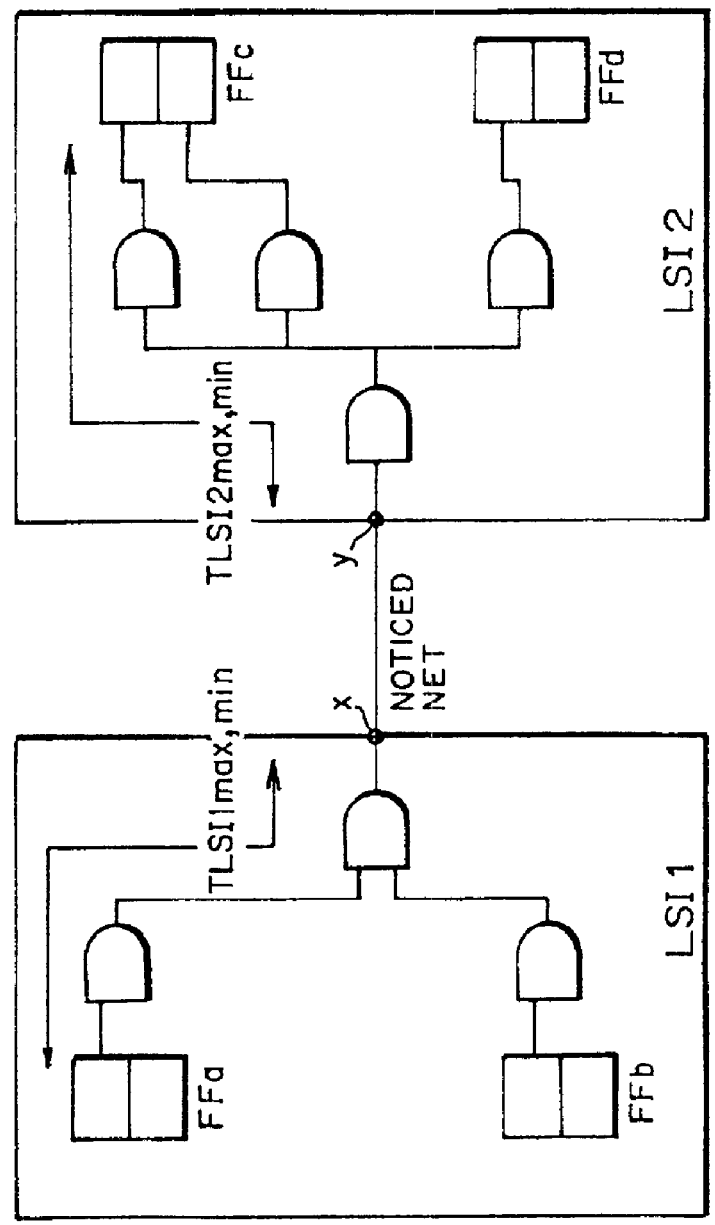
FIG. 12 is a diagrammatic view showing an example of a circuit which becomes an object of an overdelay/racing checks in the first embodiment.

For example, in FIG. 12, the maximum integrated delay time TLSI1max and the minimum integrated delay time TLSI1min from a flip-flop FFa (FFb) to the start point x of the noticed net are calculated, and the delay times Tdmax and Tdmin of the noticed net are added to them, respectively. Further, the maximum integrated delay time TSLI2max and the minimum integrated delay time TLSI2 min from the end point y to a flip-flop FFc (FFd) to which a signal arrives from the end point y are calculated and added, respectively.

Then, the noise checking section 18 performs an overdelay check by detecting whether or not the maximum integrated delay time (TLSI1max+Tdmax+TLSI2max) determined for each reached flip-flop satisfies the following expression (1). Further, the noise checking section 18 performs a racing check by detecting whether or not the minimum integrated delay time (TLSI1min+Tdmin+TLSI2 min) determined for each reached flip-flop satisfies the following expression (2).

$$TLSI1max + Tdmax + TLSI2max \leq \tau \quad (1)$$

$$TLSI1min + Tdmin + TLSI2min > 0 \quad (2)$$

Meanwhile, as regards a clock signal, the circuit simulator 15 calculates waveform rounding, reflection noise, crosstalk noise and so forth of a transmission line of a net in which the clock signal (clock waveform) propagates and the noise waveform synthesis section 16 generates a noise composite waveform in a similar manner as described above, and then the noise checking section 18 extracts various values necessary for a check from the noise composite waveform and substitutes the values into an expression hereinafter given to perform a check as hereinafter described.

Figure 13:
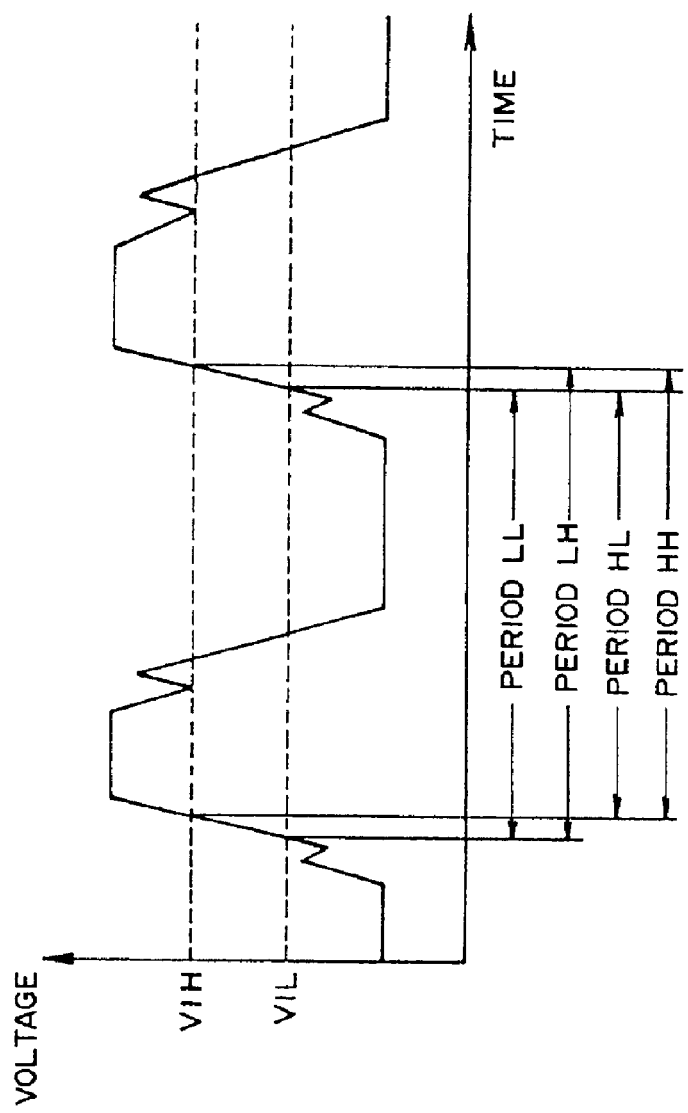
FIG. 13 is a diagram illustrating a pulse period check of a clock waveform in the first embodiment.

(1-4-2) Upon pulse period checking of a clock waveform, the noise checking section 18 extracts such periods LL, LH, HL and HH as shown in FIG. 13 from a noise composite waveform. In particular, the noise checking section 18 extracts four kinds of pulse periods LL, LH, HL and HH of a noise composite waveform of an object of the check from crossing points of the noise composite waveform and a high level discrimination threshold value (voltage value) VIH/low level discrimination threshold value (voltage level) VIL of the signal waveform.

The period LL is an interval of time from a point of time at which the noise composite waveform rises and reaches the voltage value VIL to another point of time at which the noise composite waveform rises next and reaches the voltage value VIL. Similarly, the period LH is an interval of time from a point of time at which the noise composite waveform rises and reaches the voltage value VIL to another point of time at which the noise composite waveform rises next and reaches the voltage value VIH. The period HL is an interval of time from a point of time at which the noise composite waveform rises and reaches the voltage value VIH to another point of time at which the noise composite waveform rises next and reaches the voltage value VIL. The period HH is an interval of time from a point of time at which the noise composite waveform rises and reaches the voltage value VIH to another point of time at which the noise composite waveform rises next and reaches the voltage value VIH.

The noise checking section 18 performs a pulse period check of the clock waveform in the noticed net in accordance with the following expression (3) using the periods LL, LH, HL and HH.

$$|periodmax - periodmin| \leq tolerance \quad (3)$$

where periodmax is the highest value among the periods LL, LH, HL and HH, and periodmin is the lowest value among the periods LL, LH, HL and HH.

Figure 14:
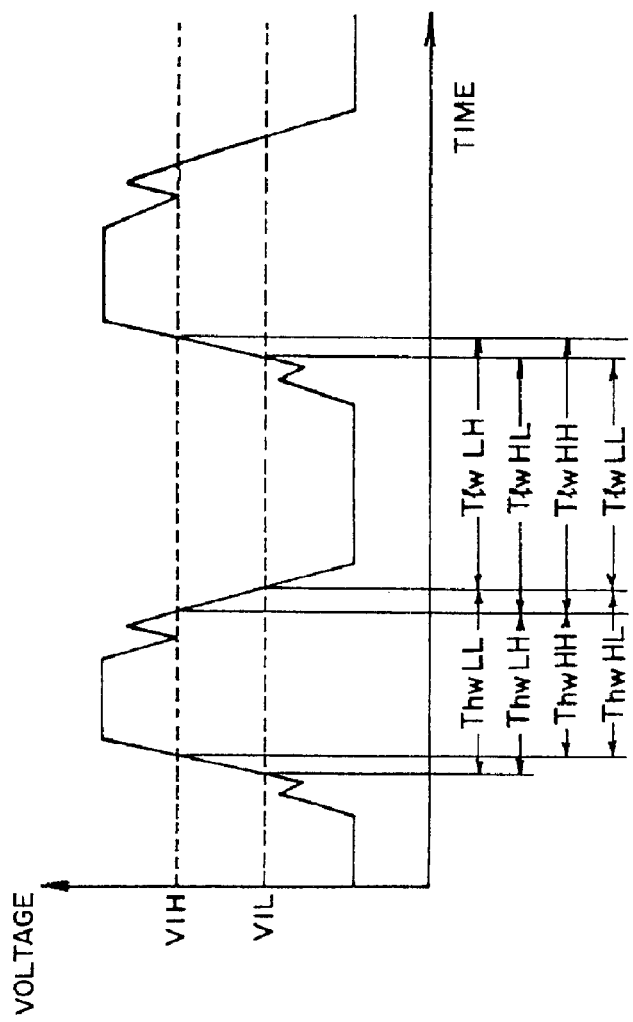
FIG. 14 is a diagram illustrating a pulse width check of a clock waveform in the first embodiment.

(1-4-3) Upon a pulse width check of a clock waveform, the noise checking section 18 extracts such values (time intervals) ThwLL, ThwLH, ThwHL, THwHH, TlwLL, TlwLH, TlwHL and TlwHH as shown in FIG. 14 from the noise composite waveform. More particularly, the noise checking section 18 extracts four kinds of rising widths (time intervals within which the waveform exhibits a high level) ThwLL, ThwLH, ThwHL and ThwHH and four kinds of falling widths (time intervals within which the waveform exhibits a low level) TlwLL, TlwLH, TlwHL and TlwHH of a noise composite waveform of an object of a check from crossing points between the noise composite waveform and the high level discrimination threshold value (voltage value) VIH/low level discrimination threshold value (voltage value) VIL of the signal waveform.

The value ThwLL is an interval of time from a point of time at which the noise composite waveform rises and reaches the voltage value VIL to another point of time at which the noise composite waveform thereafter rises and reaches the voltage value VIL. The value ThwLH is an interval of time from a point of time at which the noise composite waveform rises and reaches the voltage value VIL to another point of time at which the noise composite waveform thereafter falls and reaches the voltage value VIH. The value ThwHL is an interval of time from the point of time at which the noise composite waveform rises and reaches the voltage value VIH to another point of time at which the noise composite waveform thereafter falls and reaches the voltage value VIL. The value ThwHH is an interval of time from a point of time at which the noise composite waveform rises and reaches the voltage value VIH to another point of time at which the noise composite waveform thereafter falls and reached the voltage value VIH.

Similarly, the value TlwLL is an interval of time from a point of time at which the noise composite waveform falls and reaches the voltage value VIL to another point of time at which the noise composite waveform thereafter rises and reaches the voltage value VIL. The value TlwLH is an interval of time from a point of time at which the noise composite waveform falls and reaches the voltage value VIL to another point of time at which the noise composite waveform thereafter rises and reaches the voltage value VIH. The value TlwHL is an interval of time from the point of time at which the noise composite waveform falls and reaches the voltage value VIL to another point of time at which the noise composite waveform thereafter rises and reaches the voltage value VIL. The value TlwHH is an interval of time from a point of time at which the noise composite waveform falls and reaches the voltage value VIH to another point of time at which the noise composite waveform thereafter rises and reaches the voltage value VIH.

The noise checking section 18 performs a pulse width check of the clock waveform in the noticed net in accordance with the following expressions (4) to (11) using the values ThwLL, ThwLH, ThwHL, ThwHH, TlwLL, TlwLH, TlwHL and TlwHH.

$$\text{ThwLL} \geq \text{tolerance 1} \tag{4}$$

$$\text{ThwLH} \geq \text{tolerance 2} \tag{5}$$

$$\text{ThwHL} \geq \text{tolerance 3} \tag{6}$$

$$\text{ThwHH} \geq \text{tolerance 4} \tag{7}$$

$$\text{TlwLL} \geq \text{tolerance 5} \tag{8}$$

$$\text{TlwLL} \geq \text{tolerance 6} \tag{9}$$

$$\text{TlwLL} \geq \text{tolerance 7} \tag{10}$$

$$\text{TlwLL} \geq \text{tolerance 8} \tag{11}$$

Figure 15:
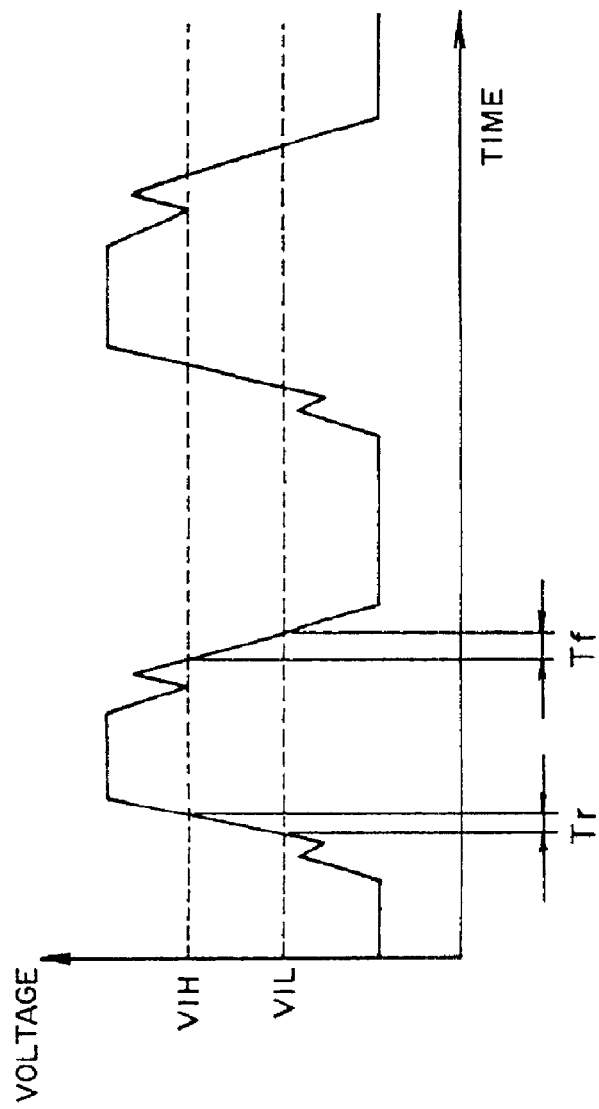
FIG. 15 is a diagram illustrating a check of a rising time/falling time of a clock waveform in the first embodiment.

(1-4-4) When the rising time/falling time of the clock waveform are checked, the noise checking section 18 extracts such values Tr and Tf as shown in FIG. 15 from the noise composite waveform. In particular, the noise checking section 18 extracts the time Tr required for rising of the noise composite waveform of an object of the check and the time Tf required for falling of the noise composite waveform from crossing points of the noise composite waveform and the high level discrimination threshold value (voltage value) VIH/low level discrimination threshold value (voltage value) VIL of the signal waveform.

The time Tr is an interval of time from a point of time at which the noise composite waveform rises and reaches the voltage threshold value VIL to another point of time at which the noise composite waveform further rises and reaches the voltage value VIH. The time Tf is an interval of time from a point of time at which the noise composite waveform falls and reaches the voltage value VIH to another point of time at which the noise composite waveform further falls and reaches the voltage value VIL.

The noise checking section 18 performs checking of the rising time/falling time of the clock waveform in the noticed net in accordance with the following expressions (12) and (13) using the values Tr and Tf.

$$\text{Tr} \leq \text{tolerance 9} \tag{12}$$

$$\text{Tf} \leq \text{tolerance 10} \tag{13}$$

(1-5) Meanwhile, in the noise checking apparatus of the present embodiment, the noise composite waveform analysis section 19 performs a noise margin analysis, a delay/racing analyses and so forth of the noise composite waveform and outputs a result of the analyses as an analysis list. The noise composite waveform analysis section 19 analyzes an influence on noise waveforms when changing a circuit parameter such as, for example, a distance between nets, a damping resistance or the like to solve problems by noise.

The checking result by the noise checking section 18 and the noise analysis result by the noise composite waveform analysis section 19 described above are displayed on the display unit 20 by a display controlling function of the noise composite waveform analysis section 19. Consequently, the designer can refer to the display unit 20 to confirm the noise check result and the noise analysis result of the designated noticed net.

In this manner, in the first embodiment of the present invention, since a noise composite waveform is determined with a delay time taken into consideration to perform noise checking, it is possible to systematically check/analyze various kinds of noise based on a signal waveform proximate to an actual signal waveform with generation timings of the various kinds of noise taken into consideration. Consequently, the accuracy in noise calculation is augmented significantly and also the accuracy in noise checking is augmented significantly and the time required for noise checking can be reduced significantly. Besides, the burden to the designer in noise analysis can be reduced to augment the working efficiency significantly.

[1-A] Description of the First Modification to the First Embodiment

Figure 16:
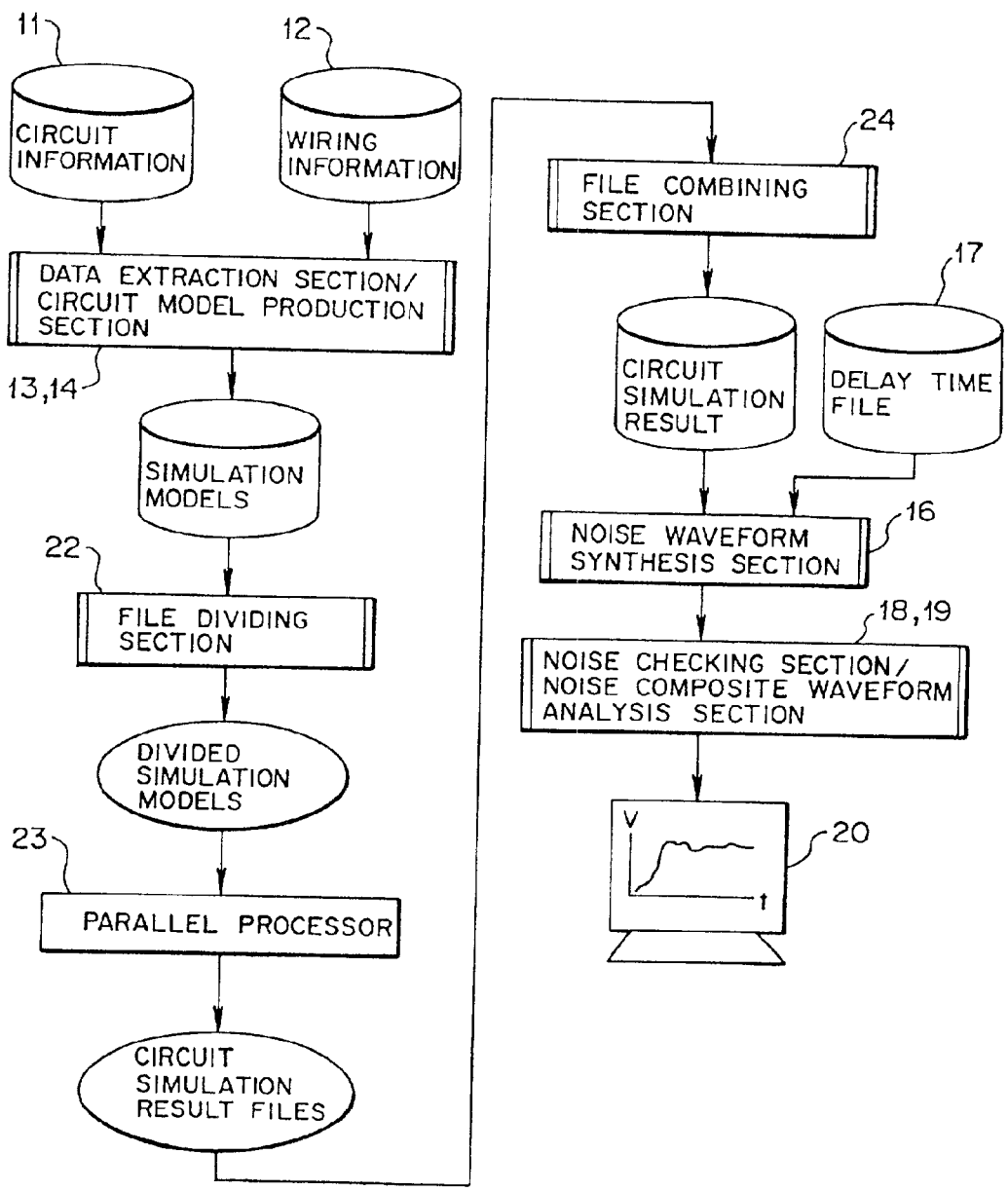
FIG. 16 is a block diagram showing a functional configuration of a noise checking apparatus as a first modification to the first embodiment of the present invention.

FIG. 16 is a block diagram showing a functional configuration of a noise checking apparatus of a first modification to the first embodiment of the present invention. The first modification is an example wherein a circuit simulation is performed making use of a parallel processor. It is to be noted that, in FIG. 16, like reference characters to those described hereinabove denote like or substantially like elements, and therefore, description of them is omitted herein.

As shown in FIG. 16, the noise checking apparatus of the first modification is configured similarly to the noise checking apparatus shown in FIG. 2 except that the circuit simulator 15 shown in FIG. 2 is replaced by a file dividing section 22, a parallel processor 23 and a file combining section 24.

The file dividing section 22 divides a simulation model file (refer to, for example, FIG. 17A) produced by the circuit model production section 14 into a plurality of files (for example, such four files as shown in FIG. 17B).

Figure 18:
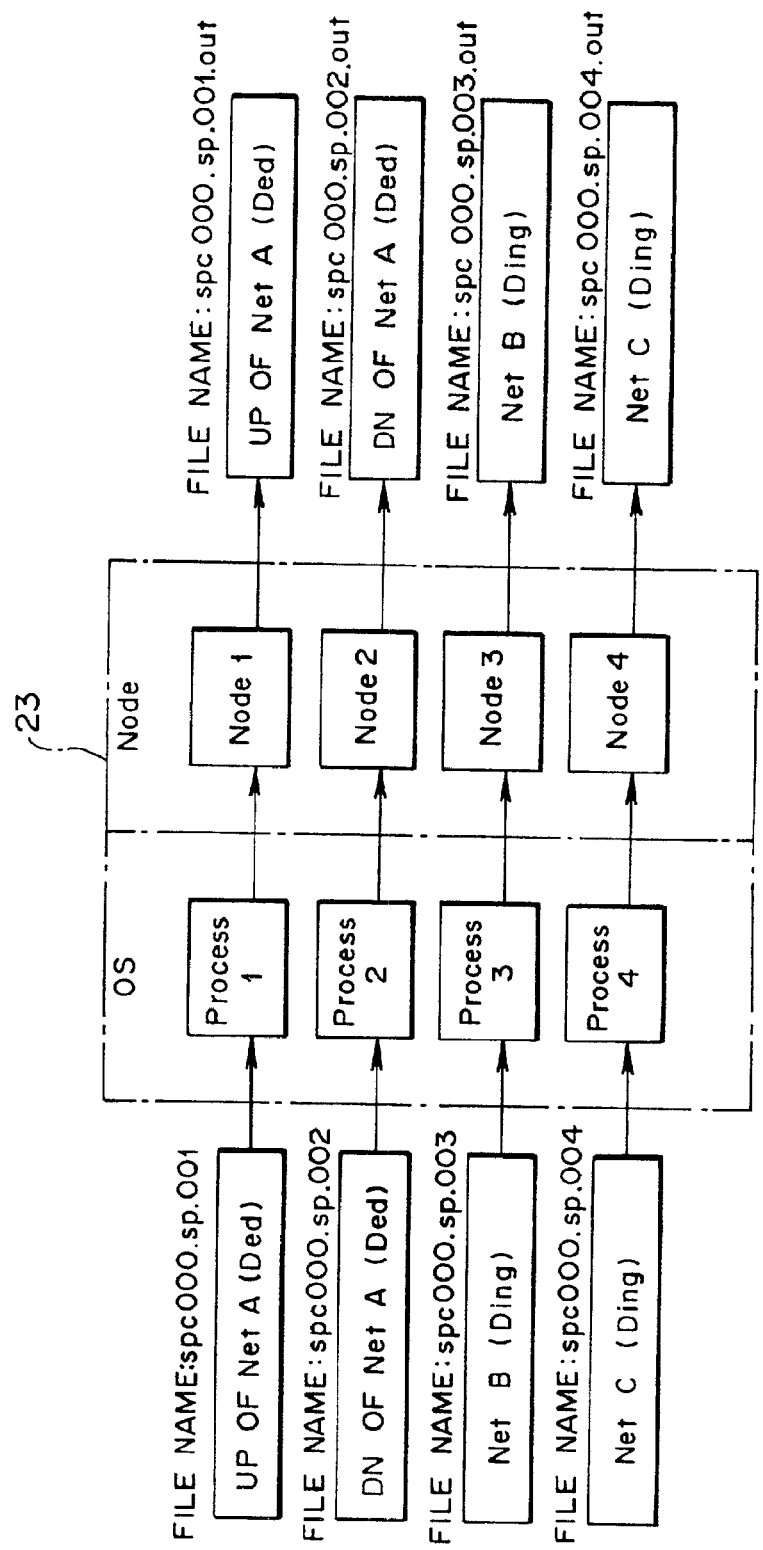
FIG. 18 is a diagrammatic view illustrating a circuit simulation in the first modification to the first embodiment.

The parallel processor 23 has, for example, as shown in FIG. 18, a plurality of processing sections (CPUS, nodes). Circuit simulations with regard to the plurality of files obtained by the division of the file dividing section 22 are executed parallelly by the plurality of processing sections, and results of the circuit simulations are outputted as a plurality of files (refer to, for example, FIG. 18).

Figure 19:
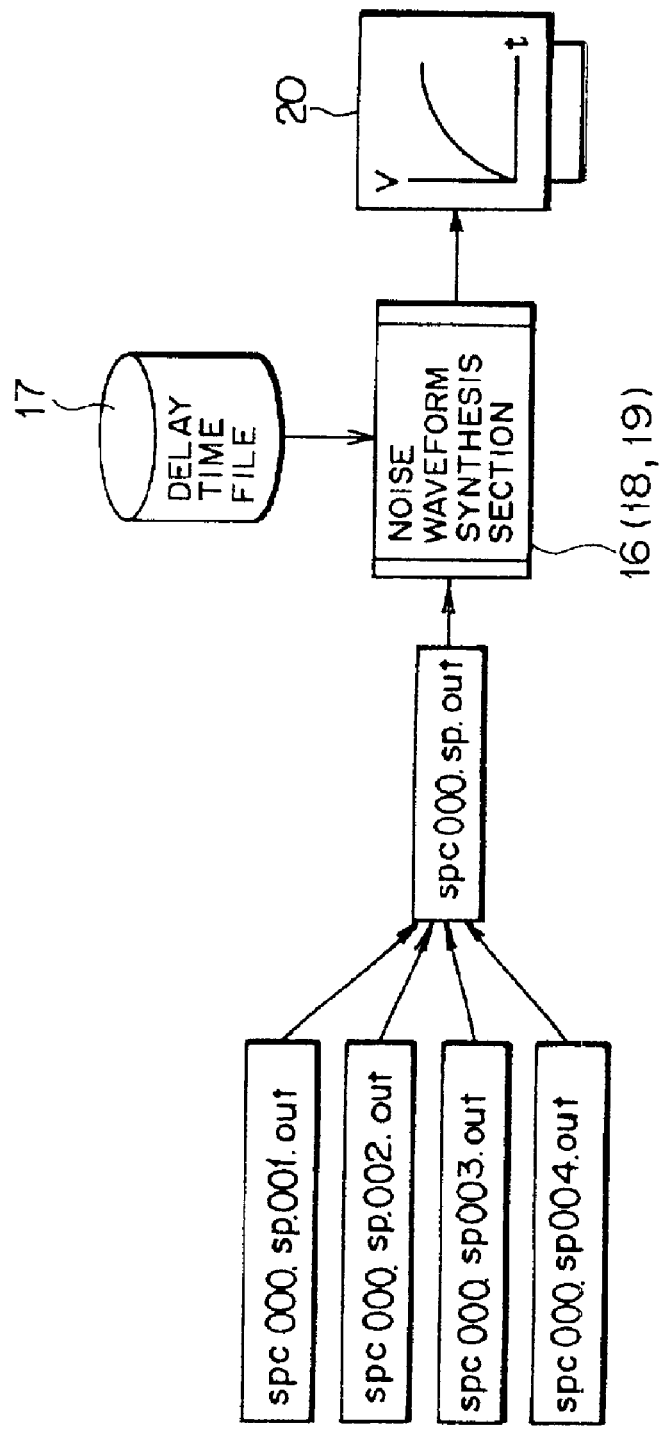
FIG. 19 is a diagrammatic view showing an image of a merging process and a noise synthesis process of a simulation result in the first modification to the first embodiment.

The file combining section 24 combines the plurality of simulation result files outputted from the parallel processor 23 to produce a single circuit simulation result file, for example, as shown in FIG. 19 and hands over the single circuit simulation result file to the noise waveform synthesis section 16.

The noise checking apparatus of the first modification to the first embodiment having such a configuration as described above performs noise checks in the following manner.

(1-A-1) Similarly as in the first embodiment, the data extraction section 13 extracts the circuit information and the wiring information from the circuit net list database 11 and the mounting database 12, and the circuit model production section 14 produces a circuit simulation model.

At this time, where an object net is composed of, for example, a net A (Ded net) and another net B and a further net C (Ding nets) as shown in FIG. 3A, a circuit simulation model is composed of four simulation models shown in FIG. 3B similarly as in the first embodiment.

(1-A-2) The file dividing section 22 divides the simulation model produced by the circuit model production section 14 in accordance with the number of nodes of the parallel processor 23 used for the simulation.

For example, where a file (file name spc000.p) of a circuit simulation model is composed of UP/DN of the net A, the net B and the net C as shown in FIG. 17A and the number of nodes of the parallel processor 23 is 4 as shown in FIG. 18, the file dividing section 22 divides the file spc000.sp into a file spc000.sp001 (UP of the net A), another file spc000.sp002 (DN of the net A), a further file spc000.sp003 (the net B) and a still further file spc000.sp004 (the net C) as shown in FIG. 17B.

(1-A-3) Simulations of the four circuit simulation models obtained by the division of the file dividing section 22 are executed parallelly by the four nodes (processing sections) of the parallel processor 23 to determine transmission line waveforms (signal waveforms) including waveform rounding and reflection noise and various noise waveforms of crosstalk noise, simultaneous switching noise and so forth.

In particular, as shown in FIG. 18, the four files obtained by the division are handed over to the parallel processor 23, and the nodes of the parallel processor 23 individually start up a circuit simulator to perform simulations thereby to obtain four simulation result files (file names spc000.sp001.out to spc000.sp004.out).

(1-A-4) The file combining section 24 combines the four simulation result files from the parallel processor 23 into a single file to obtain a circuit simulation result, and the noise waveform synthesis section 16 produces a noise composite waveform from the circuit simulation result.

In particular, the four simulation result files (file names spc000.sp001.out to spc000.sp004.out) are merged to obtain a single simulation result file spc000.sp.out as shown in FIG. 19. Then, the noise waveform synthesis section 16 refers to the delay time file 17 to synthesize the noise waveforms obtained as the simulation result similarly as in the first embodiment.

(1-A-5) Though not described in detail below, also in the first modification, the noise checking section 18 performs noise checks such as an overdelay check and a racing check of the noise composite waveform obtained by the noise waveform synthesis section 16, and the noise waveform analysis section 19 performs a noise analysis of the noise composite waveform and a noise check result and a noise analysis result are displayed on the display unit 20 in a similar manner as in the first embodiment.

In this manner, in the first modification to the first embodiment, since a circuit simulation model file is divided and simulations are performed parallelly by the plurality of processing sections of the parallel processor 23, the processing time can be reduced significantly.

[1-B] Description of the Second Modification to the Present Embodiment

Figure 20:
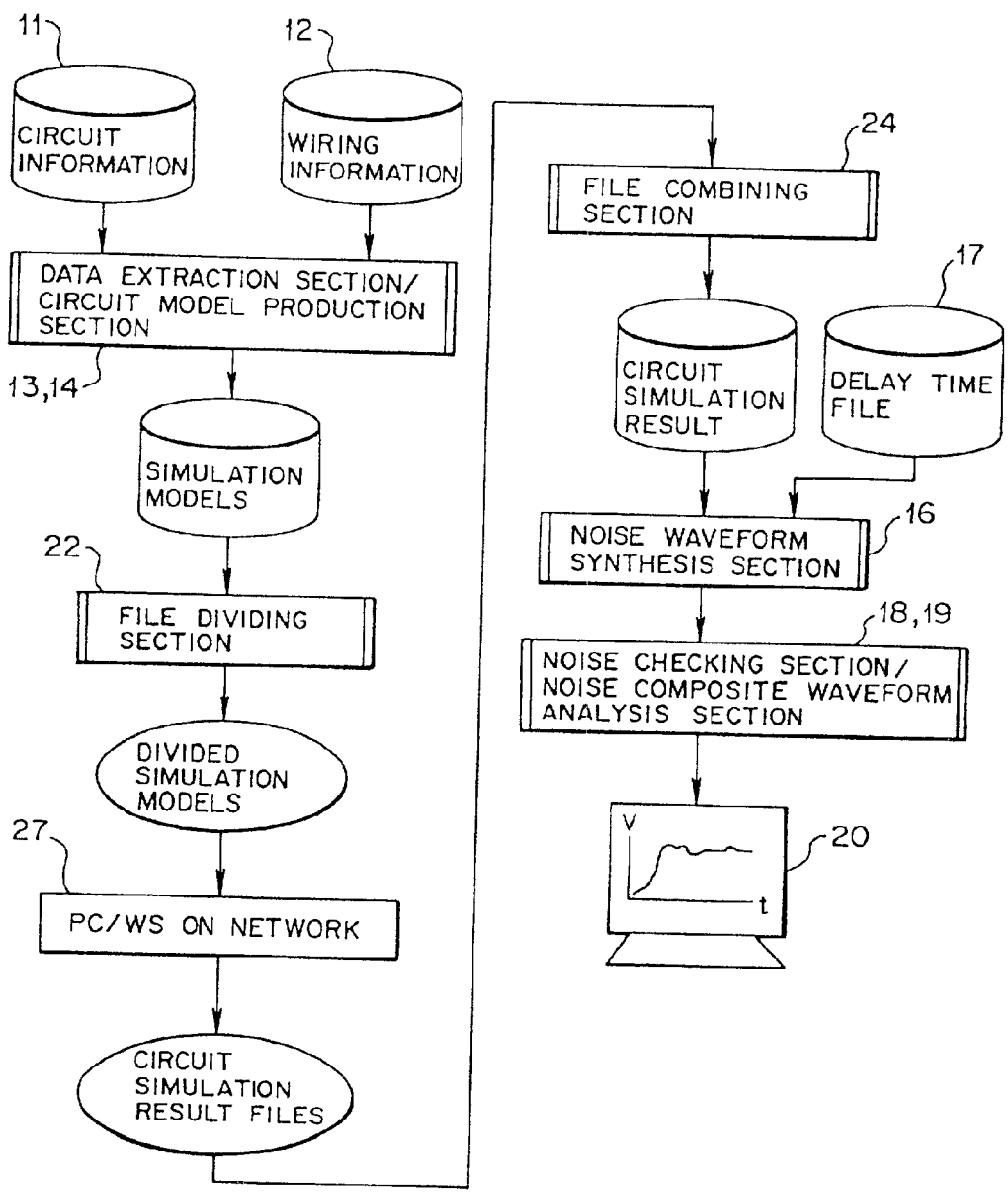
FIG. 20 is a block diagram showing a functional configuration of a noise checking apparatus as a second modification to the first embodiment of the present invention.

FIG. 20 is a block diagram showing a functional configuration of a noise checking apparatus as a second modification to the first embodiment of the present invention. The second modification is an example wherein a circuit simulation is performed making use of a PC (personal computer) or a WS (work station) connected to a network. It is to be noted that, in FIG. 20, like reference characters to those described hereinabove denote like or substantially like elements, and therefore, description of them is omitted herein.

As shown in FIG. 20, the noise checking apparatus of the second modification is configures similarly to the noise checking apparatus shown in FIG. 2 except that the circuit simulator 15 shown in FIG. 2 is replaced by a file dividing section 22, a plurality of PCs/WSs 27 on a network 25 (refer to FIG. 22), and a file combining section 24.

The file dividing section 22 divides a simulation model file (refer to, for example, FIG. 21A) produced by the circuit model production section 14 into a plurality of files (for example, into two such files as shown in FIG. 21B) similarly as in the first modification.

Figure 22:
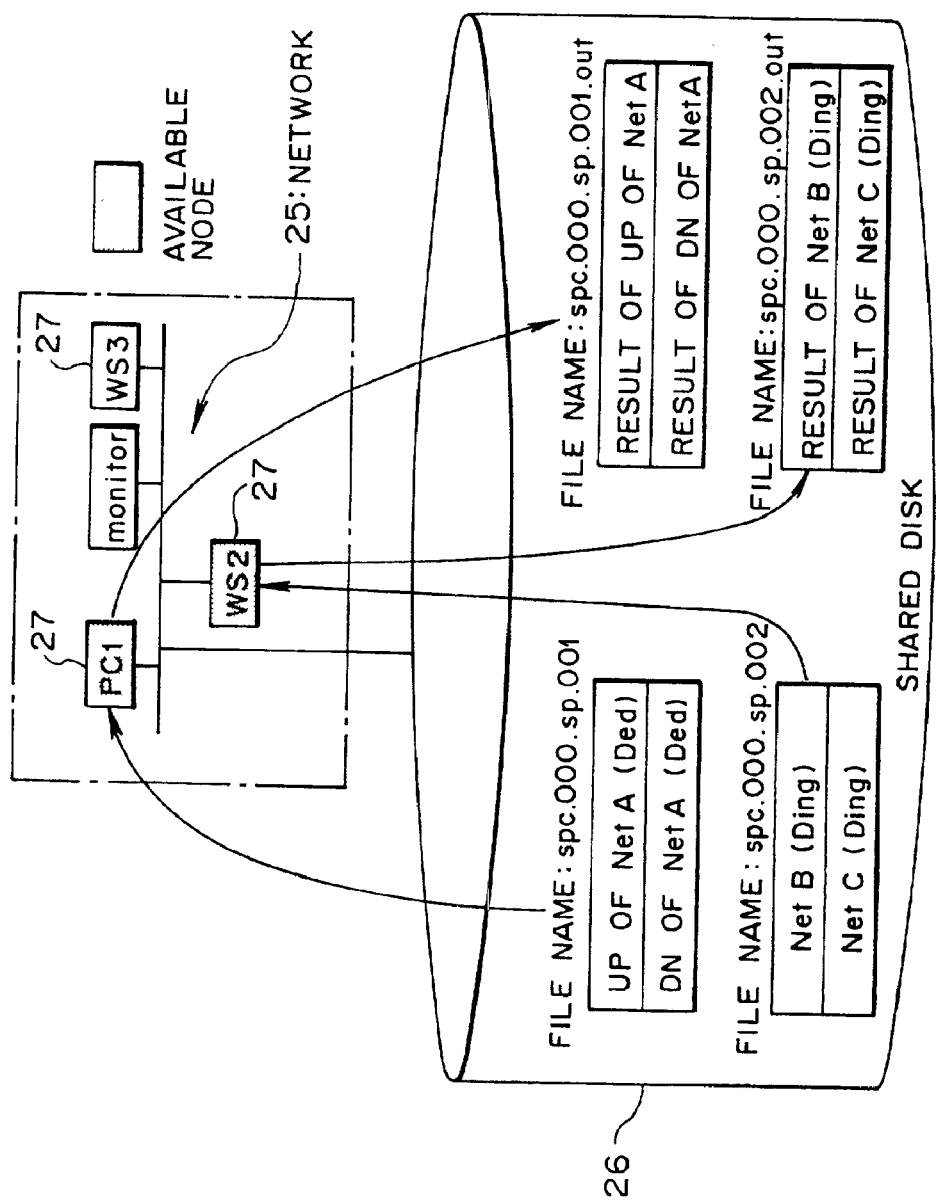
FIG. 22 is a diagrammatic view illustrating a circuit simulation in the second modification to the first embodiment.

Each of the PCs/WSs 27 has a CPU and functions as a processing section (node), and a plurality of such PCs/WSs 27 are provided, for example, as shown in FIG. 22 on the network 25. The PCs/WSs 27 parallelly execute circuit simulations of a plurality of files obtained by division of the file dividing section 22 and output circuit simulation results as files (refer to, for example, FIG. 22).

Figure 23:
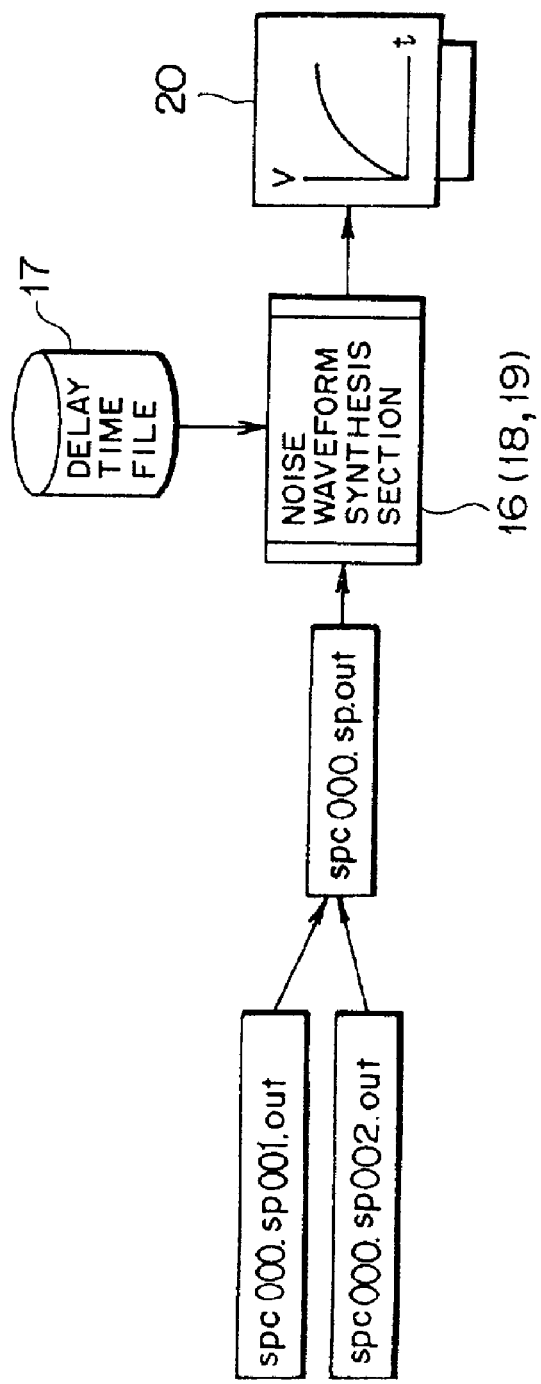
FIG. 23 is a diagrammatic view showing an image of a merging process and a noise synthesis process of a simulation result in the second modification of the first embodiment.

The file combining section 24 combines a plurality of simulation result files outputted from the PCs/WSs 27 on the network 25 to produce a single circuit simulation result file and hands over the circuit simulation result file to the noise waveform synthesis section 16, similarly as in the first modification, for example, as shown in FIG. 23.

The noise checking apparatus of the second modification to the first embodiment having such a configuration as described above performs noise checks in the following manner.

(1-B-1) Similarly as in the first embodiment, the data extraction section 13 extracts circuit information and wiring line information from the circuit net list database 11 and the mounting database 12, and the circuit model production section 14 produces a circuit simulation model.

At this time, where an object net includes, for example, a net A (Ded net) and a net B and a net C (Ding nets) as shown in FIG. 3A, the circuit simulation model includes four simulation modes as shown in FIG. 3B similarly as in the first embodiment.

(1-B-2) The number (number of nodes/number of CPUs) of available ones of the PCs/WSs 27 on the network 25 is acquired, and the simulation model produced by the circuit model production section 14 is divided in response to the number by the file dividing section 22.

For example, if the file (file name spc000.p) of the circuit simulation model includes UP/DN of the net A, the net B and the net C as shown in FIG. 21A and the number (number of nodes) of available ones of the PCs/WSs 27 on the network 25 is 2, the file dividing section 22 divides the file spc000.sp into two files of a file spc000.sp001 (UP and DN of the net A) and another file spc000.sp002 (the net B and the net C) as shown in FIG. 21B.

(1-B-3) The PCs/WSs 27 on the network 25 parallelly execute simulations of the two circuit simulation models obtained by division of the file dividing section 22 and determine various noise waveforms of crosstalk noise, simultaneous switching noise and so forth together with transmission line waveforms (signal waveforms) including waveform rounding and reflection noise.

In particular, as shown in FIG. 22, the two files obtained by division are transmitted from a shared file 26 over the network 25 to the two PCs/WSs 27 (PC1 and WS2), and a circuit simulator is started up in the nodes (PC1 and WS2) to perform a simulation. Consequently, two simulation result files (file name spc000.sp001.out and spc000.sp002.out) are obtained. The simulation result files are transmitted from the nodes (PC1 and WS2) back to the shared file 26 over the network 25.

(1-B-4) The file combining section 24 combines the two simulation result files from the PCs/WSs 27 on the network 25 into one file to obtain a circuit simulation result, and the noise waveform synthesis section 16 produces a noise composite waveform from the circuit simulation result.

In particular, as shown in FIG. 23, the two simulation result files (file name spc000.sp001.out and spc000.sp002.out) are merged to obtain a single simulation result file spc000.sp.out. Then, the noise waveform synthesis section 16 refers to the delay time file 17 to synthesize the noise waveforms obtained as the simulation results similarly as in the first embodiment.

(1-B-5) Although detailed described is not given below, also in the second modification, the noise checking section 18 performs noise checks such as an overdelay check and a racing check for the noise composite waveform obtained by the noise waveform synthesis section 16 and the noise composite waveform analysis section 19 performs a noise analysis of the noise composite waveform, and a noise check result and a noise analysis result are displayed on the display unit 20 in a similar manner as in the first embodiment.

In this manner, in the second modification to the first embodiment, since a circuit simulation model file is divided and a plurality of PCs/WSs on the network 25 are used as processing sections to perform simulations parallelly, the processing time can be reduced significantly.

(1-C) Description of the Third Modification to the First Embodiment

By the way, in the noise check/noise analysis described above, it sometimes is necessary to change a wiring position to solve a problem by noise depending upon an arrangement or wiring position of, for example, an a coupled net.

In such an instance, the designer can solve such a problem as just described readily if it can be confirmed immediately on a display screen to which position the wiring line (net) must be moved to solve the problem.

Figure 24:
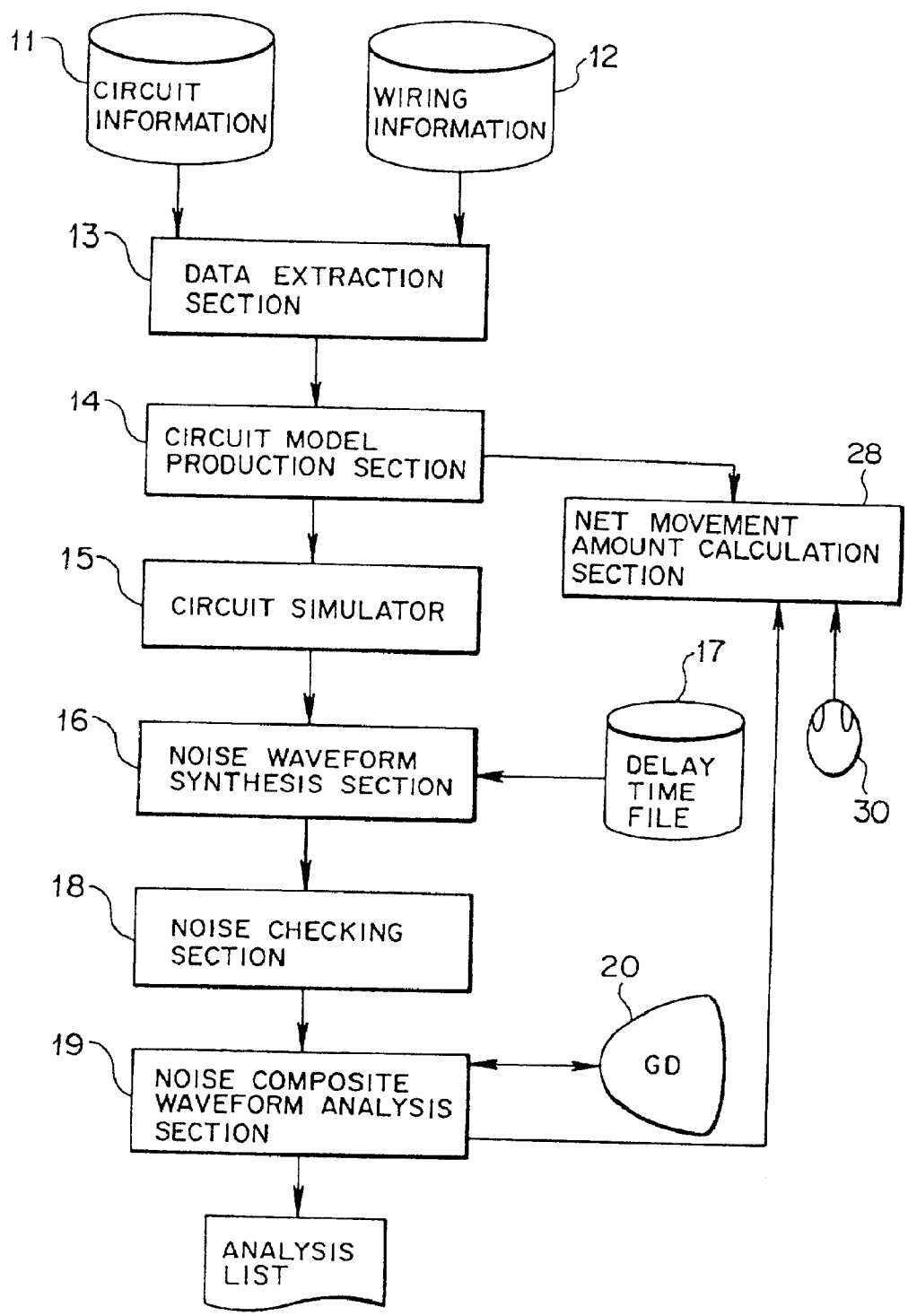
FIG. 24 is a block diagram showing a functional configuration of a noise checking apparatus as a third modification to the first embodiment of the present invention.

FIG. 24 is a block diagram showing a functional configuration of a noise checking apparatus as a third modification to the first embodiment of the present invention. The third modification makes it possible to dynamically display in what manner a noise composite waveform varies when a wiring line is moved on the display screen using a pointing device such as a mouse so that the problem described above can be analyzed readily. It is to be noted that, in FIG. 24, like reference characters to those described hereinabove denote like or substantially like elements, and therefore, description of the same is omitted.

As shown in FIG. 24, the noise checking apparatus of the third modification includes a net movement amount calculation section 28 and a pointing device 30 added to the noise checking apparatus shown in FIG. 2.

However, the noise composite waveform analysis section 19 in the third modification has a display controlling function of causing, when a noise net (questionable wiring line) which has a bad influence on a noticed net is found by a noise analysis, a wiring pattern including the noticed net and the noise net to be displayed as an analysis result on the screen of the display unit 20.

The pointing device 30 is, for example, a mouse or the like which is operated by an operator as inputting means for a personal computer. The designer can move a noise net (questionable wiring line) displayed on the display unit 20 on the screen of the display unit 20 as seen in FIGS. 25A to 25C by operating (dragging) the pointing device 30.

The net movement amount calculation section 28 calculates an actual movement amount of the noise net corresponding to the movement amount by the pointing device 30.

The noise checking apparatus of the third modification is constructed such that the circuit model production section 14, circuit simulator 15, noise waveform synthesis section 16, noise checking section 18 and noise composite waveform analysis section 19 are rendered operative again in a state wherein the noise net is moved by the actual movement amount calculated by the net movement amount calculation section 28, and the noise composite waveform after the movement of the noise net is displayed on the display unit 20.

Now, operation of the noise checking apparatus of the third modification to the first embodiment having such a construction as described above is described with reference to FIGS. 25A to 25C and 25D to 25F. It is to be noted that FIGS. 25A to 25C are views showing examples of a display when a noise net is moved, and FIGS. 25D to 25F are views showing examples of a display of a noise composite waveform corresponding to FIGS. 25A to 25C, respectively.

(1-C-1) The data extraction section 13 extracts the circuit information and the wiring information from the circuit net list database 11 and the mounting database 12, and the circuit model production section 14 produces a circuit simulation model.

(1-C-2) The circuit simulator 15 performs a simulation with regard to the circuit simulation model to determine a transmission line waveform (signal waveform) of the noticed net including waveform rounding, reflection noise and so forth and further determine various noise waveforms of crosstalk noise, simultaneous switching noise and so forth.

(1-C-3) Similarly as in the first embodiment, the transmission line waveform (signal waveform) and the noise waveforms obtained by the circuit simulator 15 are synthesized by the noise waveform synthesis section 16 with delay times of the noises (generation timings of the noises) taken into consideration to obtain a noise composite waveform.

(1-C-4) The noise checking section 18 performs noise checks such as an overdelay check and a racing check for the noise composite waveform obtained by the noise waveform synthesis section 16.

(1-C-5) The noise composite waveform analysis section 19 performs a noise analysis of the noise composite waveform obtained in the noticed net, and a result of the analysis is displayed on the display screen of the display unit 20.

(1-C-6) If a questionable net (noise net mentioned hereinabove) is present, then the designer drags and moves the net, which has an influence on the noticed net, on the screen of the display unit 20 using the pointing device 30 such as a mouse.

On the screen of the display unit 20, such a wiring line pattern diagram (mounting design system diagram) including the noise net as shown in FIGS. 25A to 25C and such a noise waveform diagram showing a noise waveform of the noise net as shown in FIGS. 25D to 25F are displayed, for example, in two windows.

Immediately after the noise analysis, such a wiring pattern diagram as shown in FIG. 25A and such a noise waveform diagram (noise waveform of the questionable net) as shown in FIG. 25D are displayed on the screen of the display unit 20. Therefore, the designer will refer to the displays, drag the noise net Nx by means of the pointing device 30, and move the noise net Nx, for example, from a position A1 shown in FIG. 25A to another position A2 shown in FIG. 25B. It is to be noted that, when the noise net Nx is disposed at the position A1 near to the notice net N, the noise waveform diagram on the screen of the display unit 20 shows that the noise waveform peak P1 of the noise net Nx exceeds the threshold voltage Vth as seen in FIG. 25D.

(1-C-7) After the noise net Nx is moved from the position A1 to the position A2 on the screen of the display unit 20 by means of the pointing device 30, the network movement amount calculation section 28 calculates an actual movement amount of the noise net Nx on the circuit from the movement amount by the pointing device 30.

Then, the data extraction section 13 extracts wiring information of the noise net Nx having the changed position from the circuit net list database 11 and the mounting database 12 and determines wiring information after the movement of the noise net Nx based on the wiring information and the actual movement amount.

(1-C-8) The circuit model production section 14 updates the circuit simulation model produced in the preceding cycle based on the distance between the nets (the distance between the noticed net N and the noise net Nx) after the movement.

(1-C-9) The circuit simulator 15 recalculates noise waveforms only of the noise net Nx which has been re-disposed, and the noise waveform synthesis section 16 synthesizes the noise waveform information after the change calculated in the present cycle in place of the noise waveform information before the change to obtain a noise composite waveform after the movement of the noise net Nx.

(1-C-10) The noise composite waveform analysis section 19 performs an analysis of the noise composite waveform after the movement of the noise net Nx, and a noise waveform after the net movement is displayed on the screen of the display unit 20 as shown in FIG. 25E. It is to be noted that, at this time, the noise waveform diagram shown in FIG. 25E indicates that the noise waveform peak P2 of the noise net Nx still exceeds the threshold voltage Vth, and it can be seen that the noise net Nx is a net questionable to the noticed net N.

(1-C-11) When the problem is not yet solved even by the movement of the noise net Nx as described above, the designer will drag the noise net Nx by means of the pointing device 30 again and move the noise net Nx, for example, from the position A2 shown in FIG. 25B to another position A3 shown in FIG. 25C.

When the noise net Nx is moved on the screen of the display unit 20 in this manner, a noise composite waveform and noise waveforms after the movement of the noise net Nx are displayed in accordance with the procedure described hereinabove in the items (1-C-7) to (1-C-10).

The processing described in the items (1-C-7) to (1-C-11) is executed repetitively until the problem is solved.

For example, in the example shown in FIGS. 25A to 25C, when the noise net Nx is moved to the position A3 shown in FIG. 25C, the noise waveform diagram shown in FIG. 25F is displayed on the screen of the display unit 20. In the noise waveform diagram shown in FIG. 25F, it can be seen that the noise waveform peak P3 of the net Nx is lower than the threshold voltage Vth and the net Nx does not have a bad influence on the noticed net N any more. The designer will refer to the noise waveform diagram shown in FIG. 25F and recognize that the problem with regard to the notice net N has been solved.

After the position to which the net Nx is to be moved is settled in this manner, information regarding the new net position is stored into the circuit net list database 11 and the mounting database 12.

In this manner, in the third modification to the first embodiment, since a noise waveform at a position to which a parallel wiring portion is dragged and moved is displayed dynamically on the real time basis, a questionable wiring line (noise net) can be moved rapidly to a wiring position at which a problem of noise does not occur any more.

Further, since only a net which has been changed is analyzed by the circuit simulator 15, all analysis times of other relating nets can be omitted, and the analysis time can be reduced significantly.

It is to be noted that the scheme according to the third modification can be applied similarly also to the first modification or the second modification described hereinabove.

[1-D] Description of the Fourth Modification to the First Embodiment

Figure 26:
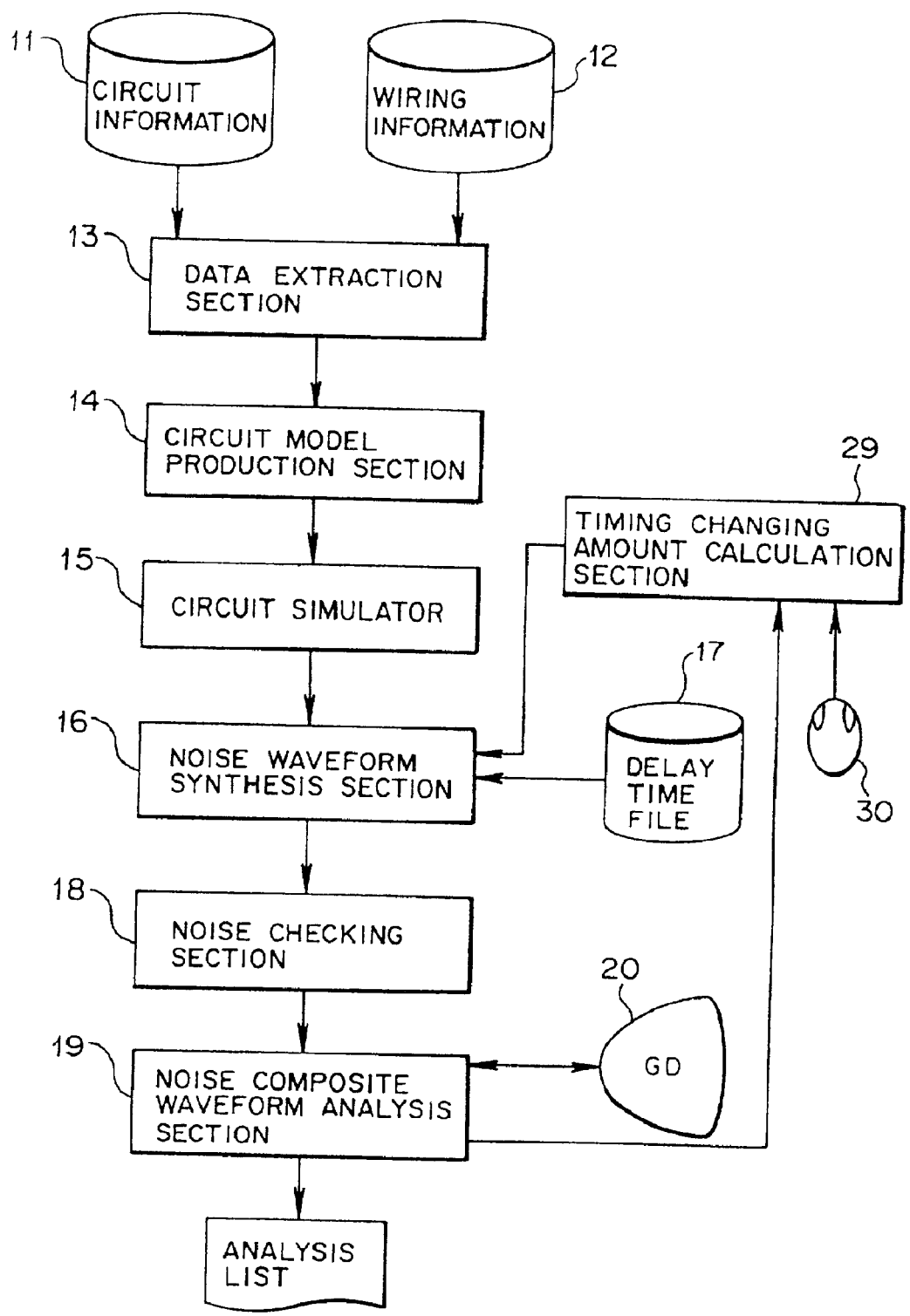
FIG. 26 is a block diagram showing a functional configuration of a noise checking apparatus as a fourth modification to the first embodiment of the present invention.

FIG. 26 is a block diagram showing a functional configuration of a noise checking apparatus as a fourth modification to the first embodiment of the present invention. The fourth modification makes it possible to dynamically display in what manner a noise composite waveform varies when a noise waveform is moved on the display screen using a pointing device such as a mouse so that a problem by noise can be analyzed readily. It is to be noted that, in FIG. 26, like reference characters to those described hereinabove denote like or substantially like elements, and therefore, description of them is omitted.

As shown in FIG. 26, the noise checking apparatus of the fourth modification includes a timing changing amount calculation section 29 and a pointing device 30 provided additionally to the noise checking apparatus shown in FIG. 2.

It is to be noted, however, that the noise composite waveform analysis section 19 in the fourth modification has a display controlling function of causing, when a noise waveform which has a bad influence on a noticed net is found by a noise analysis, a waveform diagram showing the noise waveform to be displayed as an analysis result on the screen of the display unit 20.

Figure 28:
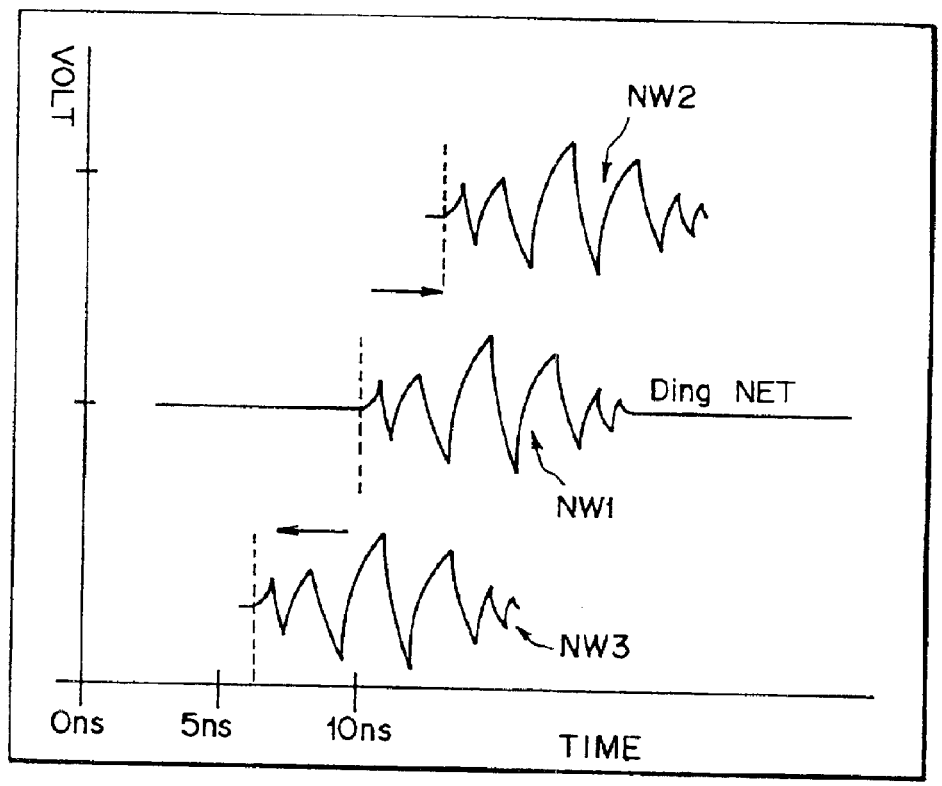
FIG. 28 is a schematic view showing an example of a display of a noise waveform upon movement in the fourth modification of the first embodiment.

The pointing device 30 is for example, a mouse or the like which is operated by an operator as inputting means of a personal computer similarly as in the third modification described above. When the designer operates (drags) the pointing device 30, a noise waveform displayed on the display unit 20 can be moved in a time axis direction on the screen of the display unit 20 as seen in FIG. 28.

The timing changing amount calculation section 29 calculates a timing changing amount of the noise waveform (a changing amount of the delay time) corresponding to the amount of movement by the pointing device 30 and dynamically varies, when re-synthesis is performed as hereinafter described by the noise waveform synthesis section 16, the generation timing of the noise waveform by the calculated timing changing amount.

Thus, the noise checking apparatus of the fourth modification is constructed such that the noise waveform synthesis section 16 performs re-synthesis of a noise waveform using a noise waveform whose generation timing has been changed by the timing changing amount and the noise checking section 18 and the noise composite waveform analysis section 19 are rendered operative again, and then a noise composite waveform after the timing change of the noise waveform is displayed on the display unit 20.

Figure 27:
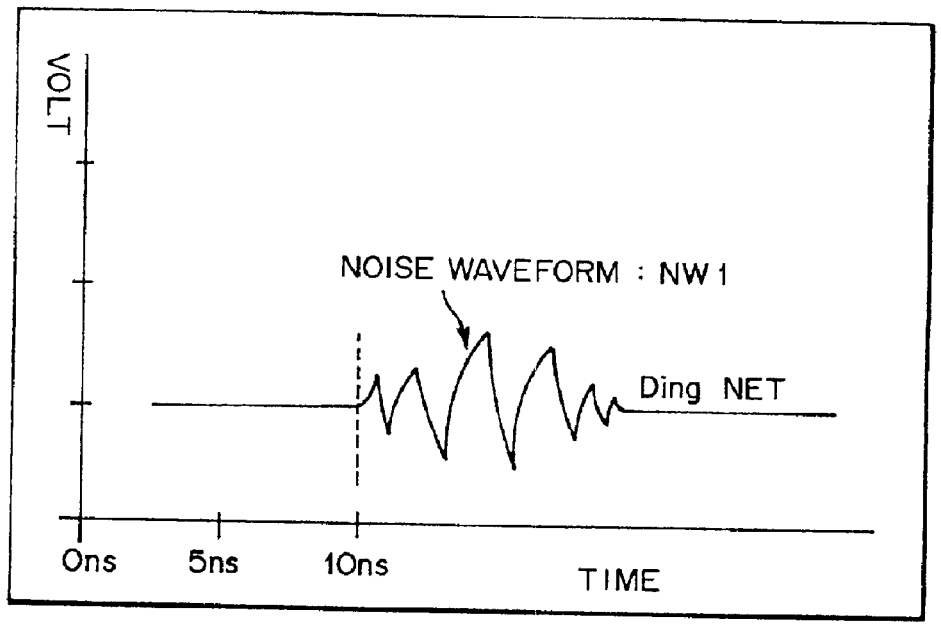
FIG. 27 is a schematic view showing an example of a display of a noise waveform in the fourth modification of the first embodiment.
Figure 29:
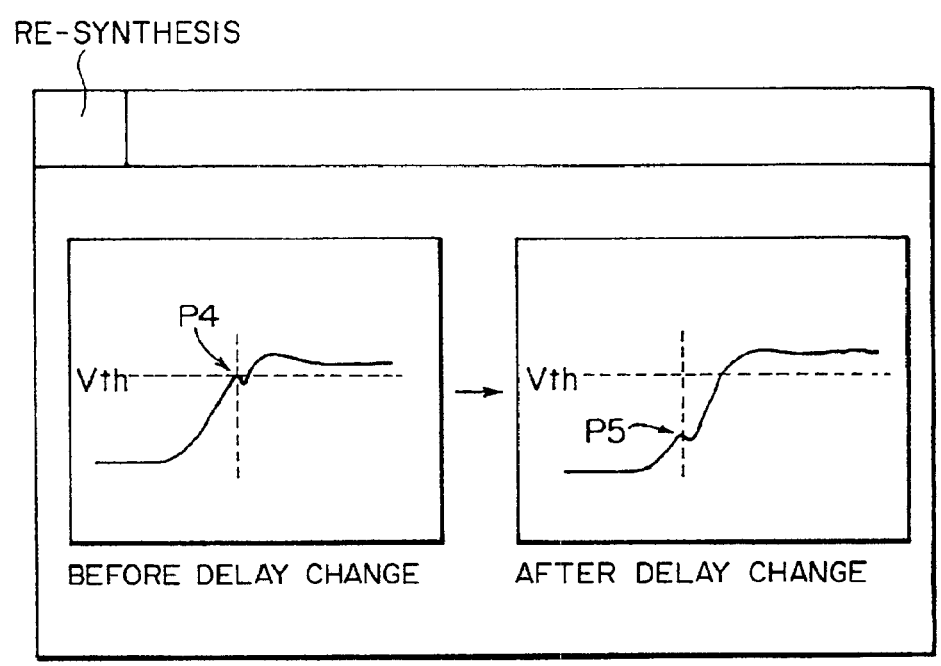
FIG. 29 is a schematic view showing an example of a display of a noise composite waveform upon movement of a noise waveform in the fourth modification of the first embodiment.

Now, operation of the noise checking apparatus of the fourth modification to the first embodiment having the configuration as described above is described with reference to FIGS. 27 to 29. It is to be noted that FIG. 27 is a view showing a display example of a noise waveform, FIG. 28 is a view showing a display example upon movement of a noise waveform, and FIG. 29 is a view showing a display example of a noise composite waveform upon movement of a noise waveform.

(1-D-1) The data extraction section 13 extracts the circuit information and the wiring information from the circuit net list database 11 and the mounting database 12, and the circuit model production section 14 produces a circuit simulation model.

(1-D-2) The circuit simulator 15 performs a simulation with regard to the circuit simulation model to determine a transmission line waveform (signal waveform) of the noticed net including waveform rounding, reflection noise and so forth and further determine various noise waveforms of crosstalk noise, simultaneous switching noise and so forth.

(1-D-3) Similarly as in the first embodiment, the transmission line waveform (signal waveform) and the noise waveforms obtained by the circuit simulator 15 are synthesized by the noise waveform synthesis section 16 with delay times of the noises (generation timings of the noises) taken into consideration to obtain a noise composite waveform.

(1-D-4) The noise checking section 18 performs noise checks such as an overdelay check, a racing check and so forth for the noise composite waveform obtained by the noise waveform synthesis section 16.

(1-D-5) The noise composite waveform analysis section 19 performs a noise analysis of the noise composite waveform obtained for the noticed net and causes a result of the analysis to be displayed on the screen of the display unit 20.

(1-D-6) If the result of the noise analysis proves that a questionable noise waveform [that is, a noise waveform superposed on the Ded net (noticed net) by a questionable Ding net] is present, then the noise waveform is displayed, for example, as such a noise waveform diagram as shown in FIG. 27 on the screen of the display unit 20. At this time, =on the noise waveform diagram shown in FIG. 27, an input delay time (hereinafter referred to as delay; 10 ns in FIG. 27) of a driver which drives the Ding net from which the noise waveform arises is displayed together with the time axis. It is to be noted that, while only one noise waveform NW1 is displayed in FIG. 27, where a plurality of questionable noise waveforms are present, all of the plurality of noise waveforms are displayed on the screen of the display unit 20.

(1-D-7) The designer will refer to the noise waveform diagram on the screen of the display unit 20 and click the noise waveform NW1 of the Ding net whose delay should be varied with the pointing device 30 to select the noise waveform NW1. Then, the designer will depress a button of the pointing device 30 to perform dragging so that the selected noise waveform NW1 is moved in the time axis direction by a desired time on the screen of the display unit 20, for example, as shown in FIG. 28. It is to be noted that another noise waveform NW2 shown in FIG. 28 is the noise waveform NW1 after moved so that the delay of the noise waveform NW1 may be increased, but a further noise waveform NW3 shown in FIG. 28 is the noise waveform NW1 after moved so that the delay of the noise waveform NW1 may be decreased.

(1-D-8) After the noise waveform is moved in such a manner as described above, if the designer selects a re-synthesis menu with the pointing device 30, then re-synthesis of a noise waveform is performed automatically, and a result of the re-synthesis is displayed on the screen of the display unit 20 as shown in FIG. 29.

At this time, if the re-synthesis menu is selected, then the timing changing amount calculation section 29 calculates a timing changing amount (a changing amount of the delay) of the noise waveform NW1 corresponding to the amount of movement by the pointing device 30 and reports the timing changing amount to the noise waveform synthesis section 16. Then, the noise waveform synthesis section 16 dynamically changes the delay (generation timing) of the noise waveform NW1 to a delay (generation timing) corresponding to the timing changing amount from the timing changing amount calculation section 29 and performs re-synthesis only for the noise waveform NW1 using the new delay to obtain a noise composite waveform after the timing changing of the noise waveform NW1.

(1-D-9) The noise composite waveform analysis section 19 analyzes the noise composite waveform after the delay changing of the noise waveform NW1, and the noise composite waveform is displayed on the screen of the display unit 20 together with the noise composite waveform before the delay changing as seen in FIG. 29. Although the noise composite waveform before the delay changing shown in FIG. 29 has a problem because the peak P4 reaches the threshold voltage Vth, the problem is eliminated from the noise composite waveform after the noise changing because the peak P5 is low.

(1-D-10) Even if the problem is not solved by such movement of the noise waveform NW1 as described above, the designer will either move the noise waveform NW1 again by means of the pointing device 30 or move the other noise waveform to try to eliminate the problem. Also in this instance, a noise composite waveform after noise waveform movement is displayed in the procedure described in the items (1-D-7) to (1-D-9) above.

(1-D-11) The processing described above in the items (1-D-7) to (1-D-11) is executed repetitively until the program is solved.

In this manner, in the fourth modification to the first embodiment, when a noise waveform having an influence on a noticed net is moved on the screen of the display unit 20, a generation timing (input delay timing) of the noise waveform can be dynamically changed on the real time basis by a timing changing amount corresponding to an amount of the movement. Consequently, there is no necessity to change the delay time file 17 and the man-hours can be reduced significantly. Conventionally, in order to change a delay to perform noise synthesis, operation is required to perform changing of the delay time file 17 and so forth to change a delay condition. However, the necessity for such operation is eliminated with the fourth modification to the first embodiment.

Further, when a delay condition is changed, it is conventionally required to perform a circuit simulation from the beginning. With the fourth modification to the first embodiment, however, re-synthesis of noise can be performed simply and easily with the re-synthesis menu, and a noise composite waveform with generation timings of noise waveforms changed can be obtained and displayed on the real time basis without performing a circuit simulation again. Accordingly, the fourth modification to the first embodiment can facilitate a noise analysis, reduce the man-hours of the designer to reduce the burden to the designer and further augment the working efficiency similarly to the third modification described hereinabove.

[1-E] Description of the Fifth Embodiment to the First Embodiment

Figure 31:
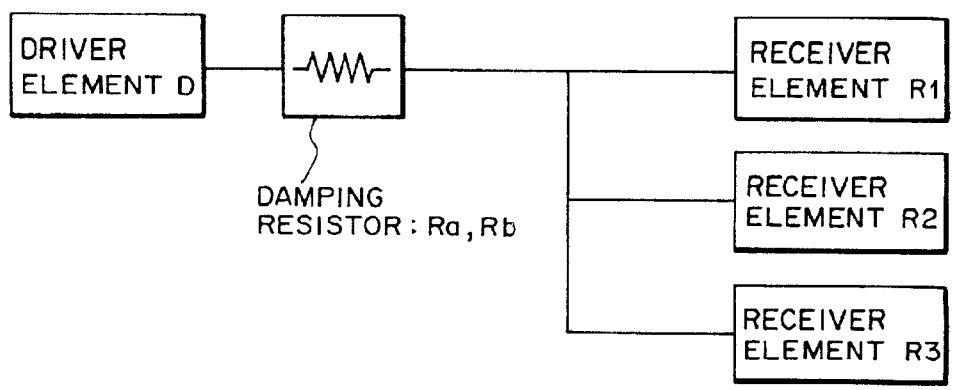
FIG. 31 is a diagrammatic view illustrating insertion of a damping resister in the fifth modification of the first embodiment.

It is commonly known that, where ringing is superposed on a noise composite waveform, an error by the ringing can be eliminated by, for example, as shown in FIG. 31, inserting a damping resistor (Ra, Rb) in series to a net between a driver element D and receiver elements R1 to R3. However, determination of what resistor should be inserted relies upon the experience of the designer.

Thus, the noise checking apparatus of the fifth modification to the first embodiment is so configured that it can present an optimum damping resistance value to the designer to reduce the burden to the designer.

In particular, as described below, the noise checking apparatus of the fifth modification to the first embodiment is so configured that it has a function (optimum damping resistance value calculation section) for calculating an optimum damping resistance value from a noise composite waveform on which ringing is superposed and the type of a driver, a function (resistance part search section) of searching for and selecting candidates to a resistance element having a value nearest to the calculated resistance value from among registered resistance elements, and a function (noise re-calculation/re-synthesis section) of displaying a noise composite waveform when a candidate element is inserted, and can present an optimum damping resistance value to the designer.

Figure 30:
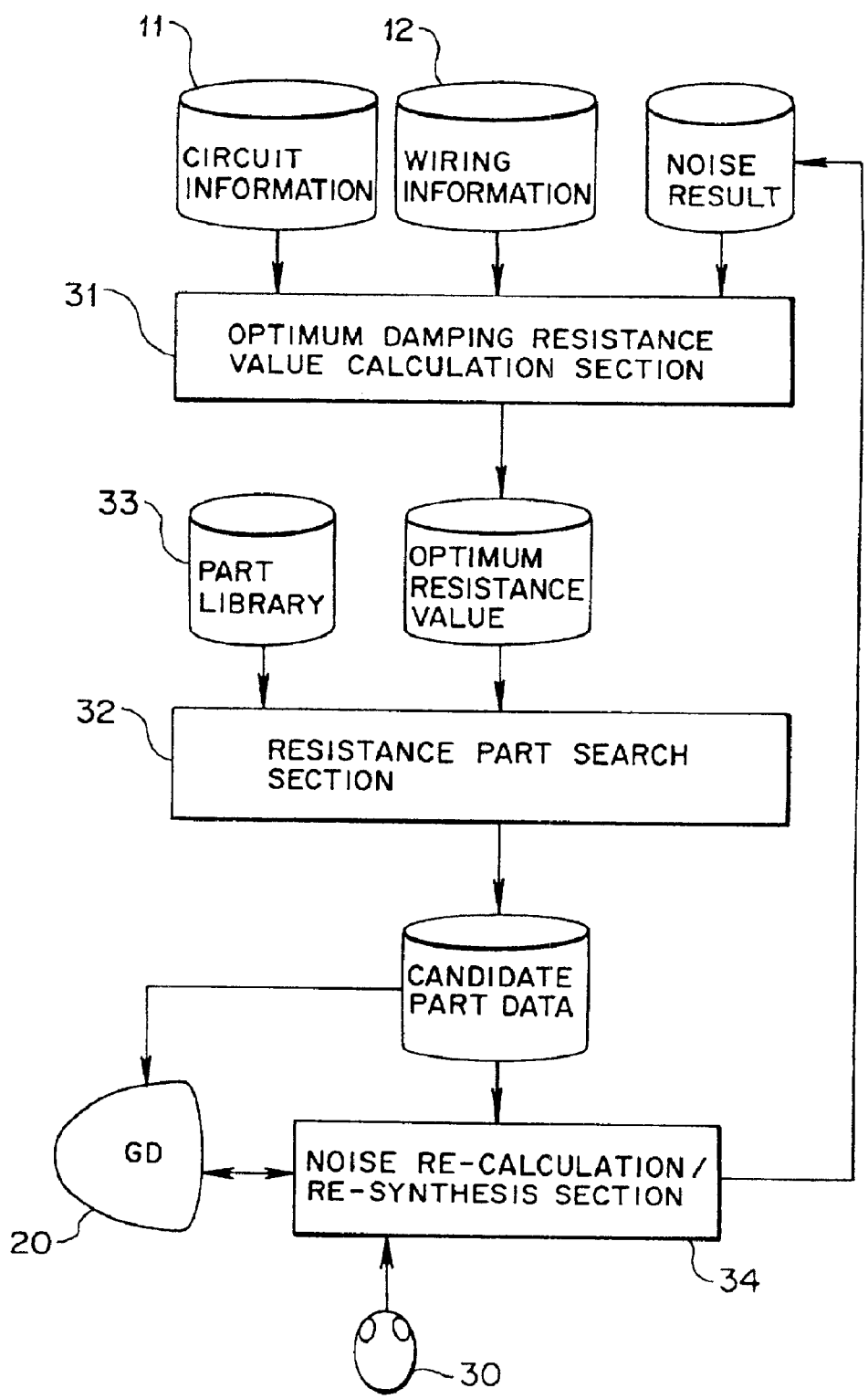
FIG. 30 is a block diagram showing a functional configuration of a noise checking apparatus as a fifth modification to the first embodiment of the present invention.

FIG. 30 is a block diagram showing a functional configuration of the noise checking apparatus as the fifth modification to the first embodiment of the present invention. It is to be noted that, in FIG. 30, like reference characters to those described hereinabove denote like elements or substantially like elements, and therefore, description of them is omitted.

As shown in FIG. 30, the noise checking apparatus of the fifth modification includes a circuit net list database 11, a mounting database 12, a pointing device (selective inputting section) 30, an optimum damping resistance value calculation section 31, a resistance part search section 32, a part library 33, and a noise recalculation/re-synthesis section 34.

It is to be noted, however, that the circuit net list database 11, mounting database 12 and display unit 20 are similar to those described in connection with the first embodiment, and the noise re-calculation/re-synthesis section 34 actually includes the circuit model production section 14, circuit simulator 15, noise waveform synthesis section 16, delay time file 17, noise checking section 18 and noise composite waveform analysis section 19 shown in FIG. 2.

The optimum damping resistance value calculation section 31 calculates an optimum damping resistance value, with which ringing when it is superposed on a noise composite waveform can be eliminated by addition of the damping resistor to a noticed net, based on the noise composite waveform and the type of a driver.

The resistance part search section 32 searches for and selects candidates (candidate parts) to a resistance element having a value nearest to the resistance value calculated by the optimum damping resistance value calculation section 31 from among resistance elements (resistance parts) registered in advance in the part library 33.

Information (candidate part data) regarding the candidates to a resistance element searched out by the resistance part search section 32 is displayed on the display unit 20. The designer can thus operate the pointing device (selective inputting section) 30 to select a desired one of the candidates to a resistance element displayed on the display unit 20.

The noise re-calculation/re-synthesis section 34 includes the circuit model production section 14, circuit simulator 15, noise waveform synthesis section 16, delay time file 17, noise checking section 18 and noise composite waveform analysis section 19 as described above. The circuit model production section 14, circuit simulator 15, noise waveform synthesis section 16, delay time file 17, noise checking section 18 and noise composite waveform analysis section 19 operate in a condition that the resistance element selected by the pointing device 30 is additionally inserted in the noticed net to obtain a noise composite waveform after the resistance element is inserted. The noise composite waveform is displayed on the display unit 20.

Now, operation of the noise checking apparatus of the fifth modification to the first embodiment having such a configuration as described above is described with reference to FIGS. 30 to 32. FIG. 31 is a view for explaining insertion of a damping resistor, and FIG. 32 is a view showing an example of a value of the damping resistor and a variation of a noise composite waveform.

Figure 32:
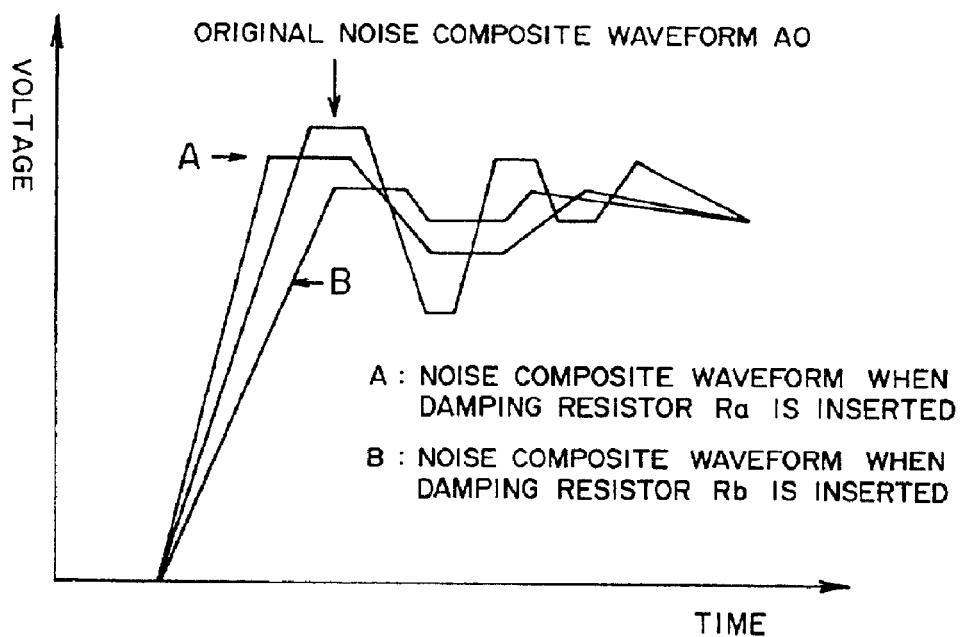
FIG. 32 is a diagram showing an example of a value of the damping resistance and a variation of a noise composite waveform in the fifth modification of the first embodiment.

(1-E-1) When ringing is superposed on a noise composite waveform and an error is caused by the ringing, the optimum damping resistance value calculation section 31 calculates an optimum damping resistance value with which the ringing can be eliminated with certainty by insertion of the damping resistor into the noticed net based on the noise composite waveform on which the ringing is superposed, for example, as indicated by reference character A0 in FIG. 32, the type of a driver element for the noticed net and a characteristic impedance of the circuit board obtained from the circuit net list database 11 and/or the mounting database 12, and the type and the number of receivers driven by the driver element.

(1-E-2) The resistance part search section 32 searches out a plurality of resistance parts having resistance values near to the optimum damping resistance value calculated in such a manner as described above from within the part library 33, and the display unit 20 displays the plurality of resistance parts as candidate part data.

(1-E-3) The designer will select a resistance part or damping resistor to be inserted from among the candidate part data displayed on the display unit 20 using the pointing device 30. Here, it is assumed that, for example, a damping resistor Ra shown in FIGS. 31 and 32 is selected.

(1-E-4) In the noise re-calculation/re-synthesis section 34, the circuit model production section 14 generates a new circuit simulation model wherein the resistance part (damping resistor Ra) selected by the designer is inserted in the circuit model. Then, similarly as in the example of the first embodiment described with reference to FIG. 2, the circuit simulator 15 receives the new circuit simulation model, calculates a new transmission line waveform (signal waveform) and noise waveforms, and the noise waveform synthesis section 16 synthesizes the transmission line waveform and the noise waveforms to obtain a new noise composite waveform. The new noise composite waveform is, for example, such a waveform as denoted by reference character A in FIG. 32 and is displayed on the display unit 20.

(1-E-5) If the new noise composite waveform displayed on the display unit 20 in this manner is not satisfactory, then the designer will select a damping resistor of another resistance value, for example, a damping resistor Rb from among the candidate part data described above. Consequently, the noise re-calculation/re-synthesis section 34 calculates a new transmission line waveform and noise waveforms with regard to the newly selected damping resistor Rb in a similar manner as described above to obtain a new noise composite waveform. The new noise composite waveform is, for example, such a waveform as denoted by reference character B in FIG. 32 and is displayed on the display unit 20.

(1-E-6) The operations described above are repeated to find out an optimum damping resistor from among the damping resistors prepared in the part library 33. Consequently, a waveform which is influenced less by noise can be obtained like, for example, a noise composite waveform denoted by reference character B in FIG. 32 when the damping resistor Rb is inserted.

In this manner, in the fifth modification to the first embodiment, candidates to an optimum damping resistor are presented, and a noise composite waveform when a selected damping resistor is inserted is displayed. Consequently, the burden to the designer upon selection of a damping resistor is reduced and the working efficiency can be further augmented.

[2] Description of the Second Embodiment

A noise checking apparatus as a second embodiment of the present invention is configured in a similar manner to that of the first embodiment shown in FIG. 2. Therefore, the configuration of the noise checking apparatus of the second embodiment is not shown in the accompanying drawings.

However, the noise waveform synthesis section 16 in the second embodiment calculates, when it synthesizes a signal waveform and noise waveforms obtained by the circuit simulator 15, time axis direction distributions of the maximum value and the minimum value of the signal waveform with a delay variation taken into consideration and calculates time axis direction distributions of the maximum value and the minimum value of a noise waveform with a noise generation timing distribution taken into consideration for each of different kinds of noise, and synthesizes the time axis direction distributions of the maximum value and the minimum value of the signal waveform and the time axis direction distributions of the maximum value and the minimum value of the noise waveforms to obtain a time axis direction distribution of the maximum value and the minimum value as a noise composite waveform.

At this time, the noise waveform synthesis section 16 shifts a single signal waveform calculated in predetermined conditions by the circuit simulator 15 within a range of a delay variation to calculate time axis direction distributions of the maximum value and the minimum value of the signal waveform. Similarly, the noise waveform synthesis section 16 shifts a single noise waveform calculated for each kind of noise in the predetermined conditions by the circuit simulator 15 within a range of a noise generation timing variation to calculate time axis direction distributions of the maximum value and the minimum value of the noise waveform.

When an overdelay check of the signal waveform is to be performed, the noise waveform synthesis section 16 synthesizes, upon rising of the signal waveform, the time axis distribution of the minimum value of the noise waveform with the signal waveform to obtain a noise composite waveform, but synthesizes, upon falling of the signal waveform, the time axis distribution of the maximum value of the noise waveform with the signal waveform to obtain a noise composite waveform. On the contrary when a racing check of the signal waveform is to be performed, the noise waveform synthesis section 16 synthesizes, upon rising of the signal waveform, the time axis distribution of the maximum value of the noise waveform with the signal waveform, but synthesizes, upon falling of the signal waveform, the time axis distribution of the minimum value of the noise waveform with the signal waveform to obtain a noise composite waveform.

It is to be noted that details of a noise waveform synthesis scheme by the noise waveform synthesis section 16 in the second embodiment are hereinafter described with reference to FIGS. 33, 37, 39, 40 and 42.

When a noise waveform exists across a plurality of clock cycles, the noise waveform synthesis section 16 in the second embodiment extracts a maximum value and a minimum value of a noise waveform in the same phase of each clock cycle from the clock cycles respectively to generate a maximum value compressed noise waveform and a minimum value compressed noise waveform wherein the maximum values and the minimum values of the noise waveform are compressed into one clock cycle respectively, and uses the compressed noise waveforms as the time axis direction distributions of the maximum value and the minimum value of the noise waveform, respectively. Details of the noise compression scheme are hereinafter described with reference to FIGS. 35, 36 and 42.

The noise checking section 18 in the second embodiment discriminates whether or not both of the time axis direction distributions of the maximum value and the minimum value of the noise composite waveform obtained by the noise waveform synthesis section 16 satisfy logical expected values for a checking object pin to perform a noise check. Details of the noise checking scheme are hereinafter described with reference to FIGS. 34, 38 and 41.

Now, operation of the noise checking apparatus as the second embodiment of the present invention having such a configuration as described above is described with reference to FIGS. 33 to 42.

In the second embodiment (also in the first embodiment), an apparatus wherein a medium (wiring line pattern) having conductivity is used as means for propagating a voltage signal between a plurality of nodes is presumed. Further, in the second embodiment, after crosstalk noise generated between conductive media, simultaneous switching noise and power supply/ground bounces described above which are generated in each node are determined by a circuit simulation and mathematical expression calculation, waveform synthesis of various kinds of noise and discrimination of whether or not a malfunction by the noise is present are performed in the following manner.

(2-1) A basic procedure of noise waveform synthesis performed by the noise waveform synthesis section 16 in the second embodiment is described with reference to FIGS. 33A to 33C, 42A and 42B.

(2-1-1) In a node input (receiver) which receives a signal through a noticed net, various kinds of noise waveforms and a signal propagation waveform between the nodes (that is, a signal waveform of the noticed network) are calculated by a circuit simulation or mathematical expression calculation of the circuit simulator 15 under certain designated conditions, and the noise waveforms and the signal propagation waveform are stored. The conditions include switching (rising/falling) of a driver circuit for the node which outputs the signal, a process condition, a temperature, a power supply voltage to be supplied to the apparatus, and so forth.

Figure 33A:
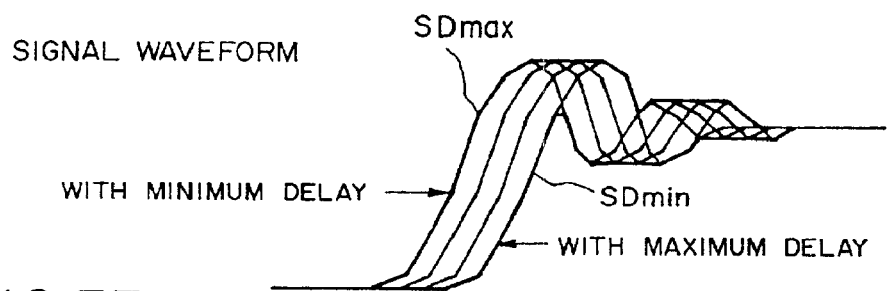
FIGS. 33A to 33C are diagrammatic views all illustrating a synthesis procedure of a signal waveform and noise waveforms in a noise check method as a second embodiment of the present invention.
Figure 33B:
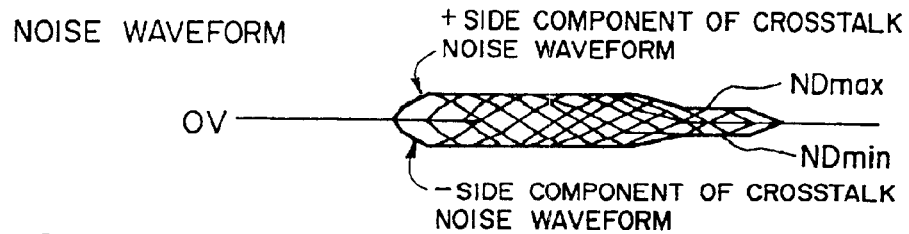
Figure 33C:
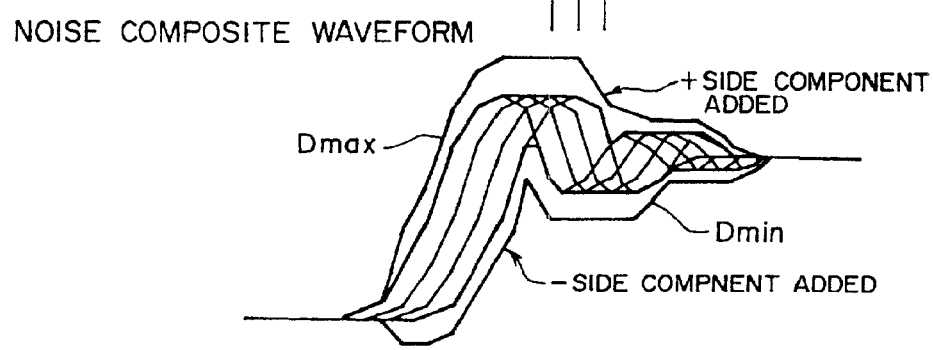

(2-1-2) Time axis direction distributions NDmax/NDmin of maximum/minimum noise voltages which can be generated truly in the receiver with which a malfunction is to be discriminated are calculated. An example of calculation of the distributions NDmax/NDmin in the time axis direction of the maximum/minimum noise voltages of crosstalk noise is illustrated in FIG. 33B. In calculation of the voltage distributions NDmax/NDmin, if a reception clock signal and the noise source of the receiver are in synchronism with each other, the timing of the noise waveform with respect to the receiver reception clock is taken into consideration, but when they are not in synchronism with each other, the maximum value or the minimum value of the noise waveform is used without taking a timing into consideration.

When a distribution of a noise voltage which is in a synchronous relationship is to be calculated, a delay variation of the output node of the signal (a variation of the generation timing of the noise) is taken into consideration. At this time, in order to minimize the number of times of a circuit simulation or mathematical expression calculation, the noise waveform calculated and stored in advance is shifted within a range of a timing variation as seen in FIG. 33B and adds waveforms for individual different switching conditions to calculate a maximum value NDmax and a minimum value NDmin at an arbitrary time of the noise voltage which can be generated truly.

It is to be noted that the delay variation may include a process variation as well as a variation by a power supply voltage variation and/or a temperature variation.

Figure 42A:
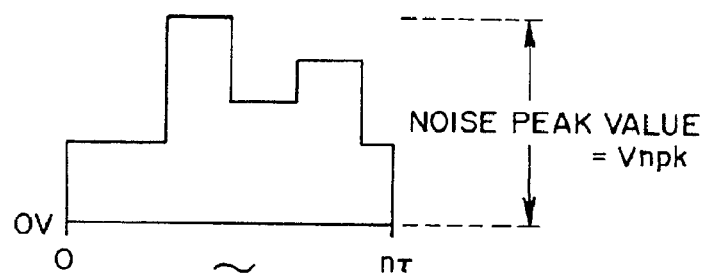
FIGS. 42A and 42B are diagrams illustrating a calculation scheme of a noise waveform where noise is generated asynchronously with a clock signal in the second embodiment.
Figure 42B:
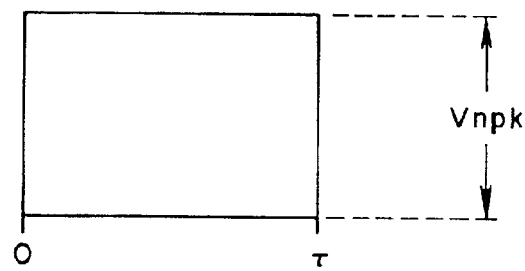

On the other hand, when a distribution of a noise voltage which is not in a synchronous relationship is to be calculated, the maximum value or the minimum value of the noise waveform is used without taking a timing into consideration at all. For example, when noise is generated in an asynchronous relationship with a clock signal as seen in FIG. 42A (0 to $n\tau$; $\tau$ is a clock cycle), a noise peak value Vnpk within 0 to $n\tau$ is extracted, and a uniform distribution of the noise peak value Vnpk in the time axis direction as seen in FIG. 42B is used as a noise waveform (compression noise waveform).

(2-1-3) Time axis direction distributions SDmax/SDmin of the maximum value/minimum value at an arbitrary time of a signal propagation waveform (signal waveform) which is generated in a receiver whose malfunction is to be discriminated are calculated. When the voltage distributions SDmax/SDmin are calculated, a delay distribution at the output node of the signal is taken into consideration. At this time, similarly as in the case wherein the time axis direction distributions NDmax/NDmin of noise are calculated, in order to minimize the number of times of a circuit simulation or mathematical expression calculation, a signal waveform between the nodes calculated and stored formerly is shifted within a range of a timing variation as seen in FIG. 33A to calculate time axis direction distributions SDmax/SDmin of the maximum value/minimum value of the signal waveform. It is to be noted that, in FIG. 33A, an example of a rising waveform (UP waveform) is shown.

(2-1-4) The time axis direction distributions NDmax/NDmin of the maximum/minimum noise voltages and the time axis direction distributions SDmax/SDmin of the maximum value/minimum value of the signal propagation waveform calculated in such a manner as described above are synthesized as seen in FIG. 33C to calculate time axis direction distributions Dmax/Dmin of the maximum value/minimum value of the voltage when the noise is superposed on the transmission waveform as a noise composite waveform.

(2-2) The noise checking section 18 discriminates whether or not the time axis direction distributions Dmax/Dmin of the maximum value/minimum value calculated in such a manner as described above satisfy logical expected values within a setup/hold periods at an arbitrary reception clock timing at the receiver input pin to perform a noise check. If the time axis direction distributions Dmax/Dmin do not satisfy the expected values, a warning or the like is generated.

Figure 38:
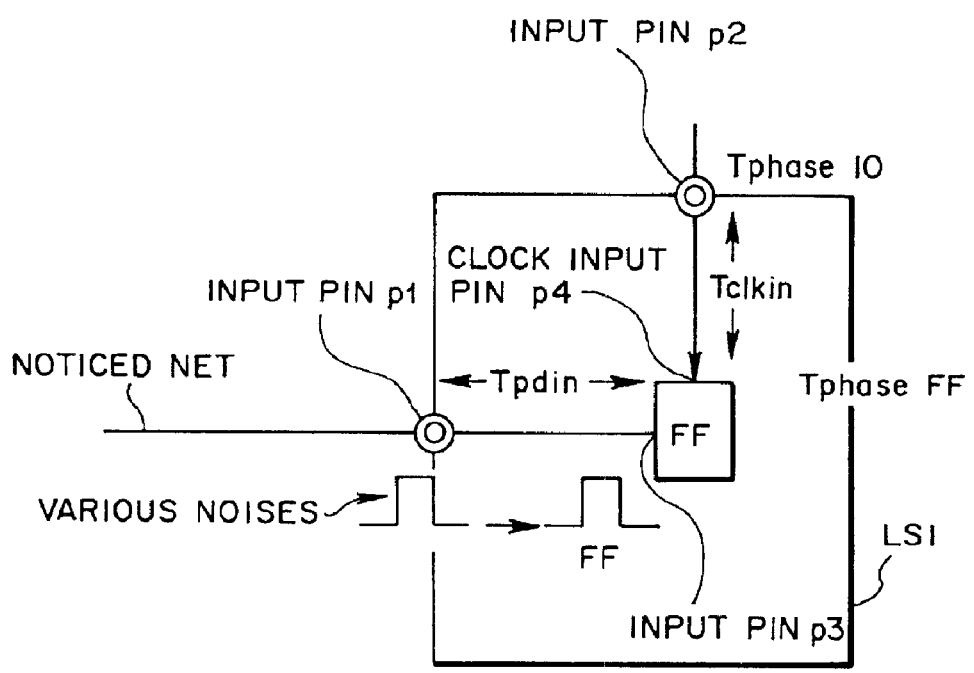
FIG. 38 is a diagrammatic view illustrating timing definition when a path can be developed from a data input to a noticed FF.

An example of a noise check performed for the time axis direction distributions Dmax/Dmin calculated by the scheme described above with reference to FIGS. 33A to 33C is described with reference to FIGS. 34 and 38. Here, description is given of an example in a case wherein, for example, as shown in FIG. 38, a path from a data input (an input pin p1 or a clock input pin p2 of a noticed net) to a noticed flip-flop FF (FF input pin p3 or clock input pin p4) can be developed (a case wherein the receiver of the noticed net is, for example, an LSI).

At this time, if the delay time from the clock input pin p2 to the clock input pin p4 of the FF is represented by Tclkin, then the clock phase TphaseFF to be used in a noise check is a sum (TphaseFF=TphaseIO+Tclkin) of the delay time Tclkin and a clock phase TphaseIO to the input pin p2.

Figure 34:
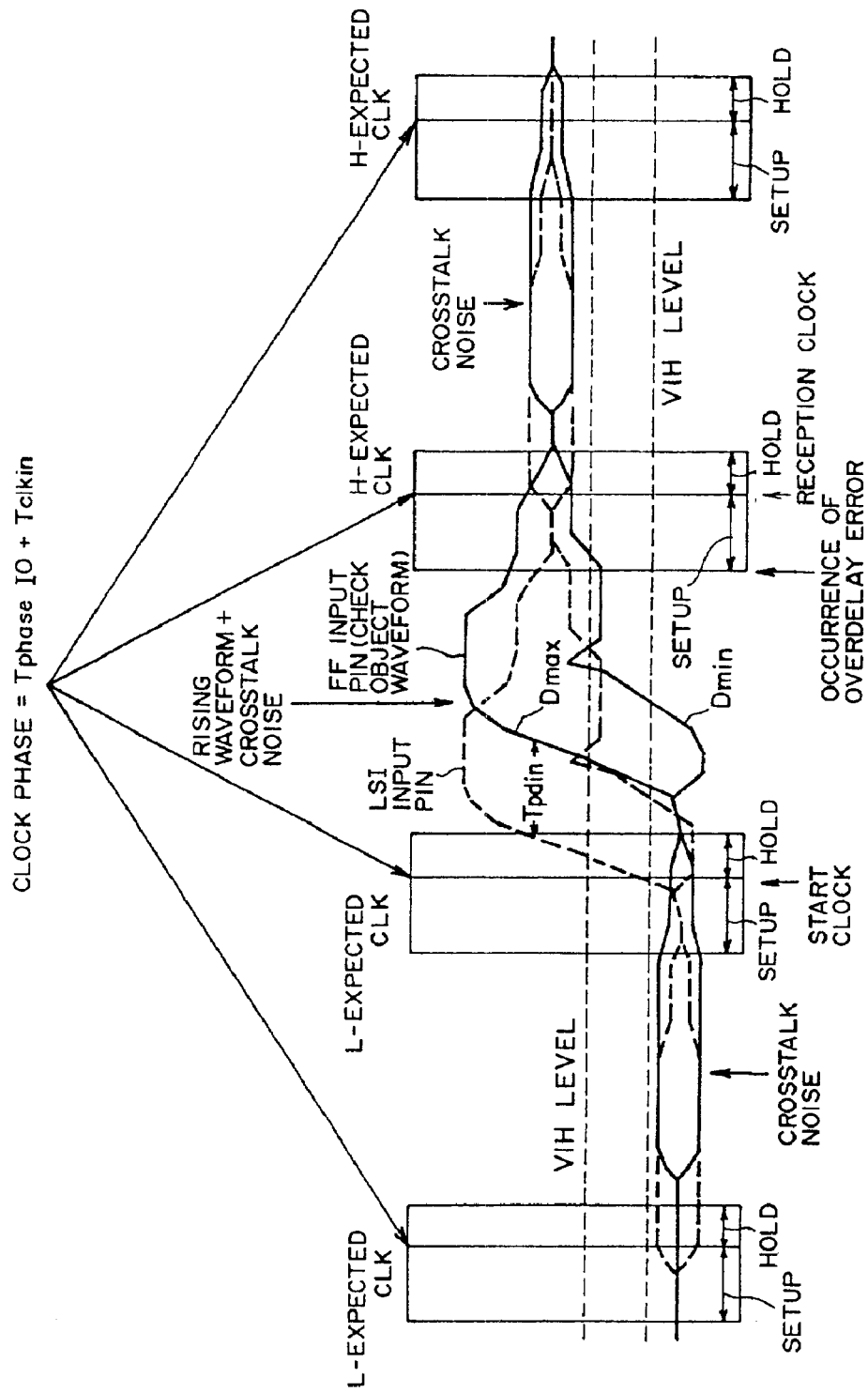
FIG. 34 is a diagrammatic view illustrating a noise check in which a clock timing is taken into consideration in the second embodiment.

If the delay time from the input pin p1 to the FF input pin p3 is represented by Tpdin, then the signal waveform (rising waveform+crosstalk noise waveform) which is an object of a noise check as shown in FIG. 34 is a noise composite waveform at the LSI input pin p1 indicated by a broken line in FIG. 34 shifted by the delay time Tpdin from the LSI input pin p1 to the FF input pin p3 as indicated by a solid line in FIG. 34.

Then, it is discriminated whether or not both of the time axis direction distributions Dmax/Dmin of the maximum value/minimum value satisfy expected values in individual clock phases within a setup period and a hold period before and after the clock phase to perform a noise check.

In particular, in an L-expected clock phase, the time axis direction distributions Dmax/Dmin must be lower than a low level discrimination threshold value VIL in both of a setup period and a hold period. If this condition is not satisfied, then it is discriminated that a racing error will occur with the start clock.

In an H-expected clock phase, the time axis direction distributions Dmax/Dmin must be higher than a high level discrimination threshold value VIH in both of a setup period and a hold period. If this condition is not satisfied, then it is discriminated that an overdelay error will occur with the reception clock.

In the example shown in FIG. 34, part of the time direction distribution Dmin of the minimum value is lower than the high level discrimination threshold value VIH within a setup period of an H-expected clock phase (reception clock). Therefore, it is discriminated that an overdelay error will occur.

(2-3) Various kinds of noise (crosstalk noise, simultaneous switching noise and so forth), only within a time required for a noise waveform to converge, is calculated in order to allow handling of a case wherein noise propagates across a plurality of clock cycles. Further in order to make it possible to easily detect the worst condition in which various kinds of noise overlap, noise waveforms of a plurality of cycles are compressed to those of one cycle.

Figure 35:
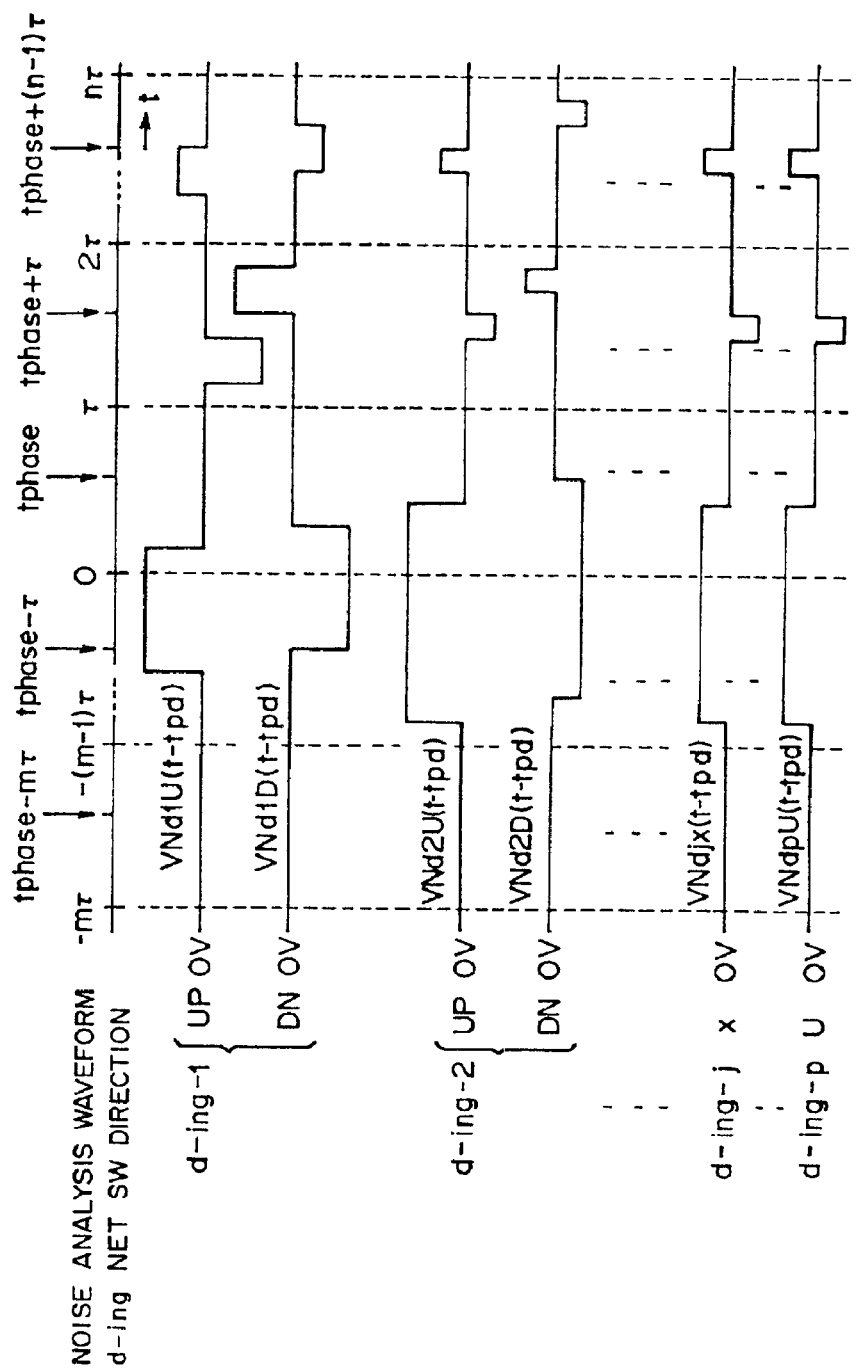
FIG. 35 is a time chart illustrating a noise waveform compression scheme in the second embodiment.
Figure 36:
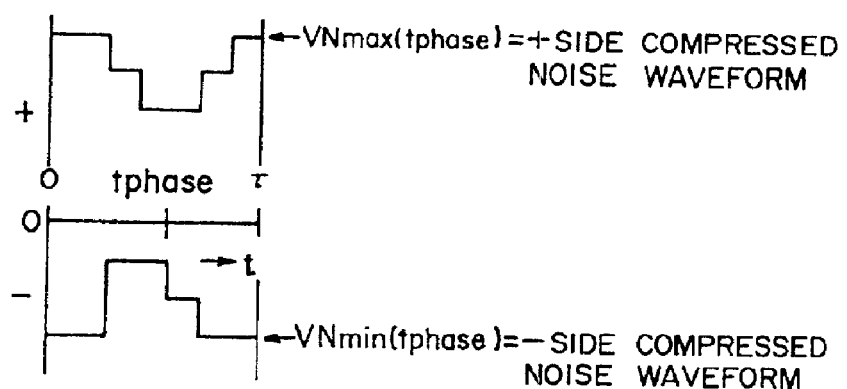
FIG. 36 is a diagram showing a compressed noise waveform which is obtained by the noise waveform compression scheme in the second embodiment.

For example, when a noticed net is influenced across a plurality of clock cycles by a plurality of noise waveforms VNd1U(t-tpd), VNd1D(t-tpd), VNd2U(t-tpd), VNd2D(t-tpd), ..., VNdjx(t-tpd), ..., VNdpU(t-tpd) from a plurality of d-ing nets (signifying similarly to Ding nets described hereinabove) d-ing-1, d-ing-2, ..., d-ing-j, ..., d-ing-p, as shown in FIG. 35, the noise waveform synthesis section 16 in the second embodiment compresses the noise waveforms into those of a single clock cycle $\tau$ in accordance with the following expressions (14) to (17) to calculate such a compressed noise waveform as shown in FIG. 36 and uses the compressed noise waveform as time axis direction distributions NDmax/NDmin of the maximum/minimum noise voltage values. It is to be noted that "x" in FIG. 35 signifies that the switching direction (SW direction) of the noise is one of UP (rising) and DN (falling).

At this time, the noise value VNmax(tphase) of the + side compressed noise waveform (maximum value compressed noise waveform) in a clock phase tphase is calculated in accordance with the following expression (14).

$$VNmax(tphase)=\Sigma VNDj(tphase)max \quad (14)$$

where $\Sigma$ signifies the sum total with regard to j, and addition is performed only when VNdj(tphase)max>0. Meanwhile, VNdj(tphase)max is defined by the following expression (15).

$$VNdj(tphase)max=max[VNdjx(tphase+i\tau-tpd)] \quad (15)$$

In other words, VNdj(tphase)max is a maximum value within ranges of tmin<tpd<tmax, $-m \leq i \leq n$, and x=UP or DN.

Similarly, the noise value VNmin(tphase) of the – side compressed noise waveform (minimum value compressed noise waveform) in a clock phase tphase is calculated in accordance with the following expression (16).

$$VNmin(tphase)=\Sigma VNdj(tphase)min \quad (16)$$

where $\Sigma$ signifies the sum total with regard to j, and addition is performed only when VNdj(tphase)min<0. Meanwhile, VNdj(tphase)min is defined by the following expression (17).

$$VNdj(tphase)min=min[VNdjx(tphase+i\tau-tpd)] \quad (17)$$

In other words, VNdj(tphase)min is a minimum value within ranges of tmin<tpd<tmax, –m<i<n, and x=UP or DN.

It is to be noted that, where a noticed d-ing net has a plurality of output pins (or a bidirectional pin), the maximum value and the minimum value from among a plurality of noise values obtained in the phase tphase upon switching of output circuits connected to the output pins (or bidirectional pin) are used as the + side compressed noise waveform and the – side compressed noise waveform of the noticed d-ing net in the phase tphase.

If noise is generated in an asynchronous relationship from a clock signal as seen in FIG. 42A as described hereinabove, a noise peak value Vnpk within a period from 0 to $n\pi$ is extracted, and a uniform distribution of the noise peak value Vnpk in the time axis direction as shown in FIG. 42B is used as the compressed noise waveform.

(2-4) An example of synthesis of various kinds of noise is illustrated in FIGS. 37A to 37G. Here, it is assumed that, for example, ① such driver simultaneous switching noise of an LSI as shown in FIG. 37A, ② such receiver simultaneous switching noise of the LSI as shown in FIG. 37B, ③ such parallel wiring line pattern crosstalk noise+crossing wiring line crosstalk noise as shown in FIG. 37C and ④ such noise of a uniform distribution including VIA crosstalk noise, terminating resistor simultaneous switching noise, connector crosstalk noise, cable crosstalk noise, DC noise and so forth as shown in FIG. 37D are obtained as compressed noise waveforms.

In this instance, the four kinds of noise waveforms shown in FIGS. 37A to 37D are synthesized to obtain such a composite noise waveform as shown in FIG. 37E, and such a transmission waveform (here, a rising waveform) of a noticed net as shown in FIG. 37F is synthesized with the composite noise waveform to obtain such a noise composite waveform as shown in FIG. 37G. Then, the noise check described above is performed for the noise composite waveform.

It is to be noted that, when the composite noise waveform and the transmission waveform (signal waveform) are synthesized, if an overdelay check of the rising transmission waveform is performed, then the – side compressed noise waveform of the composite noise waveform shown in FIG. 37E is added to the rising transmission waveform shown in FIG. 37F to perform noise waveform synthesis. However, when an overlay check of the falling transmission waveform is performed, the + side compressed noise waveform of the composite noise waveform is added to the falling transmission waveform to perform noise waveform synthesis. On the other hand, when a racing check of the rising transmission waveform is performed, the + side compressed noise waveform of the composite noise waveform is added to the rising transmission waveform to perform noise waveform synthesis. However, when a racing check of the falling transmission waveform is performed, the – side compressed noise waveform of the composite noise waveform is added to the falling transmission waveform to perform noise waveform synthesis.

(2-5') For calculation of a transmission waveform (signal waveform) of a noticed net input pin, such two kinds of calculation including single switching waveform calculation and repetitive switching waveform calculation as described below are available, and the designer can designate a calculation method, parameters and so forth in accordance with wiring conditions. It is to be noted that the repetitive switching waveform calculation is performed in response to an instruction of the designer when it is determined necessary from the wiring line conditions and the operation speed.

Figure 39A:
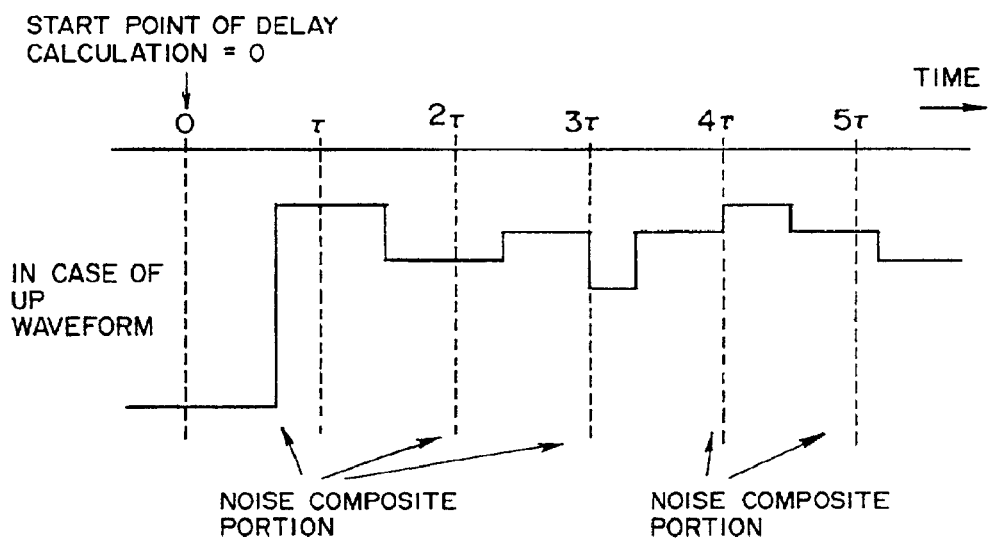
FIG. 39A is a diagram illustrating a noise waveform synthesis scheme upon single switching waveform calculation in the second embodiment.
Figure 39B:
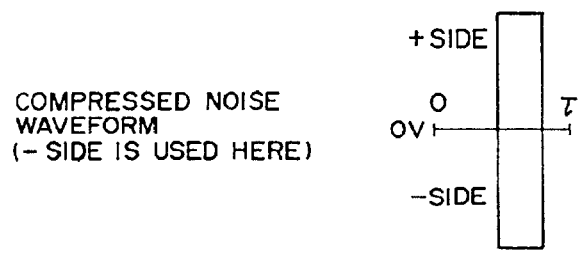
FIG. 39B is a diagram showing a compressed noise waveform which is applied in FIG. 39A.

In FIG. 39A, a rising transmission waveform (UP waveform) for 5τ obtained by single switching waveform calculation is shown. At this time, when such a compressed noise waveform (for 1τ) as shown in FIG. 39B is obtained, the compressed noise waveform (here, on the – side) shown in FIG. 39B is synthesized for each one cycle width τ of the rising transmission waveform shown in FIG. 39A to perform a noise check.

Figure 40A:
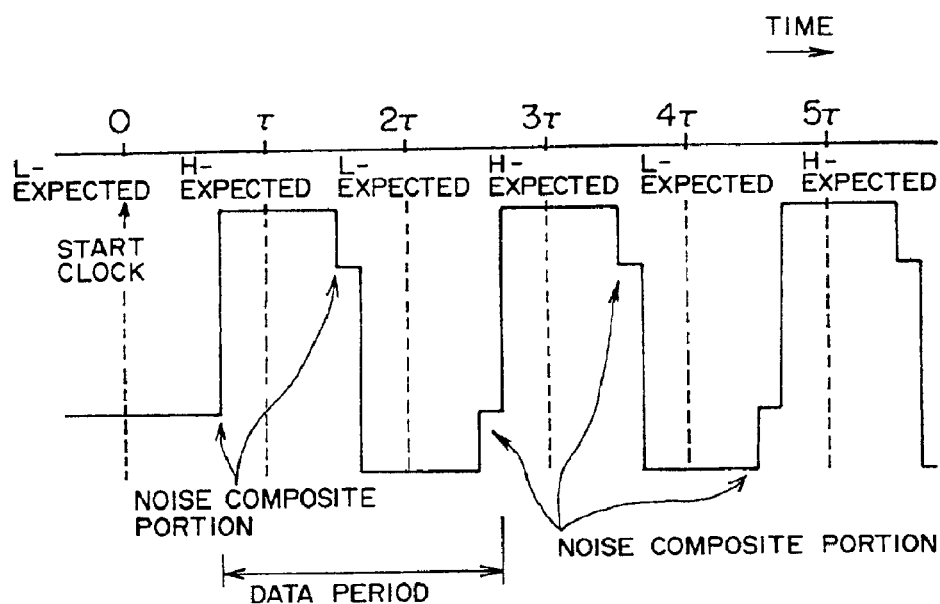
FIG. 40A is a diagram illustrating a noise waveform synthesis scheme upon repeat switching waveform calculation in the second embodiment.
Figure 40B:
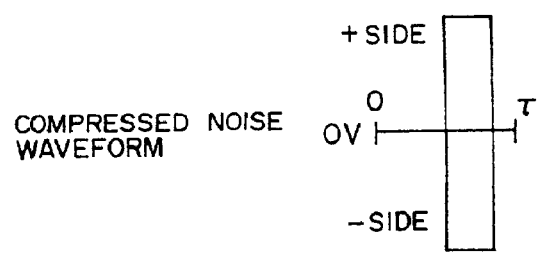
FIG. 40B is a diagram showing a compressed noise waveform which is applied in FIG. 40A.

In FIG. 40A, a transmission waveform for 5τ obtained by repetitive switching waveform calculation is shown. At this time, when such a compressed noise waveform (for 1τ) as shown in FIG. 40B is obtained, the compressed noise waveform shown in FIG. 40B is synthesized for each one cycle width τ of the transmission waveform shown in FIG. 40A to perform a noise check.

(2-6) A noise check when a transmission waveform repeats switching (a check of a phase relationship between noise and a clock signal) is described with reference to FIG. 41.

A timing discrimination between noise and a clock signal is based on whether or not a waveform which does not satisfy an expected value is present within a range within which there is the possibility of a malfunction before and after a clock phase (a setup period TLMN and a hold period TTMN; refer to FIG. 41) as described hereinabove also with reference to FIG. 34.

The setup period TLMN and the hold period TTMN are defined by the following expressions (18) and (19).

$$TLMN = Ts + Tmargins \quad (18)$$

$$TTMN = Th + Tmarginh \quad (19)$$

where Ts is the setup time of the noticed input pin, Th is the hold time of the noticed input pin, and Tmargins and Tmarginh are the setup margin and the hold margin designated by the designer, respectively.

It is to be noted that the timing discrimination illustrated in FIG. 41 results in NG discrimination because the transmission waveform does not satisfy the H-expectation condition at points of time of $\tau$, $2\tau$ and $3\tau$.

(2-7) If the noise checking scheme described above is used in combination with a logical design tool such that base noise/delay verification of a virtual wiring line by a circuit simulation is performed in a stage of entry of a circuit diagram, then disposition conditions/wiring line conditions with reflection noise and delays taken into consideration can be decided on the most upstream stage of designing of a circuit board.

Alternatively, if the noise checking scheme described above is used in combination with a pattern editor such that noise/delay verification is performed in a stage of actual wiring/actual disposition, then detailed disposition/wiring conditions can be decided in an interactive fashion while reflection noise, crosstalk noise and delays are confirmed in a stage of actual wiring.

Further, if the noise checking scheme described above is used to perform final verification of noises and delays for all critical nets on a circuit (entire circuit board) for which actual wiring/actual disposition operations have been completed, then a problem arising from a miss in examination or a design miss can be verified.

In this manner, with the second embodiment of the present invention, time axis direction distributions Dmax/Dmin of the maximum value/minimum value of a signal waveform obtained by synthesizing time axis direction distributions SDmax/SDmin of the maximum value/minimum value of the signal waveform with a delay variation taken into consideration and time axis direction distributions NDmax/NDmin of the maximum/minimum noise voltage values with noise generation timing distributions taken into consideration are used as a noise composite waveform. Consequently, a noise check with a delay variation and noise generation timing variations taken into consideration can be performed only with two noise composite waveforms (time axis direction distributions of the maximum value and the minimum value), and the accuracy in noise calculation is augmented significantly and also the accuracy in the noise check is augmented significantly.

Further, when a noise waveform exists across a plurality of clock cycles, a compressed noise waveform obtained by extracting and compressing maximum values and minimum values of the noise waveform in the same phase of each clock cycle is used. Consequently, the worst condition when various kinds of noise overlap each other can be detected readily. This not only contributes to augmentation of the accuracy in noise calculation and the accuracy in noise checking, but also allows reduction of the processing time.

[3] Others

It is to be noted that the present invention is not limited to the embodiments described above and can be carried out in various forms without departing from the scope of the present invention.

For example, while, in the embodiments of the present invention, the present invention is applied to designing of an electronic circuit of an LSI, a printed circuit board or the like, the present invention is not limited to this and can be applied also to apparatus wherein an optical signal is propagated while similar operations and effects similar to those of the embodiments described above can be achieved.

INDUSTRIAL APPLICABILITY OF THE INVENTION

As described above, according to the present invention, a simulation is performed and various kinds of noise such as waveform rounding, reflection noise, stroke noise, crosstalk noise, and simultaneous switching noise are synthesized with generation timings of the noises taken into consideration to obtain a noise composite waveform. Then, a noise check of a path including a noticed wiring line is performed based on the noise composite waveform. Therefore, various kinds of noise can be checked/analyzed systematically with a signal waveform conforming to an actual signal waveform with the various kinds of noise taken into consideration.

Accordingly, the present invention can not only significantly augment the accuracy in noise calculation and the accuracy in noise checking but also significantly reduce time required for noise checking when a noise check is performed upon designing of an electronic circuit of an LSI, an MCM, a printed circuit board and so forth. Besides, the present invention can reduce the burden to the designer in noise analysis and augment the working efficiency significantly. Consequently, the present invention is considered very high in practical utility.

What is claimed is:

1. A noise checking method used upon circuit designing for checking noise which has an influence on a signal waveform which propagates in a noticed wiring line on a design object circuit, comprising the steps of:

producing a simulation model of a circuit portion relating to the noticed wiring line;

performing a simulation using the simulation model to calculate a signal waveform which propagates in the noticed wiring line and calculate a noise waveform superposed on the signal waveform in the noticed wiring line for a plurality of kinds of noise;

synthesizing with generation timings of the noise waveforms taken into consideration the signal waveform and the noise waveforms calculated for each of the plurality of kinds of noise to obtain a noise composite waveform which is the signal waveform on which the noise is superposed; and performing noise checking based on the noise composite waveform:

wherein when the noise checking is performed, a maximum delay time and a minimum delay time of the noticed wiring line are extracted from the noise composite waveform, and overdelay/racing checking for the noticed wiring line is performed using the maximum delay time and the minimum delay time.

2. The noise checking method as set forth in claim 1, characterized in that, where an adjacent wiring line to the noticed wiring line is turned back in such a manner as to have a plurality of proximate portions which can electrically interfere with the noticed wiring line, simulation models are produced with regard to the individual proximate portions of the adjacent wiring line and the noticed wiring line and the noise waveforms are calculated using the simulation models, and then the noise waveforms calculated with regard to all of the proximate portions and the signal waveform are synthesized with generation timings of the noise waveforms taken into consideration.

3. The noise checking method as set forth in claim 1, characterized in that, where the signal waveform which propagates in the noticed wiring line is a clock waveform, when the noise checking is performed, a pulse period of the noise composite waveform is calculated from crossing points of the noise composite waveform and a high level discrimination threshold value/low level discrimination threshold value for the signal waveform, and pulse period checking of the clock waveform in the noticed wiring line is performed based on the pulse period.

4. The noise checking method as set forth in claim 1, characterized in that, where the signal waveform which propagates in the noticed wiring line is a clock waveform, when the noise checking is performed, a rising width and a falling width of the noise composite waveform are calculated from crossing points of the noise composite waveform and a high level discrimination threshold value/low level discrimination threshold value for the signal waveform, and pulse width checking of the clock waveform in the noticed wiring line is performed based on the rising width and the falling width.

5. The noise checking method as set forth in claim 1, characterized in that, where the signal waveform which propagates in the noticed wiring line is a clock waveform, when the noise checking is performed, a time required for the noise composite waveform to rise and another time required for the noise composite waveform to fall are calculated from crossing points of the noise composite waveform and a high level discrimination threshold value/ low level discrimination threshold value for the signal waveform, and checking of the rising time/falling time of the clock waveform in the noticed wiring line is performed based on the times.

6. The noise checking method as set forth in claim 1, characterized in that, when the simulation is performed, the simulation model is divided into a plurality of files, and simulations with regard to the plurality of files are executed individually by a plurality of processing sections of a parallel processor which operate parallelly, whereafter simulation result files by said plurality of processing sections are combined.

7. The noise checking method as set forth in claim 1, characterized in that, when the simulation is performed, the simulation model is divided into a plurality of files, and simulations with regard to the plurality of files are executed individually by a plurality of processing sections interconnected over a network, whereafter simulation result files by said plurality of processing sections are combined.

8. The noise checking method as set forth in claim 1, characterized in that it further comprises the steps of:

performing a noise analysis with regard to the noise composite waveform;

displaying, if a questionable wiring line which has a bad influence on the noticed wiring line is found by the noise analysis, a wiring line pattern including the noticed wiring line and the questionable wiring line on a display section;

calculating, if the questionable wiring line displayed on said display section is moved on said display section by means of a pointing device, an actual movement amount of the questionable wiring line corresponding to an amount of the movement by said pointing device;

performing, in the state wherein the questionable wiring line is moved by the actual movement amount, the production of the simulation model, the simulation, the synthesis of the noise composite waveform and the noise checking again; and displaying the noise composite waveform after the movement of the questionable wiring line on said display section.

9. The noise checking method as set forth in claim 1, characterized in that it further comprises the steps of:

performing a noise analysis with regard to the noise composite waveform;

displaying, if a noise waveform which has a bad influence on the noticed wiring line is found by the noise analysis, the noise waveform on a display section; and calculating, if the noise waveform displayed on said display section is moved on said display section by means of a pointing device, a timing changing amount of the noise waveform corresponding to an amount of the movement by said pointing device and dynamically changing a generation timing of the noise waveform by the timing changing amount.

10. The noise checking method as set forth in claim 9, characterized in that the synthesis of the noise composite waveform and the noise checking are performed again using the noise waveform whose generation timing has been dynamically changed, and the noise composite waveform after the timing changing of the noise waveform is displayed on said display section.

11. The noise checking method as set forth in claim 1, characterized in that it further comprises the steps of:

calculating, where ringing is superposed on the noise composite waveform, a damping resistance value with which the ringing can be eliminated if the damping resistor is added to the noticed wiring line;

displaying candidate part data corresponding to the damping resistance value on said display section;

performing, in a state wherein a part selected from among the candidate part data is added to the noticed wiring line, the production of the simulation model, the simulation, the synthesis of the noise composite waveform and the noise checking again; and displaying the noise composite waveform after the addition of the part on said display section.

12. The noise checking method as set forth in claim 1, characterized in that, in order to obtain the noise composite waveform, time axis direction distributions of a maximum value and a minimum value of the signal waveform with a delay variation taken into consideration are calculated and time axis direction distributions of a maximum value and a minimum value of a noise waveform with a noise generation timing variation taken into consideration are calculated for each kind of noise, and time axis direction distributions of the maximum value and the minimum value obtained by synthesizing the time axis direction distributions of the maximum value and the minimum value of the signal waveform and the time axis direction distributions of the maximum value and the minimum value of the noise waveforms are used as the noise composite waveform.

13. The noise checking method as set forth in claim 12, characterized in that, when the noise checking is performed, it is discriminated whether or not both of the time axis direction distributions of the maximum value and the minimum value of the noise composite waveform satisfy logical expected values for a check object pin.

14. The noise checking method as set forth in claim 12, characterized in that,
when the simulation is performed, a single signal waveform is calculated under a predetermined condition and a single noise waveform for each kind of noise is calculated under the predetermined condition, and,
when the noise composite waveform is obtained, the single signal waveform calculated is shifted within a range of the delay variation to calculate time axis direction distributions of the maximum value and the minimum value of the signal waveform and the single noise waveform calculated is shifted within a range of the noise generation timing variation to calculate; for each kind of noise, time axis direction distributions of the maximum value and the minimum value of the noise waveform.

15. The noise checking method as set forth in claim 12, characterized in that, where the noise waveform exists across a plurality of clock cycles, a maximum value compressed noise waveform and a minimum value compressed noise waveform, in which maximum values and minimum values of the noise waveform are compressed into one clock cycle respectively, are produced by extracting the maximum values and the minimum values of the noise waveform in the same phase of each clock cycle from the clock cycles respectively, and the compressed noise waveforms are used as the time axis direction distributions of the maximum value and the minimum value of the noise waveform, respectively.

16. The noise checking method as set forth in claim 12, characterized in that, when an overdelay check of the signal waveform is performed by the noise checking, upon rising of the signal waveform, a waveform obtained by synthesizing the time axis distribution of the minimum value of the noise waveform with the signal waveform is used as the noise composite waveform, but upon falling of the signal waveform, another waveform obtained by synthesizing the time axis distribution of the maximum value of the noise waveform with the signal waveform is used as the noise composite waveform.

17. The noise checking method as set forth in claim 12, characterized in that, when a racing check of the signal waveform is performed by the noise checking, upon rising of the signal waveform, a waveform obtained by synthesizing the time axis distribution of the maximum value of the noise waveform with the signal waveform is used as the noise composite waveform, but upon falling of the signal waveform, another waveform obtained by synthesizing the time axis distribution of the minimum value of the noise waveform with the signal waveform is used as the noise composite waveform.

18. A noise checking apparatus used upon circuit designing for checking noise which has an influence on a signal waveform which propagates in a noticed wiring line on a design object circuit comprising:
a model production section (3) for producing a simulation model of a circuit portion relating to the noticed wiring line;
a simulation section (4) for performing a simulation using the simulation model produced by said model production section (3) to calculate a signal waveform which propagates in the noticed wiring line and calculate a noise waveform superposed on the signal waveform in the noticed wiring line for a plurality of kinds of noise;
a noise waveform synthesis section (5) for synthesizing with generation timings of the noise waveforms taken into consideration the signal waveform and the noise waveforms calculated by said simulation section (4) to obtain a noise composite waveform which is the signal waveform on which the noise is superposed; and
a noise checking section (6) for performing noise checking based on the noise composite waveform obtained by said noise waveform synthesis section (5);
wherein said noise checking section (6) extracts a maximum delay time and a minimum delay time of the noticed wiring line from the noise composite waveform and performs overdelay/racing checking for the noticed wiring line using the maximum delay time and the minimum delay time.

19. The noise checking apparatus as set forth in claim 18, characterized in that, where an adjacent wiring line to the noticed wiring line is turned back in such a manner as to have a plurality of proximate portions which can electrically interfere with the noticed wiring line, said model production section (3) produces simulation models with regard to the individual proximate portions of the adjacent wiring line and the noticed wiring line and said simulation section (4) calculates the noise waveforms using the simulation models, and then said noise waveform synthesis section (5) synthesizes the noise waveforms calculated with regard to all of the proximate portions and the signal waveform with generation timings of the noise waveforms taken into consideration.

20. The noise checking apparatus as set forth in claim 18, characterized in that, where the signal waveform which propagates in the noticed wiring line is a clock waveform, said noise checking section (6) calculates a pulse period of the noise composite waveform from crossing points of the noise composite waveform and a high level discrimination threshold value/low level discrimination threshold value for the signal waveform and performs pulse period checking of the clock waveform in the noticed wiring line based on the pulse period.

21. The noise checking apparatus as set forth in claim 18, characterized in that, where the signal waveform which propagates in the noticed wiring line is a clock waveform, said noise checking section (6) calculates a rising width and a falling width of the noise composite waveform from crossing points of the noise composite waveform and a high level discrimination threshold value/low level discrimination threshold value for the signal waveform and performs pulse width checking of the clock waveform in the noticed wiring line based on the rising width and the falling width.

22. The noise checking apparatus as set forth in claim 18, characterized in that, where the signal waveform which propagates in the noticed wiring line is a clock waveform, said noise checking section (6) calculates a time required for the noise composite waveform to rise and another time required for the noise composite waveform to fall from crossing points of the noise composite waveform and a high level discrimination threshold value/low level discrimination threshold value for the signal waveform and performs checking of the rising time/falling time of the clock waveform in the noticed wiring line based on the times.

23. The noise checking apparatus as set forth in claim 18, characterized in that said simulation section (4) includes:

a file dividing section for dividing the simulation model into a plurality of files;

a parallel processor having a plurality of processing sections for executing simulations with regard to the plurality of files obtained by the division of said file dividing section parallelly; and a file combining section for combining simulation result files by said plurality of processing sections.

24. The noise checking apparatus as set forth in claim 18, characterized in that said simulation section (4) includes:

a file dividing section for dividing the simulation model into a plurality of files;

a network interconnecting a plurality of processing sections for executing simulations with regard to the plurality of files parallelly; and a file combining section for combining simulation result files by said plurality of processing sections.

25. The noise checking apparatus as set forth in claim 18, characterized in that it further comprises:

a noise composite waveform analysis section for performing a noise analysis with regard to the noise composite waveform;

a display section for displaying, if a questionable wiring line which has a bad influence on the noticed wiring line is found by said noise composite waveform analysis section, a wiring line pattern including the noticed wiring line and the questionable wiring line;

a pointing device for moving the questionable wiring line displayed on said display section on said display section; and a movement amount calculation section for calculating an actual movement amount of the questionable wiring line corresponding to an amount of the movement by said pointing device; and that, in the state wherein the questionable wiring line is moved by the actual movement amount, said model production section (3), said simulation section (4), said noise waveform synthesis section (5) and said noise checking section (6) are operated again and the noise composite waveform after the movement of the questionable wiring line is displayed on said display section.

26. The noise checking apparatus as set forth in claim 18, characterized in that it further comprises:

a noise composite waveform analysis section for performing a noise analysis with regard to the noise composite waveform;

a display section for displaying, if a noise waveform which has a bad influence on the noticed wiring line is found by said noise composite waveform analysis section, the noise waveform; and a timing changing amount calculation section for calculating a timing changing amount of the noise waveform corresponding to an amount of the movement by said pointing device and dynamically changing a generation timing of the noise waveform by the timing changing amount.

27. The noise checking apparatus as set forth in claim 26, characterized in that said noise waveform synthesis section (5) and said noise checking section (6) are operated again in a state wherein the generation timing of the noise waveform is changed, and the noise composite waveform after the timing changing of the noise waveform is displayed on said display section.

28. The noise checking apparatus as set forth in claim 18, characterized in that it further comprises:

a damping resistance value calculation section for calculating, where ringing is superposed on the noise composite waveform, a damping resistance value with which the ringing can be eliminated if the damping resistor is added to the noticed wiring line;

a part searching section for searching for candidate part data corresponding to the damping resistance value calculated by said damping resistance value calculation section;

a displaying section for displaying the candidate part data searched out by said part searching section; and a selective inputting section for selecting a part from among the candidate part data displayed on said display section; and that, in a state wherein the part selected from among the candidate part data is added to the noticed wiring line, said model production section (3), said simulation section (4), said noise waveform synthesis section (5) and said noise checking section (6) are operated again, and the noise composite waveform after the addition of the part is displayed on said display section.

29. The noise checking apparatus as set forth in claim 18, characterized in that said noise waveform synthesis section (5)

calculates time axis direction distributions of a maximum value and a minimum value of the signal waveform with a delay variation taken into consideration and calculates time axis direction distributions of a maximum value and a minimum value of a noise waveform with a noise generation timing variation taken into consideration for each kind of noise, and synthesizes the time axis direction distributions of the maximum value and the minimum value of the signal waveform and the time axis direction distributions of the maximum value and the minimum value of the noise waveforms to obtain time axis direction distributions of the maximum value and the minimum value as the noise composite waveform.

30. The noise checking apparatus as set forth in claim 29, characterized in that said noise checking section (6) discriminates whether or not both of the time axis direction distributions of the maximum value and the minimum value of the noise composite waveform satisfy logical expected values for a check object pin to perform the noise checking.

31. The noise checking apparatus as set forth in claim 29, characterized in that said simulation section (4) calculates a single signal waveform under a predetermined condition and calculates a single noise waveform for each kind of noise under the predetermined condition, and said noise waveform synthesis section (5) shifts the calculated single signal waveform within a range of the delay variation to calculate time axis direction distributions of the maximum value and the minimum value of the signal waveform and shifts the calculated single noise waveform for each kind of noise within a range of the noise generation timing variation to calculate, for each kind of noise, time axis direction distributions of the maximum value and the minimum value of the noise waveform.

32. The noise checking apparatus as set forth in claim 29, characterized in that, where the noise waveform exists across a plurality of clock cycles, said noise waveform synthesis section (5) extracts maximum values and minimum values of the noise waveform in the same phase of each clock cycle from the clock cycles respectively to produce a maximum value compressed noise waveform and a minimum value compressed noise waveform wherein the maximum values and the minimum values of the noise waveform are compressed into one clock cycle respectively, and uses the compressed noise waveforms as the time axis direction distributions of the maximum value and the minimum value of the noise waveform, respectively.

33. The noise checking apparatus as set forth in claim 29, characterized in that, when said noise checking section (6) performs an overdelay check of the signal waveform, said noise waveform synthesis section (5) synthesizes, upon rising of the signal waveform, the time axis distribution of the minimum value of the noise waveform with the signal waveform to obtain the noise composite waveform, but synthesizes, upon falling of the signal waveform, the time axis distribution of the maximum value of the noise waveform with the signal waveform to obtain the noise composite waveform.

34. The noise checking apparatus as set forth in claim 29, characterized in that, when said noise checking section (6) performs a racing check of the signal waveform, said noise waveform synthesis section (5) synthesizes, upon rising of the signal waveform, the time axis distribution of the maximum value of the noise waveform with the signal waveform to obtain the noise composite waveform, but synthesizes, upon falling of the signal waveform, the time axis distribution of the minimum value of the noise waveform with the signal waveform to obtain the noise composite waveform.

* * * * *